(12) United States Patent
Kurashina et al.

(10) Patent No.: US 7,736,474 B2
(45) Date of Patent: Jun. 15, 2010

(54) PLATING APPARATUS AND PLATING METHOD

(75) Inventors: Keiichi Kurashina, Tokyo (JP); Mizuki Nagai, Tokyo (JP); Satoru Yamamoto, Tokyo (JP); Hiroyuki Kanda, Tokyo (JP); Koji Mishima, Tokyo (JP); Shinya Morisawa, Tokyo (JP); Junji Kunisawa, Tokyo (JP); Kunihito Ide, Tokyo (JP); Hidenao Suzuki, Tokyo (JP); Emanuel Cooper, Scarsdale, NY (US); Philippe Vereecken, Leuven (BE); Brett Baker-O'Neal, Sleepy Hollow, NY (US); Hariklia Deligianni, Tenafly, NJ (US)

(73) Assignees: Ebara Corporation, Tokyo (JP); International Business Machines Corporation, Armonk, NY (US)

( * ) Notice: Subject to any disclaimer, the term of this patent is extended or adjusted under 35 U.S.C. 154(b) by 1222 days.

(21) Appl. No.: 11/245,490

(22) Filed: Oct. 7, 2005

(65) Prior Publication Data

US 2006/0086616 A1   Apr. 27, 2006

Related U.S. Application Data

(63) Continuation of application No. 11/044,375, filed on Jan. 28, 2005, now abandoned.

(30) Foreign Application Priority Data

Jan. 29, 2004 (JP) ............................... 2004-022178
Jan. 30, 2004 (JP) ............................... 2004-023256

(51) Int. Cl.
  *C25D 17/00* (2006.01)
  *C25D 7/12* (2006.01)
(52) U.S. Cl. ...................... 204/223; 204/222; 204/228.1
(58) Field of Classification Search ...................... None
  See application file for complete search history.

(56) References Cited

U.S. PATENT DOCUMENTS

| | | | | |
|---|---|---|---|---|
| 3,880,725 | A * | 4/1975 | Van Raalte et al. | 205/95 |
| 6,375,823 | B1 * | 4/2002 | Matsuda et al. | 205/117 |
| 2002/0096435 | A1 * | 7/2002 | Matsuda et al. | 205/117 |
| 2003/0000840 | A1 * | 1/2003 | Kimura et al. | 205/81 |
| 2004/0154931 | A1 * | 8/2004 | Hongo et al. | 205/676 |

* cited by examiner

*Primary Examiner*—Harry D Wilkins, III
(74) *Attorney, Agent, or Firm*—Wenderoth, Lind & Ponack, L.L.P.

(57) ABSTRACT

A plating apparatus securely carries out a flattening plating of a substrate to form a plated film having a flat surface without using a costly mechanism, and without applying an extra plating to the substrate. The plating apparatus includes a substrate holder; a cathode section having a seal member for watertightly sealing a peripheral portion of the substrate, and a cathode electrode for supplying an electric current to the substrate; an anode disposed in a position facing the surface of the substrate; a porous member disposed between the anode and the surface of the substrate; a constant-voltage control section for controlling a voltage applied between the cathode electrode and the anode at a constant value; and a current monitor section for monitoring an electric current flowing between the cathode electrode and the anode, and feeding back a detection signal to the constant-voltage control section.

4 Claims, 42 Drawing Sheets

F I G. 1
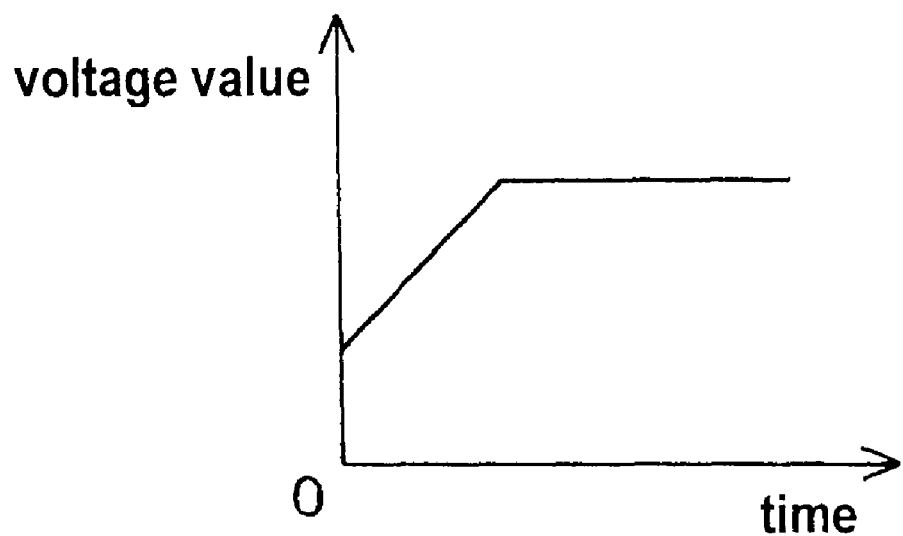
F I G. 2
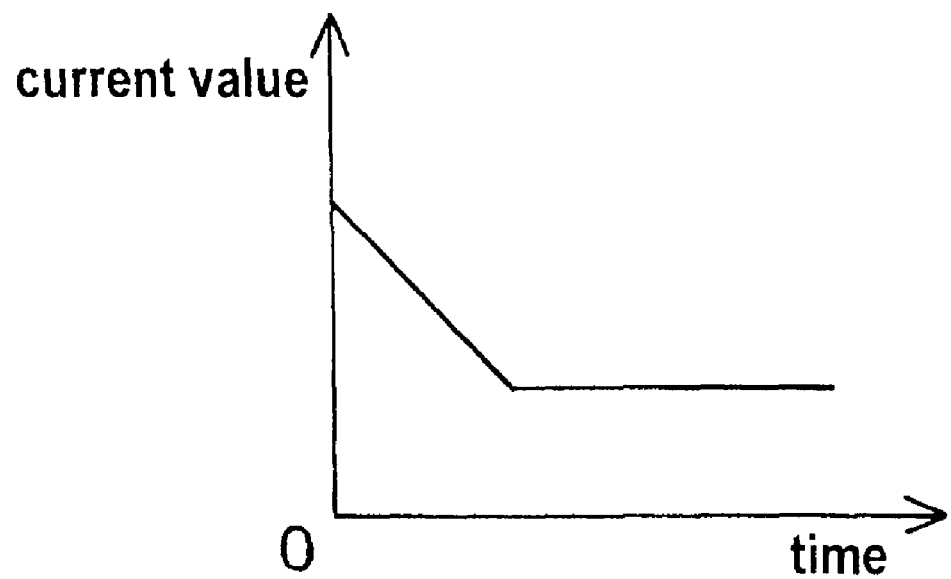

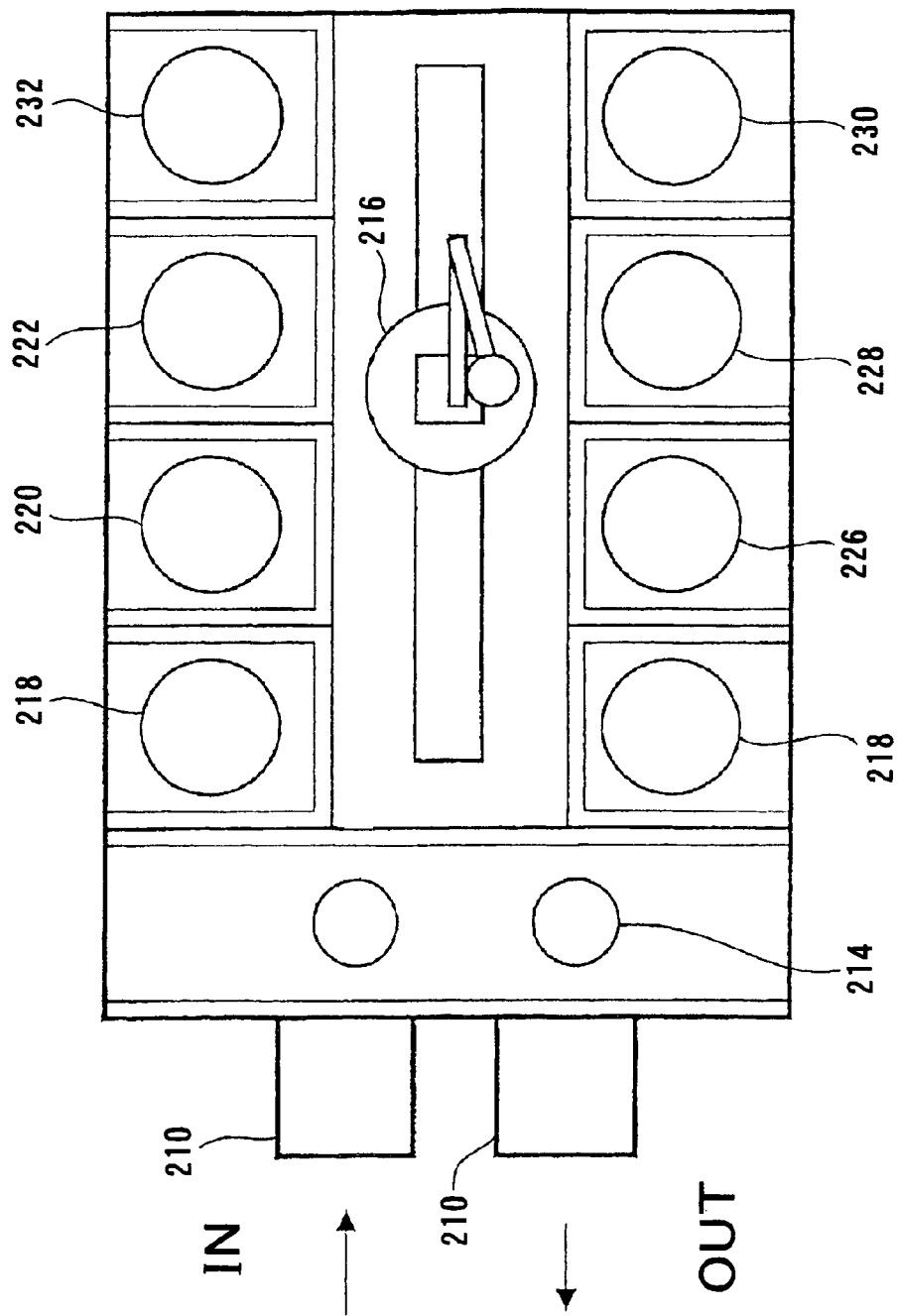

F I G. 7
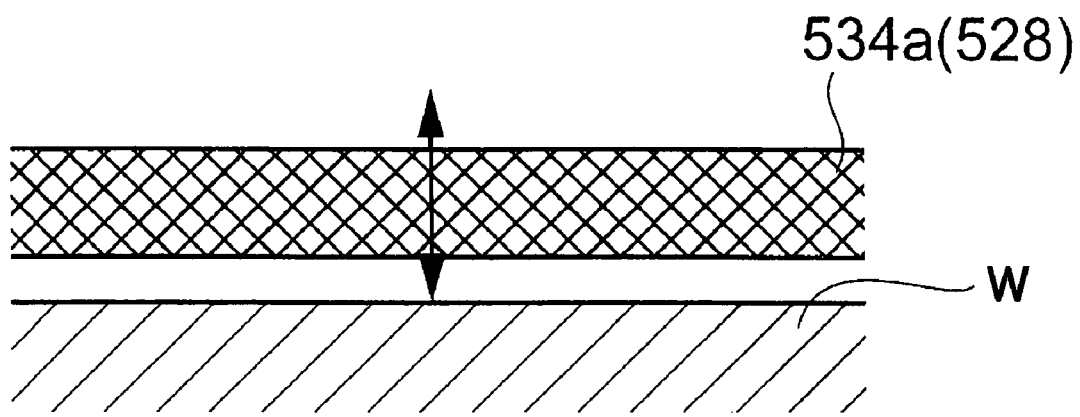

F I G. 12
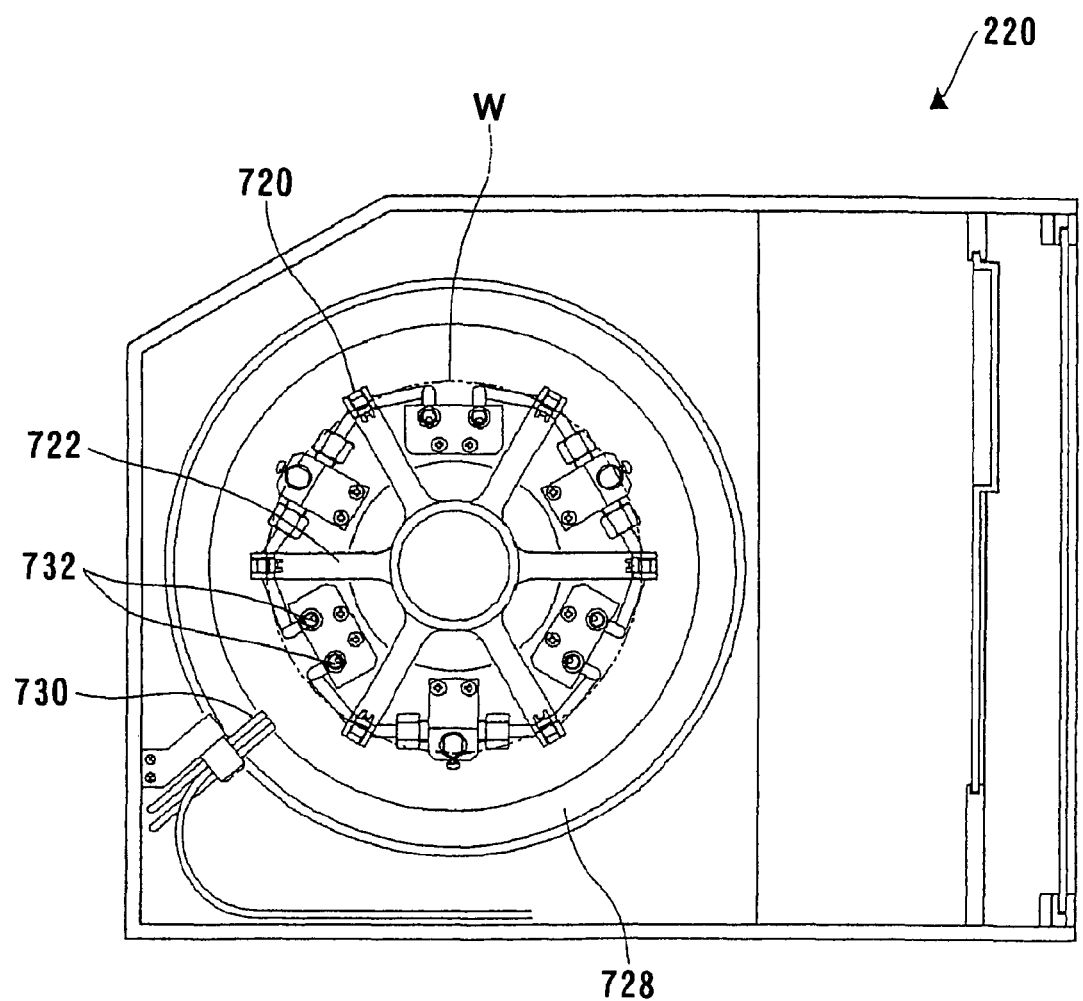

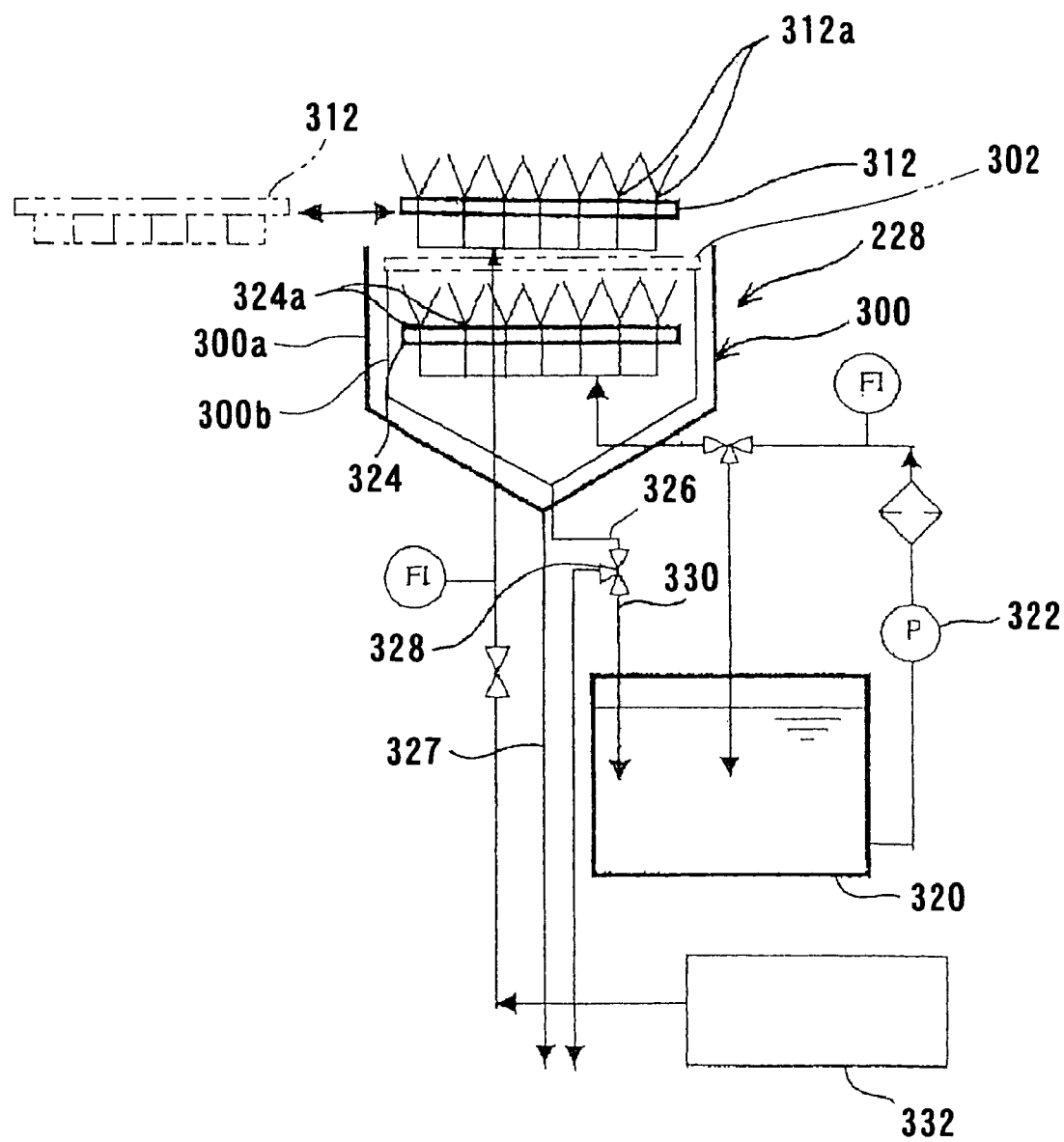
F I G. 2 2

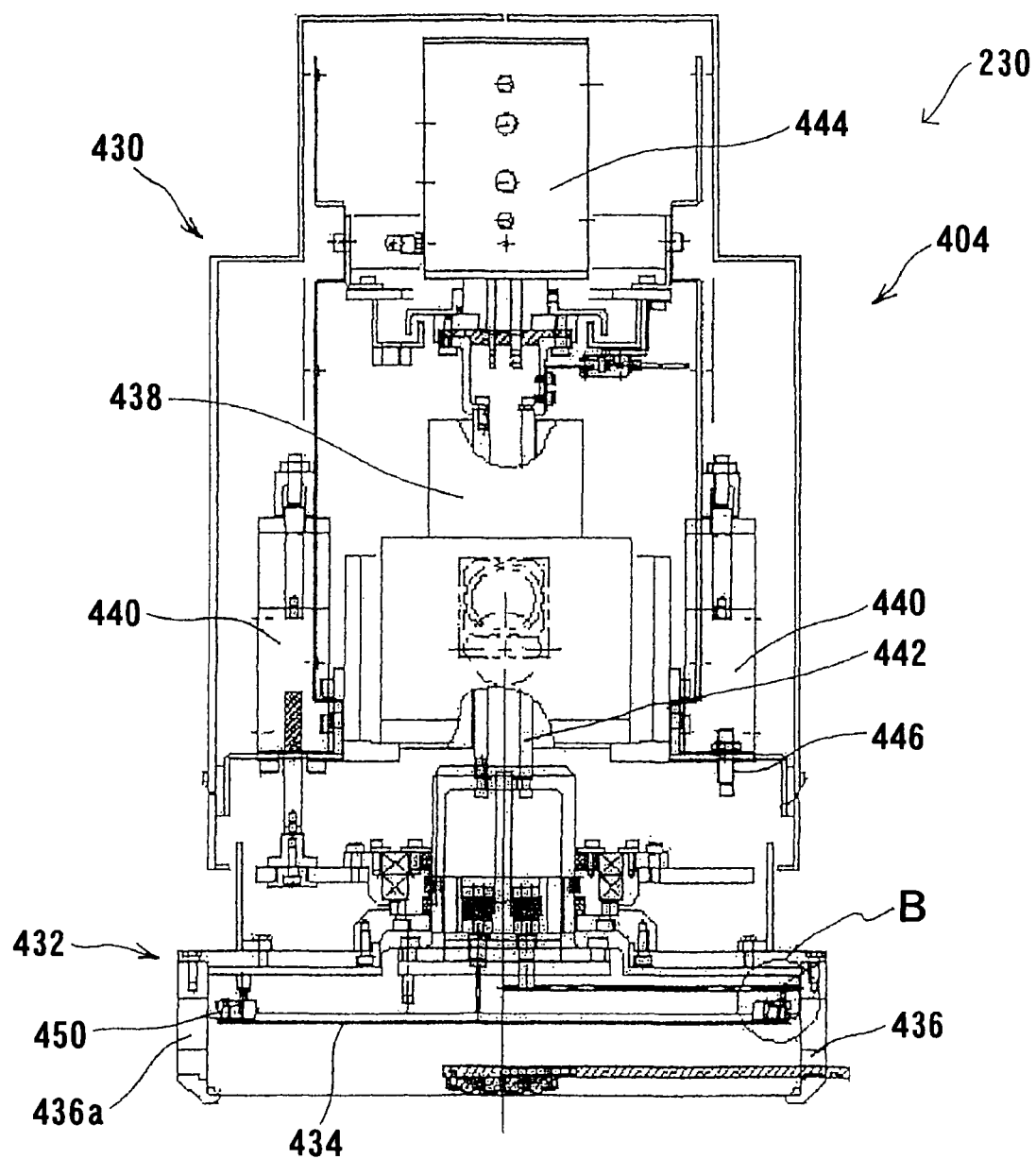
F I G. 2 3

F I G. 29
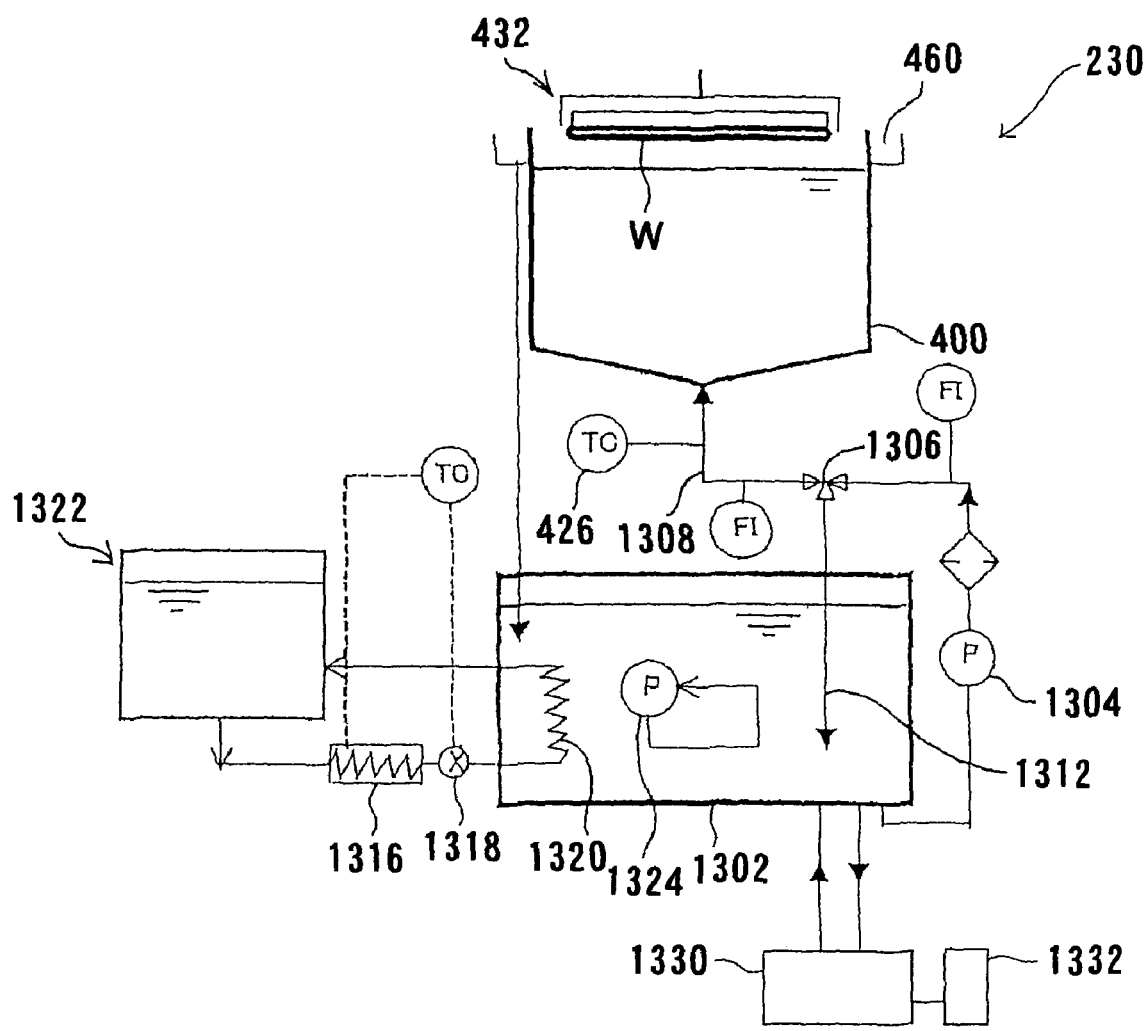

PLATING APPARATUS AND PLATING METHOD

This is a continuation application of U.S. patent application Ser. No. 11/044,375, filed Jan. 28, 2005 now abandoned.

BACKGROUND OF THE INVENTION

1. Field of the Invention

The present invention relates to a plating apparatus and a plating method, and more particularly to a plating apparatus and a plating method useful for forming interconnects by filling a conductive metal (interconnect material) such as copper (Cu) into fine interconnect patterns (recesses) formed in a substrate such as a semiconductor substrate.

2. Description of the Related Art

In recent years, instead of using aluminum or aluminum alloys as a material for forming interconnect circuits on a semiconductor substrate, there is an eminent movement towards using copper (Cu) that has a low electric resistivity and high electromigration resistance. Copper interconnects are generally formed by forming fine recesses for interconnects, such as trenches or via holes in a circuit form, in a semiconductor substrate, embedding the fine recesses with copper (interconnect material) by copper plating, and removing a copper layer (plated film) at portions other than the fine recesses by CMP or the like. In this damascene process, from the viewpoint of reducing loads on subsequent CMP, it is desirable that a copper plated film be deposited selectively in trenches or via holes in a circuit form, and that the amount of copper plated film deposited on portions other than the trenches or via holes be small. In order to achieve such an object, there have heretofore been proposed various ideas regarding a plating solution, such as composition in a bath of a plating solution or a brightener used in a plating solution.

Upon the electroplating for forming the copper layer, a copper sulfate plating solution containing copper sulfate and sulfuric acid in its composition is generally employed as a plating solution.

In recent years, more and more fine interconnects are formed in copper interconnects forming process for semiconductor devices, and design rules for such fine interconnects are considered to be changing from the 0.18 μm generation to the 0.13 μm generation and further to the 0.10 μm generation. Depending on circumstances, the advent of the seed-layer-less generation of semiconductor devices may not be impossible. With those more and more fine interconnects, unless the thickness of the seed layer is further reduced, the seed layer overhangs at the inlets of fine recesses, tending to produce voids in the plating process. In the 0.18 μm generation of design rules, the thickness of the seed layer is generally in the range from about 150 to 200 nm on the flat surface of the substrate. In the 0.13 μm generation of design rules, the thickness of the seed layer is about 50 nm in order to prevent voids from being produced in the plating process. In the 0.10 μm generation of design rules, the thickness of the seed layer will possibly be reduced to a range from about 5 to 25 nm.

A plating apparatus having the following configuration has been known as this type of plating apparatus used for plating to form fine interconnects having high aspect ratios. A substrate is held in such a state that a surface (surface to be plated) of the substrate faces upward (in a face-up manner). A cathode electrode is brought into contact with a peripheral portion of the substrate so that the surface of the substrate serves as a cathode. An anode is disposed above the substrate. While a space between the substrate and the anode is filled with a plating solution, a plating voltage is applied between the substrate (cathode) and the anode to plate a surface (surface to be plated) of a substrate (for example, see Japanese laid-open patent publication No. 2002-506489).

In a plating apparatus in which a substrate is held and plated in single wafer processing while a surface of the substrate faces upward, a distribution of a plating current can be made more uniform over an entire surface of the substrate to improve uniformity of a plated film over the surface of the substrate. Generally, the substrate is transferred and subjected to various processes in such a state that a surface of the substrate faces upward. Accordingly, it is not necessary to turn the substrate at the time of plating.

Meanwhile, in order to deposit a copper plated film selectively in trenches in a circuit form or the like, there has been known a method of bringing a porous member into contact with a substrate such as a semiconductor wafer, and plating the substrate while relatively moving the porous member in a contact direction (for example, see Japanese laid-open patent publication No. 2000-232078).

In order to detect the end point of plating and determine the timing of terminating plating in a plating apparatus of the type described above, there are generally employed a method in which plating is stopped when the plating time has reached a predetermined time, a method in which the quantity of electricity that has passed between a cathode and an anode is integrated, and plating is stopped when the integrated value has reached a predetermined value, and a method in which a thickness of a plated film is measured with a film-thickness monitor provided in the plating apparatus, and plating is stopped when the measured film thickness has reached a predetermined value.

For performing copper electroplating on the surface of a substrate, the outer circumferential portion of the substrate is come in contact with electrodes (electric contacts) to pass an electric current through the substrate. As the seed layer is thinner, the sheet resistance becomes higher immediately after the substrate starts to be plated, causing the plating current to concentrate on the outer circumferential portion of the substrate. The within-wafer thickness uniformity cannot be controlled only by a single shield plate for electric field correction.

The applicant has proposed a plating apparatus wherein a plating power source is connected individually to a plurality of split anodes to increase a current density at those split anodes positioned in a central area of the substrate to a level higher than at those split anodes positioned in a peripheral area of the substrate only during a certain period of time in which an initial plated film is formed on the substrate, thereby preventing the plating current from concentrating on the outer circumferential portion of the substrate, but allowing the plating current to flow to the central area of the substrate to make it possible to form a uniform plated film even if the sheet resistance is high (for example, see Japanese laid-open patent publication No. 2002-129383).

SUMMARY OF THE INVENTION

The method of stopping plating when the plating time has reached a predetermined time and the method of stopping plating when the integrated quantity of electricity has reached a predetermined value have the advantage of being simple and low cost. When using these methods in a so-called flattening plating which is employed for forming interconnects by, for example, the above-described damascene technique, however, a larger amount of plating than the necessary plating amount must be applied to a substrate because of the necessity of taking account of process variation. The method using a film-thickness monitor involves the use of a generally expensive monitor, leading to an increased cost of the plating apparatus.

In the case of ordinary or common plating, there is no definite law concerning a change in current value or voltage value during plating. Accordingly, a method has not been generally employed which involves continually monitoring a change in current value or voltage value during plating, and stopping plating when the current value or voltage value has reached a predetermined value.

As the seed layer becomes thinner and eventually the seed layer is eliminated, resulting in a higher sheet resistance. Therefore, it is considered difficult to form a plated film of more uniform thickness over the entire surface to be plated of the substrate with fine interconnect recesses formed therein, only by using the split anodes, and also to reliably embed the plated metal within the fine recesses without forming voids therein.

The present invention has been made in view of the above situation in the related art. It is therefore a first object of the present invention to provide a plating apparatus and a plating method which can securely carryout a so-called flattening plating of a substrate to form a plated film having a flat surface without using a costly mechanism, such as a film-thickness monitor, and without applying an extra plating to the substrate.

It is a second object of the present invention to provide a plating apparatus and a plating method which are capable of forming a plated film of more uniform thickness over the entire surface to be plated of a substrate, even if the substrate has a higher sheet resistance, and of reliably embedding plated metal within fine recesses without forming voids therein.

The present invention provides a plating apparatus, comprising: a substrate holder for holding a substrate; a cathode section having a seal member for contact with a peripheral portion of the surface, to be plated, of the substrate held the substrate holder to watertightly seal the peripheral portion, and a cathode electrode for contact with the substrate to supply an electric current to the substrate; a vertically-movable anode disposed in a position facing the surface, to be plated, of the substrate; a porous member composed of a water-retentive material, disposed between the anode and the surface, to be plated, of the substrate; a constant-voltage control section for controlling a voltage applied between the cathode electrode and the anode at a constant value; and a current monitor section for monitoring an electric current flowing between the cathode electrode and the anode, and feeding back a detection signal to the constant-voltage control section.

In the case of a plating method generally called flattening plating, unlike an ordinary plating, there is a definite law concerning current values or voltage values during plating. In particular, when carrying out plating under a constant-current control, the voltage value increases with the progress of plating and becomes constant at a certain value, as shown in FIG. 1. When carry out plating under a constant-voltage control, on the other hand, the current value decreases with the progress of plating and becomes constant at a certain value, as shown in FIG. 2. The reason for this phenomenon is as follows:

When carrying out copper plating of a surface of a substrate W having a large number of interconnect trenches 4 covered with a seed layer (conductive film) 6, the area of the surface, to be plated, at the beginning of plating is the surface area of the seed layer 6 including the interior of the interconnect trenches 4, as shown in FIG. 3A, whereas after completion of a copper layer (plated film) 7 having a flat surface, the area of the surface, to be plated, is the surface area of the flat copper layer 7, as shown in FIG. 3B. Thus, the area of the surface, to be plated, gradually decreases as the thickness of the plated film increases with the progress of plating, and becomes substantially constant after completion of the copper layer 7 having a flat surface.

Accordingly, by utilizing the above phenomenon, in particular, by carrying out plating of a substrate under a constant-voltage control, monitoring the current value during plating to detect a point of time at which the current value becomes constant, and stopping the plating based on the detected point of time, it becomes possible to obtain the intended plated film with a flat surface without applying an extra plating to the substrate.

The constant-voltage control section and the current monitor section may be provided independently or in combination. For example, it is possible to use a rectifier, having a constant-voltage control section and a current monitor section, which automatically stops feeding of electricity according to an installed program when a monitored current becomes constant. The use of such a device can simplify the apparatus and may possibly reduce the cost.

The present invention also provides another plating apparatus, comprising: a substrate holder for holding a substrate; a cathode section having a seal member for contact with a peripheral portion of the surface, to be plated, of the substrate held by the substrate holder to watertightly seal the peripheral portion, and a cathode electrode for contact with the substrate to supply an electric current to the substrate; a vertically-movable anode disposed in a position facing the surface, to be plated, of the substrate; a porous member composed of a water-retentive material, disposed between the anode and the surface, to be plated, of the substrate; a constant-current control section for controlling an electric current flowing between the cathode electrode and the anode at a constant value; and a voltage monitor section for monitoring the voltage between the cathode electrode and the anode, and feeding back a detection signal to the constant-current control section.

As described above, when carrying out plating under a constant-current control by a plating method generally called flattening plating, the voltage value increases with the progress of plating and becomes constant at a certain value. Accordingly, by carrying out plating of a substrate under a constant-current control, monitoring the voltage value during plating to detect a point of time at which the voltage value becomes constant, and stopping the plating based on the detected point of time, it becomes possible to obtain the intended plated film with a flat surface without applying an extra plating to the substrate.

The constant-current control section and the voltage monitor section may be provided independently or in combination. For example, it is possible to use a rectifier, having a constant-current control section and a voltage monitor section, which automatically stops feeding of electricity according to an installed program when a monitored voltage becomes constant. The use of such a device can simplify the apparatus and may possibly reduce the cost.

The plating apparatus may further comprise a pressing mechanism for pressing the porous member against the surface, to be plated, of the substrate, held by the substrate holder, at a desired pressure.

By carrying out plating while keeping the porous member pressing on the surface, to be plated, of the substrate held by the substrate holder, a plated film with a flatter surface can be obtained without being influenced by variation (difference in width and size) of the configuration of interconnect pattern.

The plating apparatus may further comprise a driving mechanism for making a relative movement between the porous member and the substrate.

The relative movement may be a vibrational movement involving a repetition of contact and non-contact between the porous member and the surface, to be plated, of the substrate.

By carrying out plating while repeating contact and non-contact between the porous member and the surface, to be plated, of the substrate, a plated film with a flatter surface can be obtained without being influenced by variation of the configuration of interconnect pattern.

Alternatively, the relative movement may be a rotational and/or a translational movement of at least one of the porous member and the substrate, the movement being made while the porous member and the surface, to be plated, of the substrate are kept in contact with each other.

By carrying out plating while, for example, rubbing the porous member against the surface, to be plated, of the substrate, a plated film with a flatter surface can be obtained without being influenced by variation of the configuration of interconnect pattern.

The present invention also provides a plating method, comprising: providing a porous member composed of a water-retentive material between a substrate and an anode; filling the space between a surface, to be plated, of the substrate and the anode with a plating solution; carrying out plating by applying a constant voltage to between the surface, to be plated, of the substrate and the anode while detecting an electric current flowing between the surface, to be plated, of the substrate and the anode; and stopping supplying an electric current to between the surface, to be plated, of the substrate and the anode after elapse of a predetermined period of time from a point of time at which the current value becomes constant.

In the preferred embodiment of the present invention, the plating is carried out by applying a constant voltage to between the surface, to be plated, of the substrate and the anode while rubbing the porous member against the surface, to be plated, of the substrate.

The plating may be carried out by applying a constant voltage to between the surface, to be plated, of the substrate and the anode while keeping the porous member in contact with the surface, to be plated, of the substrate and motionless relative to the surface to be plated.

In the preferred embodiment of the present invention, contact and non-contact between the porous member and the surface, to be plated, of the substrate is repeated during plating, and the plating is carried out by applying a constant voltage to between the surface, to be plated, of the substrate and the anode during one of the contact time and the non-contact time.

Contact and non-contact between the porous member and the surface, to be plated, of the substrate is repeated during plating, and the plating may be carried out by applying constant voltages, which differ between the contact time and the non-contact time, to between the surface, to be plated, of the substrate and the anode.

The present invention also provides another plating method, comprising: providing a porous member composed of a water-retentive material between a substrate and an anode; filling the space between the surface, to be plated, of the substrate and the anode with a plating solution; carrying out plating by passing a constant electric current between the surface, to be plated, of the substrate and the anode while detecting the voltage between the surface, to be plated, of the substrate and the anode; and stopping supplying an electric current to between the surface, to be plated, of the substrate and the anode after elapse of a predetermined period of time from a point of time at which the voltage value becomes constant.

In the preferred embodiment of the present invention, the plating is carried out by passing a constant electric current between the surface, to be plated, of the substrate and the anode while rubbing the porous member against the surface, to be plated, of the substrate.

The plating may be carried out by passing a constant electric current between the surface, to be plated, of the substrate and the anode while keeping the porous member in contact with the surface, to be plated, of the substrate and motionless relative to the surface to be plated.

In the preferred embodiment of the present invention, contact and non-contact between the porous member and the surface, to be plated, of the substrate is repeated during plating, and the plating is carried out by passing a constant electric current between the surface, to be plated, of the substrate and the anode during one of the contact time and the non-contact time.

Contact and non-contact between the porous member and the surface, to be plated, of the substrate may be repeated during plating, and the plating is carried out by passing constant electric currents, which differ between the contact time and the non-contact time, between the surface, to be plated, of the substrate and the anode.

The predetermined period of time is preferably 0 second.

Stopping supplying of an electric current immediately after the completion of a flat plated film can prevent application of an extra plating to the substrate. On the other hand, a plated film having a flatter surface can be obtained by stopping supplying of an electric current after an elapse of several seconds from the point of time at which the voltage value becomes constant to carry out several-second additional plating.

The present invention also provides still another plating apparatus comprising: a substrate holder for holding a substrate; a cathode section having a seal member for contact with a peripheral portion of a surface, to be plated, of the substrate held by the substrate holder to watertightly seal the peripheral portion, and a cathode electrode for contact with the substrate to supply an electric current to the substrate; an anode disposed in a position facing the surface, to be plated, of the substrate; a high resistance structure made of a water-retentive material, disposed between the anode and the surface, to be plated, of the substrate; and a drive mechanism for making a relative movement between the high resistance structure and the substrate; wherein the anode has a potential gradient.

Preferably, the anode comprises an insoluble anode.

If the anode comprises an insoluble anode, then the anode is prevented from changing its shape, and a constant discharged state can be maintained at all times without the need for replacing the anode.

Preferably, the anode comprises a plurality of split anodes of desired shape.

With the above arrangement, only during a certain period in which an initial plated film is formed on the substrate, for example, the current densities at those split anodes which are positioned in a central area of the substrate are made higher than those split anodes which are positioned in a circumferential area thereof, thus preventing a plating current from concentrating on the outer circumferential area of the substrate, and allowing a plating current to flow also to the central area of the substrate. Furthermore, a large resistance is developed in the high resistance structure that can retain the plating solution therein to the extent that the sheet resistance of the surface of the substrate is negligible. Therefore, even if the substrate has a higher sheet resistance, the difference in current density over the surface of the substrate due to the sheet resistance of the substrate are reduced to make it possible to reliably form a plated film of more uniform film thickness.

The split anodes may have concentric or chip shapes.

If the split anodes comprise a plurality of concentric split anodes, for example, then the current density can be changed between the central area and the circumferential area. If the split anodes comprise a plurality of split anodes in the form of chips, then current density can be changed between a certain portion of the substrate and another portion thereof. The concentric split anodes and the split anodes in the form of chips may be combined with each other.

In a preferred embodiment of the present invention, at least one of the split anodes is disposed in a position where the distance between the one of the split anodes and the surface, to be plated, of the substrate held by the substrate holder is different from the distance between another one of the split anodes and the surface, to be plated, of the substrate.

With the above arrangement, the surfaces of the split anodes facing the substrate are staggered to make the distance between the anode and the surface, to be plated, of the substrate different partially, thereby making it possible to adjust the distribution of current densities between the anode and the surface, to be plated, of the substrate.

In a preferred embodiment of the present invention, the plating apparatus further comprises a rectifying mechanism for making a current or a voltage supplied between at least one of the split anodes and the surface, to be plated, of the substrate held by the substrate holder, different from a current or a voltage supplied between another one of the split anodes and the surface, to be plated, of the substrate held by the substrate holder.

The regulating mechanism is capable of changing, as desired, a current or a voltage supplied between a desired one of the split anodes and the surface, to be plated, of the substrate, thereby to adjust the distribution of current densities between the anode and the surface, to be plated, of the substrate.

The rectifying mechanism may comprise a plurality of rectifiers associated with the respective split anodes or respective split anode groups.

Alternatively, the rectifying mechanism may comprise a single rectifier having elements or parts for changing a resistance for each of the split anodes or split anode groups.

With the above arrangement, since the single rectifier is used to change the resistance for each of the split anodes or split anode groups, the plating apparatus is simplified in structure.

Preferably, the rectifying mechanism has a mechanism for optimizing a distribution of currents or voltages supplied between the split anodes and the surface to be plated of the substrate held by the substrate holder.

With the above arrangement, the distribution of current densities between the anode and the surface, to be plated, of the substrate, for example, can automatically be optimized.

The present invention also provides still another plating method comprising: providing a substrate having fine recesses covered with a barrier layer and/or a seed layer; disposing an anode having a plurality of split anodes in a position facing a surface, to be plated, of the substrate which is brought into contact with a cathode electrode so as to be supplied with an electric current; disposing a high resistance structure made of a water-retentive material between the substrate and the anode; and controlling, in an initial plating stage, a distribution of currents or voltages supplied between the split anodes and the surface, to be plated, of the substrate so as to be large in a central area of the substrate and small in a circumferential area thereof, thereby filling plated metal in the fine recesses.

The present invention also provides still another plating method comprising: providing a substrate having fine recesses covered with a barrier layer and/or a seed layer; disposing an anode having a plurality of split anodes in a position facing a surface, to be plated, of the substrate which is brought into contact with a cathode electrode so as to be supplied with an electric current; disposing a high resistance structure made of a water-retentive material between the substrate and the anode; and changing a distribution of currents or voltages supplied between the split anodes and the surface, to be plated, of the substrate depending on an amount of plating deposition, thereby filling plated metal in the fine recesses.

The present invention also provides still another plating method comprising: providing a substrate having fine recesses covered with a barrier layer and/or a seed layer; disposing an anode having a plurality of split anodes in a position facing a surface, to be plated, of the substrate which is brought into contact with a cathode electrode so as to be supplied with an electric current; disposing a high resistance structure made of a water-retentive material between the substrate and the anode; and changing a distribution of currents or voltages supplied between the split anodes and the surface, to be plated, of the substrate depending on the shape of a pattern of the fine recesses formed in the surface of the substrate, thereby filling plated metal in the fine recesses.

The barrier layer and/or the seed layer covering the fine recesses may be made of Cu, Ti, V, Cr, Ni, Zr, Nb, Mo, Ta, Hf, W, Ru, Rh, Pd, Ag, Au, Pt, or Ir, or a nitride thereof.

BRIEF DESCRIPTION OF THE DRAWINGS

FIG. 1 is a graph showing the relationship between voltage value and time in flattening plating as carried out under a constant-current control;

FIG. 2 is a graph showing the relationship between current value and time in flattening plating as carried out under a constant-voltage control;

FIG. 5 is a plan view of a substrate processing apparatus incorporating a plating apparatus according to an embodiment of the present invention;

FIG. 7 is a schematic view showing another driving mechanism for making a relative motion between the porous member (lower pad) and the substrate held by the substrate stage;

FIG. 12 is a plan view showing an example of the cleaning and drying apparatus shown in FIG. 5;

FIG. 22 is a systematic diagram of the pretreatment apparatus shown in FIG. 5;

FIG. 23 is a cross-sectional view showing a substrate head of an electroless plating apparatus shown in FIG. 5 at the time of substrate transfer;

FIG. 29 is a systematic diagram of the cleaning tank of the pretreatment apparatus shown in FIG. 5;

DETAILED DESCRIPTION OF THE INVENTION

Preferred embodiments of the present invention will be described below with reference to the drawings. The following embodiments relate to the application of the present invention useful for forming interconnects of copper by embedding copper as an interconnect material in fine recesses for interconnects formed in a surface of the substrate. However, it should be noted that other kinds of interconnect materials may be used instead of copper.

Figure 3A:
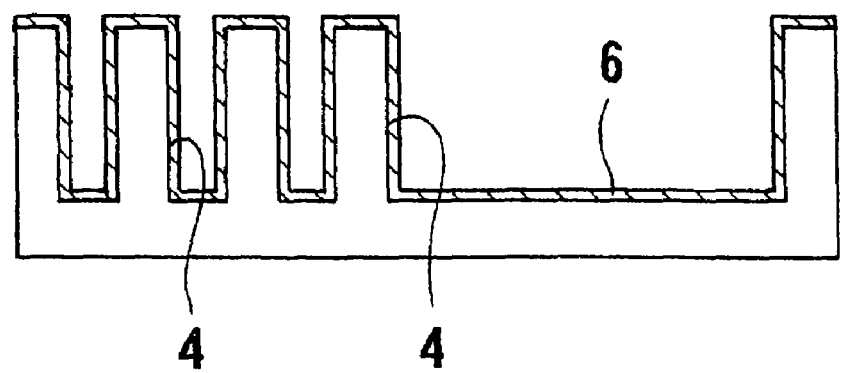
FIG. 3A is a cross-sectional diagram showing the state of the substrate at the beginning of flattening plating.
Figure 3B:
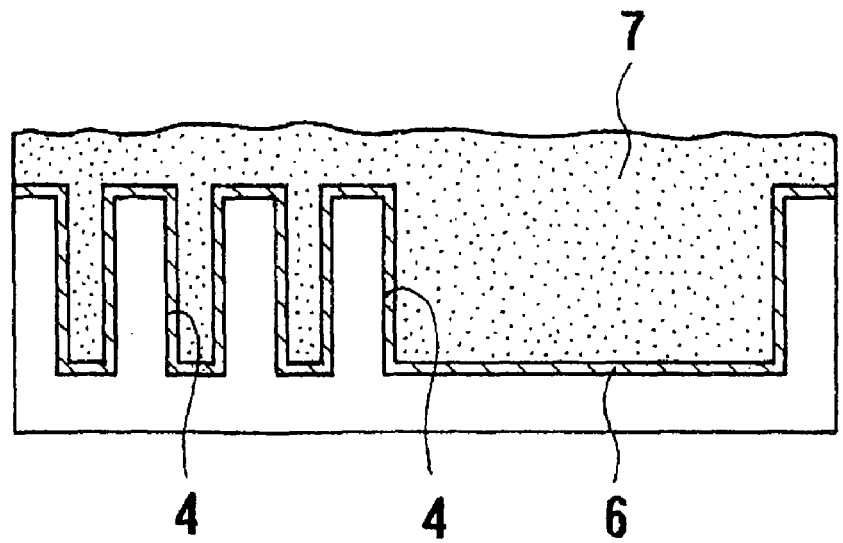
FIG. 3B is a cross-sectional diagram showing the state of the substrate upon completion of the flattening plating.
Figure 4A:
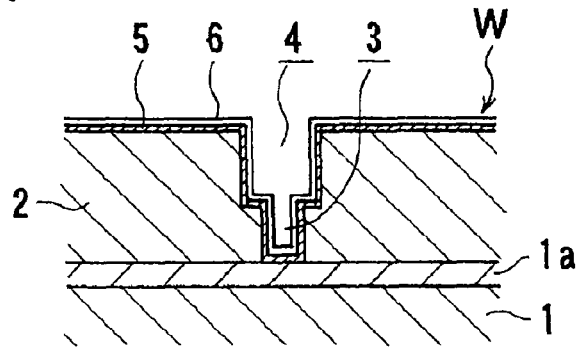
FIG. 4A through 4D are views showing an example for forming interconnects in the semiconductor device in a sequence of steps.

FIGS. 4A through 4D illustrate an example of forming copper interconnects in a semiconductor device. As shown in FIG. 4A, an insulating film 2, such as an oxide film of $SiO_2$ or a film of low-k material, is deposited on a conductive layer 1a formed on a semiconductor base 1 having formed semiconductor devices. Via holes 3 and trenches 4 are formed in the insulating film 2 by performing a lithography/etching technique so as to provide fine recesses for interconnects. Thereafter, a barrier layer 5 of TaN or the like is formed on the insulating film 2, and a seed layer 6 as a electric supply layer for electroplating is formed on the barrier layer 5 by sputtering or the like.

Figure 4B:
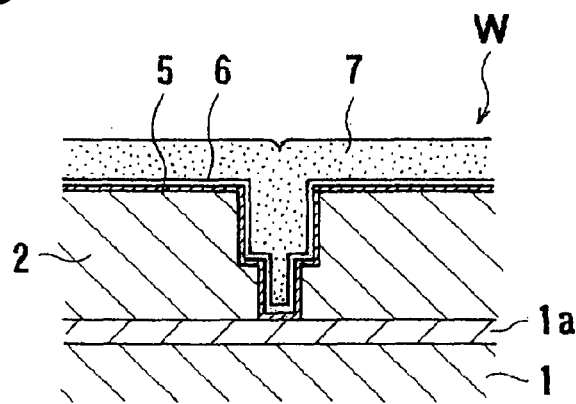
Figure 4C:
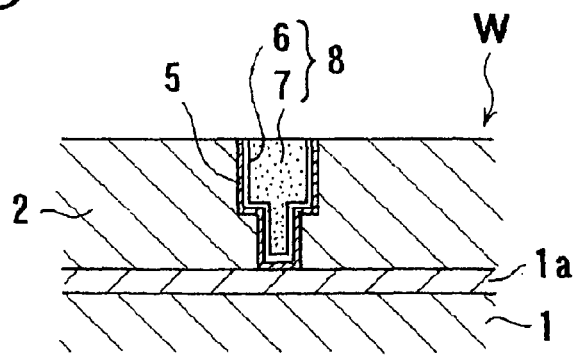

Then, as shown in FIG. 4B, copper plating is performed on a surface of a substrate W to fill the via holes 3 and the trenches 4 with copper and, at the same time, deposit a copper layer 7 on the insulating film 2. Thereafter, the barrier layer 5, the seed layer 6 and the copper layer 7 on the insulating film 2 are removed by chemical mechanical polishing (CMP) or the like so as to leave copper filled in the via holes 3 and the trenches 4, and have a surface of the insulating film 2 lie substantially on the same plane as this copper. Interconnects (copper interconnects) 8 composed of the seed layer 6 and the copper layer 7 are thus formed in the insulating film 2, as shown in FIG. 4C.

Figure 4D:
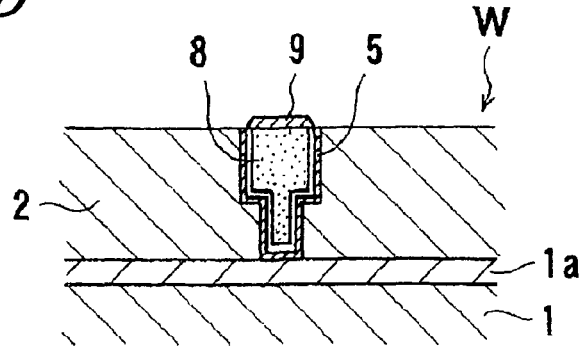

Then, as shown in FIG. 4D, electroless plating is performed on a surface of the substrate W to selectively form a protective film 9 of a Co alloy, an Ni alloy, or the like on surfaces of the interconnects 8, thereby covering and protecting the surfaces of the interconnects 8 with the protective film 9.

FIG. 5 is a plan view of a substrate processing apparatus incorporating a plating apparatus according to an embodiment of the present invention. As shown in FIG. 5, the substrate processing apparatus comprises a rectangular apparatus frame 212 to which transfer boxes 210 such as SMIF (Standard Mechanical Interface) boxes which accommodate a number of substrates such as semiconductor wafers, are detachably attached. Inside of the apparatus frame 212, there are disposed a loading/unloading station 214, and a movable transfer robot 216 for transferring a substrate to and from the loading/unloading station 214. A pair of plating apparatuses 218 is disposed on both sides of the transfer robot 216. A cleaning and drying apparatus 220, a bevel etching and backside cleaning apparatus 222, and a polishing apparatus 232 are disposed in alignment with each other on one side of the transfer robot 216. On the other side of the transfer robot 216, a heat treatment (annealing) apparatus 226, a pretreatment apparatus 228, and an electroless plating apparatus 230 are disposed in alignment with each other.

The apparatus frame 212 is shielded so as not to allow a light to transmit therethrough, thereby enabling subsequent processes to be performed under a light-shielded condition in the apparatus frame 212. Specifically, the subsequent processes can be performed without irradiating the interconnects with a light such as an illuminating light. By thus preventing the interconnects from being irradiated with a light, it is possible to prevent the interconnects of copper from being corroded due to a potential difference of light that is caused by application of light to the interconnects composed of copper, for example.

Figure 6:
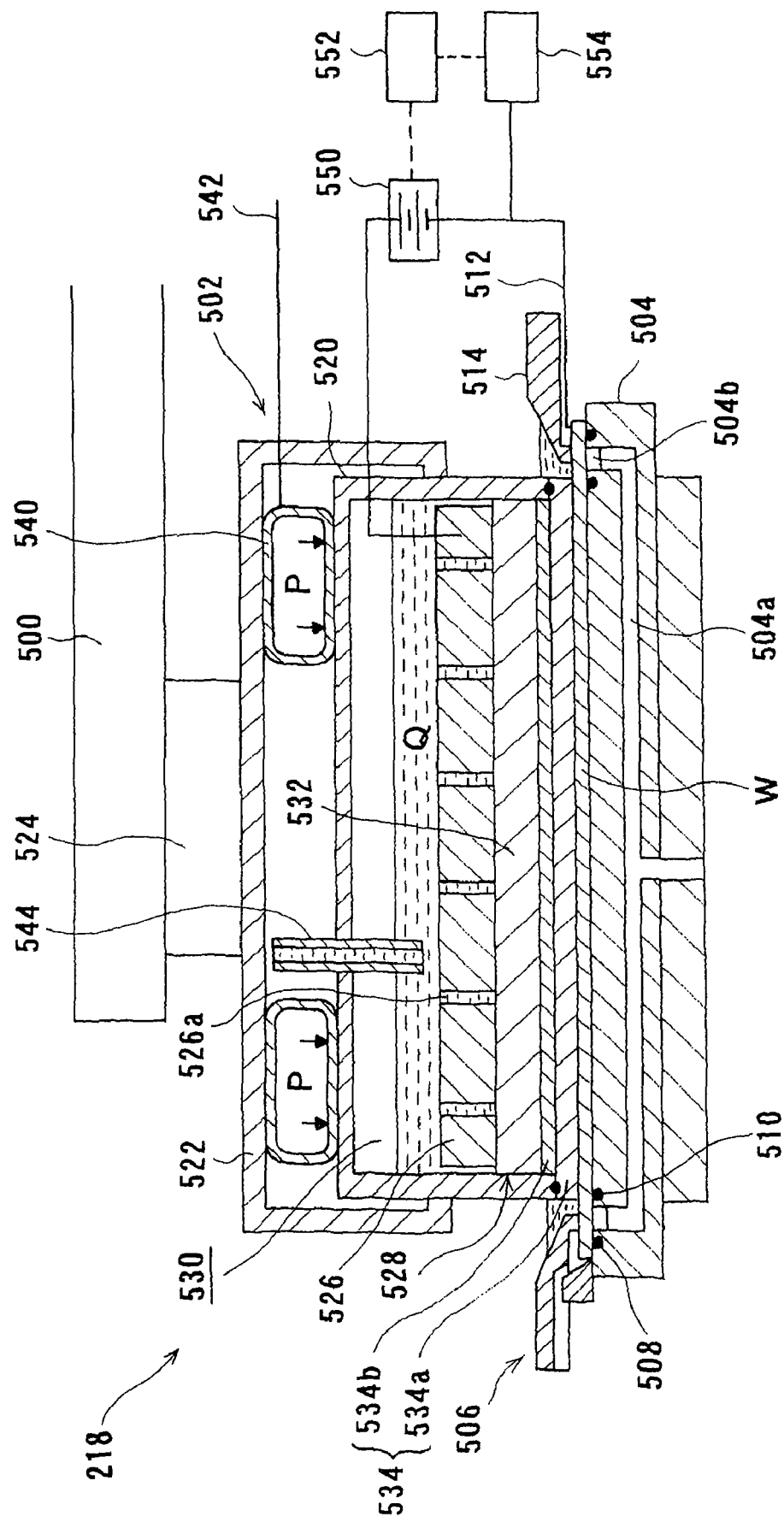
FIG. 6 is a schematic view showing an essential part of the plating apparatus shown in FIG. 5.

FIG. 6 schematically shows the plating apparatus 218. As shown in FIG. 6, the plating apparatus 218 comprises a swing arm 500 which is horizontally swingable. An electrode head 502 is rotatably supported by a tip end portion of the swing arm 500. A substrate holder 504 for holding a substrate W in such a state that a surface, to be plated, of the substrate W faces upwardly is vertically movably disposed below the electrode head 502. A cathode section 506 is disposed above the substrate holder 504 so as to surround a peripheral portion of the substrate holder 504.

In this embodiment, the electrode head 502 whose diameter is slightly smaller than that of the substrate holder 504 is used so that plating can be performed over the substantially entire surface, to be plated, of the substrate W without changing a relative position between the electrode head 502 and the substrate holder 504. In this embodiment, the present invention is applied to a so-called face-up type plating apparatus in which the substrate is held and plated in such a state that the front face of the substrate faces upwardly. However, the present invention is, of course, applicable to a so-called face-down type plating apparatus in which the substrate is held and plated in such a state that a front face of the substrate faces downwardly, or a so-called vertical-set type plating apparatus in which the substrate is held in a vertical direction and plated.

An annular vacuum attraction groove 504b communicating with a vacuum passage 504a provided in the substrate holder 504 is formed in a peripheral portion of an upper surface of the substrate holder 504. Seal rings 508 and 510 are provided on inward and outward sides of the vacuum attraction groove 504b, respectively. With the above structure, the substrate W is placed on the upper surface of the substrate holder 504, and the vacuum attraction groove 504b is evacuated through the vacuum passage 504a to attract the peripheral portion of the substrate W, thereby holding the substrate W.

An elevating/lowering motor (not shown), which comprises a servomotor, and a ball screw (not shown) are used to move the swing arm 500 vertically, and a swinging motor (not shown) is used to rotate (swing) the swing arm 500. Alternatively, a pneumatic actuator may be used instead of the motor.

In this embodiment, the cathode section 506 has the cathode electrodes 512 comprising six cathode electrodes, and the annular seal member 514 disposed above the cathode electrodes 512 so as to cover upper surfaces of the cathode electrodes 512. The seal member 514 has an inner circumferential portion which is inclined inwardly and downwardly so that a thickness of the seal member 514 is gradually reduced. The seal member 514 has an inner circumferential edge portion extending downwardly. With this structure, when the substrate holder 504 is moved upwardly, the peripheral portion of the substrate W held by the substrate holder 504 is pressed against the cathode electrodes 512, thus allowing electric current pass through to the substrate W. At the same time, the inner circumferential edge portion of the seal member 514 is held in close contact with the upper surface of the peripheral portion of the substrate W to seal a contact portion in a watertight manner. Accordingly, a plating solution that has been supplied onto the upper surface (surface to be plated) of the substrate W is prevented from leaking from the end portion of the substrate W, and the cathode electrodes 512 are thus prevented from being contaminated by the plating solution.

In this embodiment, the cathode section 506 is not movable vertically, but is rotatable together with the substrate holder 504. However, the cathode section 506 may be designed to be movable vertically so that the seal member 514 is brought into close contact with the surface, to be plated, of the substrate W when the cathode section 506 is moved downwardly.

The above-mentioned electrode head 502 comprises a rotatable housing 522 and a vertically movable housing 520 which have a bottomed cylindrical shape with a downwardly open end and are disposed concentrically. The rotatable housing 522 is fixed to a lower surface of a rotating member 524 attached to a free end of the swing arm 500 so that the rotatable housing 522 is rotated together with the rotating member 524. An upper portion of the vertically movable housing 520 is positioned inside the rotatable housing 522, and the vertically movable housing 520 is rotated together with the rotatable housing 522 and is moved relative to the rotatable housing 522 in a vertical direction. The vertically movable housing 520 defines an anode chamber 530 by closing the lower open end of the vertically movable housing 520 with a porous member 528 so that a disk-like anode 526 is disposed in the anode chamber 530 and is dipped in a plating solution Q which is introduced to the anode chamber 530.

In this embodiment, the porous member 528 has a multi-layered structure comprising three-layer laminated porous materials. Specifically, the porous member 528 comprises a plating solution impregnated material 532 serving to hold a plating solution mainly, and a porous pad 534 attached to a lower surface of the plating solution impregnated material 532. This porous pad 534 comprises a lower pad 534a adapted to be brought into direct contact with the substrate W, and an upper pad 534b disposed between the lower pad 534a and the plating solution impregnated material 532. The plating solution impregnated material 532 and the upper pad 534b are positioned in the vertically movable housing 520, and the lower open end of the vertically movable housing 520 is closed by the lower pad 534a.

As described above, since the porous member 528 has a multi-layered structure, it is possible to use the porous pad 534 (the lower pad 534a) which contacts the substrate W, for example, and has flatness enough to flatten irregularities on the surface, to be plated, of the substrate W.

The lower pad 534a is required to have the contact surface adapted to contact the surface (surface to be contacted) of the substrate W and having a certain degree of flatness, and to have fine through-holes therein for allowing the plating solution to pass therethrough. It is also necessary that at least the contact surface of the lower pad 534a is made of an insulator or a material having high insulating properties. The surface of the lower pad 534a is required to have a maximum roughness (RMS) of about several tens μm or less.

It is desirable that the fine through-holes of the lower pad 534a have a circular cross-section in order to maintain flatness of the contact surface. An optimum diameter of each of the fine through-holes and the optimum number of the fine through-holes per unit area vary depending on the kind of a plated film and an interconnect pattern. However, it is desirable that both the diameter and the number are as small as possible in view of improving selectivity of a plated film that is growing in recesses. Specifically, the diameter of each of the fine through-holes may be not more than 30 µm, preferably in the range of 5 to 20 µm. The number of the fine through-holes having such diameter per unit area may be represented by a porosity of not more than 50%.

Further, it is desirable that the lower pad 534a has a certain degree of hardness. For example, the lower pad 534a may have a tensile strength ranging from 5 to 100 kg/cm$^2$ and an elastic bending strength ranging from 200 to 10000 kg/cm$^2$.

Furthermore, it is desirable that the lower pad 534a is made of hydrophilic material. For example, the following materials may be used after being subjected to hydrophilization or being introduced with a hydrophilic group by polymerization. Examples of such materials include porous polyethylene (PE), porous polypropylene (PP), porous polyamide, porous polycarbonate, and porous polyimide. The porous PE, the porous PP, the porous polyamide, and the like are produced by using fine powder of ultrahigh-molecular polyethylene, polypropylene, and polyamide, or the like as a material, squeezing the fine powder, and sintering and forming the squeezed fine powder. These materials are commercially available. For example, "Furudasu S (trade name)" manufactured by Mitsubishi Plastics, Inc, "Sunfine UF (trade name)", "Sunfine AQ (trade name)", both of which are manufactured by Asahi Kasei Corporation, and "Spacy (trade name)" manufactured by Spacy Chemical Corporation are available on the market. The porous polycarbonate may be produced by passing a high-energy heavy metal such as copper, which has been accelerated by an accelerator, through a polycarbonate film to form straight tracks, and then selectively etching the tracks.

The lower pad 534a may be produced by a flattening process in which the surface, to be brought into contact with the surface of the substrate W, of the lower pad 534a is compacted or machined to a flat finish for thereby enabling a high-preferential deposition in the fine recesses.

On the other hand, the plating solution impregnated material 532 may be composed of porous ceramics such as alumina, SiC, mullite, zirconia, titania or cordierite, or a hard porous member such as a sintered compact of polypropylene or polyethylene, or a composite material comprising these materials. The plating solution impregnated material 532 may be composed of a woven fabric or a non-woven fabric. In case of the alumina-based ceramics, for example, the ceramics with a pore diameter of 30 to 200 µm is used. In case of the SiC, the SiC with a pore diameter of not more than 30 µm, a porosity of 20 to 95%, and a thickness of about 1 to 20 mm, preferably 5 to 20 mm, more preferably 8 to 15 mm, is used. The plating solution impregnated material 532, in this embodiment, is composed of porous ceramics of alumina having a porosity of 30%, and an average pore diameter of 100 µm. The porous ceramic plate per se is an insulator, but is constructed so as to have a smaller conductivity than the plating solution by causing the plating solution to enter its inner part complicatedly and follow a considerably long path in the thickness direction.

In this manner, the plating solution impregnated material 532 is disposed in the anode chamber 530, and generates high resistance. Hence, the influence of the resistance of the seed layer 6 (see FIG. 4A) becomes a negligible degree. Consequently, the difference in current density over the surface of the substrate due to electrical resistance on the surface of the substrate W becomes small, and the uniformity of the plated film over the surface of the substrate improves.

The electrode head 502 has a pressing mechanism comprising an air bag 540, in this embodiment, for pressing the lower pad 534a against the surface (surface to be plated) of the substrate W held by the substrate holder 504 under a desired pressure. Specifically, in this embodiment, a ring-shaped airbag (pressing mechanism) 540 is provided between the lower surface of the top wall of the rotatable housing 522 and the upper surface of the top wall of the vertically movable housing 520, and this air bag 540 is connected to a pressurized fluid source (not shown) through a pressurized fluid introduction pipe 542.

Thus, the swing arm 500 is fixed at a predetermined position (process position) so as not to move vertically, and then the inner part of the air bag 540 is pressurized under a pressure of P, whereby the lower pad 534a is uniformly pressed against the surface (surface to be plated) of the substrate W held by the substrate holder 504 under a desired pressure. Thereafter, the pressure P is restored to an atmospheric pressure, whereby pressing of the lower pad 534a against the substrate W is released.

A plating solution introduction pipe 544 is attached to the vertically movable housing 520 to introduce the plating solution into the vertically movable housing 520, and a pressurized fluid introduction pipe (not shown) is attached to the vertically movable housing 520 to introduce a pressurized fluid into the vertically movable housing 520. A number of pores 526a are formed within the anode 526. Thus, a plating solution Q is introduced from the plating solution introduction pipe 544 into the anode chamber 530, and the inner part of the anode chamber 530 is pressurized, whereby the plating solution Q reaches the upper surface of the plating solution impregnated material 532 through the pores 526a of the anode 526, and reaches the upper surface of the substrate W held by the substrate holder 504 through the inner part of the plating solution impregnated material 532 and inner part of the porous pad 534 (the upper pad 534b and the lower pad 534a).

The anode chamber 530 includes gases generated by chemical reaction therein, and hence the pressure in the anode chamber 530 may be varied. Therefore, the pressure in the anode chamber 530 is controlled to a certain set value by a feedback control in the process.

For example, in the case of performing copper plating, in order to suppress slime formation, the anode 526 is generally made of copper (phosphorus-containing copper) containing 0.03 to 0.05% of phosphorus. The anode 526 may comprise an insoluble metal such as platinum or titanium, or an insoluble electrode comprising metal on which platinum or the like is plated. Since replacement or the like is unnecessary, the insoluble metal or the insoluble electrode is preferable. Further, the anode 526 may be a net-like anode which allows a plating solution to pass therethrough easily.

The cathode electrodes 512 are to be electrically connected to the cathode of a plating power source 550, and the anode 526 is to be electrically connected to the anode of the plating power source 550. The power source 550 is so controlled by a constant-voltage control section 552 as to apply a constant voltage to between the cathode electrodes 512 and the anode 526. A current monitor section 554 is provided which, when a constant voltage is applied between the cathode electrodes 512 and the anode 526, monitors an electric current flowing between the cathode electrodes 512 and the anode 526. A detection signal from the current monitor section 554 is fed back (inputted) to the constant-voltage control section 552.

Plating is carried out by applying a constant voltage to between the cathode electrodes 512 and the anode 526 by the constant-voltage control section 552, i.e. under a constant-voltage control, while an electric current flowing between the cathode electrodes 512 and the anode 526 during plating is monitored with the current monitor section 554. Feeding of electricity between the cathode electrodes 512 and the anode 526 is stopped after elapse of a predetermined period of time from a point of time at which the current value becomes constant, thereby stopping the plating. In particular, whether the current value detected by the current monitor section 554 has become constant is determined, for example, by a determination program. Upon determination of the constancy of the current value, a signal for stopping feeding of electricity is inputted from the constant-voltage control section 552 to the power source 550 so as to stop feeding of electricity after elapse of a predetermined period of time.

The period of time or time difference between the point of time at which the current value becomes constant and the point of time at which feeding of electricity is stopped may be set at 0 second. By thus stopping plating immediately after completion of a flat plated film, an extra plating can be prevented from being applied to the substrate. Alternatively, the period of time or time difference between the point of time at which the current value becomes constant and the point of time at which feeding of electricity is stopped may be set at several seconds to carry out a several-second additional plating, thereby providing a plated film with a flatter surface.

Next, operation for performing plating by the plating apparatus will be described. First, in such a state that the substrate W is attracted to and held by the upper surface of the substrate holder 504, the substrate holder 504 is raised to bring the peripheral portion of the substrate W into contact with the cathode electrodes 512, thus making it possible to supply current to the substrate W. Then, the substrate holder 504 presses the seal member 514 against the upper surface of the peripheral portion of the substrate W, thereby sealing the peripheral portion of the substrate W in a watertight manner.

On the other hand, the electrode head 502 is moved from a position (idling position) where replacement of the plating solution, removal of bubbles, and the like are conducted by idling to a predetermined position (process position) in such a state that the plating solution Q is held inside the electrode head 502. Specifically, the swing arm 500 is once raised and further swung, whereby the electrode head 502 is located right above the substrate holder 504. Thereafter, the electrode head 502 is lowered, and when the electrode head 502 reaches the predetermined position (process position), the electrode head 502 is stopped. Then, the anode chamber 530 is pressurized, and the plating solution Q held by the electrode head 502 is discharged from the lower surface of the porous pad 534. Next, the lower pad 534*a* is pressed downwardly by introducing a pressurized air into the air bag 540 to press the lower pad 534*a* against the upper surface (surface to be plated) of the substrate W held by the substrate holder 504 under a desired pressure.

While keeping the lower pad 534*a* in contact with the surface of the substrate W, the lower pad 534*a* is rotated e.g. at a speed of one revolution per second by the rotating member 524 to thereby rub the lower pad 534*a* against the surface of the substrate W. It is, of course, possible to fix the lower pad 534*a* and rotate the substrate W. At the same time, the cathode electrodes 512 are connected to the cathode of the plating power source 550 and the anode 526 is connected to the anode of the plating power source 550 respectively, and a constant voltage is applied between the cathode electrodes 512 and the anode 526 by the constant-voltage control section 552 to carry out plating. During the plating, an electric current flowing between the cathode electrodes 512 and the anode 526 is monitored with the current monitor section 554. Feeding of electricity between the cathode electrodes 512 and the anode 526 is stopped after elapse of a predetermined period of time, for example, from 0 second to several seconds, from a point of time at which a determination program or the like detects the fact that the current value has become constant, thereby stopping the plating.

As described above, when carrying out plating under a constant-voltage control by a plating method generally called flattening plating, the current value increases with the progress of plating and becomes constant at a certain value. This phenomenon is marked especially when carrying out plating while rubbing the lower pad 534*a*, constituting the porous member 528, against the surface, to be plated, of the substrate W held by the substrate holder 504, because a plated film with a flat surface can be formed regardless of variation of the configuration of interconnect pattern. Accordingly, by carrying out plating of the substrate under a constant-voltage control, monitoring the current value during plating to detect a point of time at which the current value becomes constant, and stopping the plating based on the detected point of time, it becomes possible to obtain the intended plated film with a flat surface without applying an extra plating to the substrate.

After the completion of plating, the pressure in the anode chamber 530 is returned to atmospheric pressure, and the pressure in the air bag 540 is returned to atmospheric pressure, thereby releasing the pressing of the lower pad 534*a* on the substrate W. The electrode head 502 is raised, and returned to the idling position.

Alternatively, plating may be carried out in the following manner: Pressurized air is introduced into the air bag 540, as described above, so as to press the lower pad 534*a* downward, bringing it into contact with the upper surface (surface to be plated) of the substrate W held by the substrate holder 504 under a desired pressure. The lower pad 534*a* is rotated, according to necessity, for example, at a speed of one revolution per second so as to rub the lower pad 534*a* against the surface of the substrate W. After stopping the rotation of the lower pad 534*a*, the cathode electrodes 512 are connected to the cathode of the plating power source 550 and the anode 526 is connected to the anode of the plating power source 550, and a constant voltage is applied between the cathode electrodes 512 and the anode 526 by the constant-voltage control section 552 to carry out plating, while an electric current flowing between the cathode electrodes 512 and the anode 526 is monitored with the current monitor section 554.

Also in this case, by carrying out plating after stopping the contact between the lower pad 534*a*, constituting the porous member 528, and the surface, to be plated, of the substrate W held by the substrate holder 504, a plated film with a flat surface can be formed regardless of variation (difference in width and size) of the configuration of interconnect pattern. Thus, when carrying out plating under a constant-voltage control, the phenomenon that the current value increases with the progress of plating and becomes constant at a certain value, is marked. Accordingly, by detecting a point of time at which the current value becomes constant and stopping plating based on the detected point of time, it becomes possible to obtain the intended plated film with a flat surface without applying an extra plating to the substrate.

Though in this embodiment the lower pad 534*a*, constituting the porous member 528, and the substrate W held by the substrate holder 504 are moved relative to each other while they are kept in contact with each other, it is also possible to vibrate the lower pad 534*a* in such a manner that it repeats contact and non-contact (detachment) with the surface, to be plated, of the substrate W held by the substrate holder 504 (see FIG. 6), as shown in FIG. 7. It is, of course, possible to vibrate the substrate W.

Thus, the lower pad 534a is vibrated in such a manner that the lower pad 534a and the surface, to be plated, of the substrate W repeat their contact and non-contact, while the cathode electrodes 512 are connected to the cathode of the plating power source 550 and the anode 526 is connected to the anode of the plating power source 550, and a constant voltage is applied between the cathode electrodes 512 and the anode 526 by the constant-voltage control section 552 to carry out plating, while an electric current flowing between the cathode electrodes 512 and the anode 526 is monitored with the current monitor section 554.

Also in this case, by carrying out plating while repeating contact and non-contact between the lower pad 534a, constituting the porous member 528, and the surface, to be plated, of the substrate W held by the substrate holder 504, a plated film with a flat surface can be formed regardless of variation of the configuration of interconnect pattern. Accordingly, by detecting a point of time at which the current value becomes constant and stopping plating based on the detected point of time, as described above, it becomes possible to obtain the intended plated film with a flat surface without applying an extra plating to the substrate.

Figure 8A:
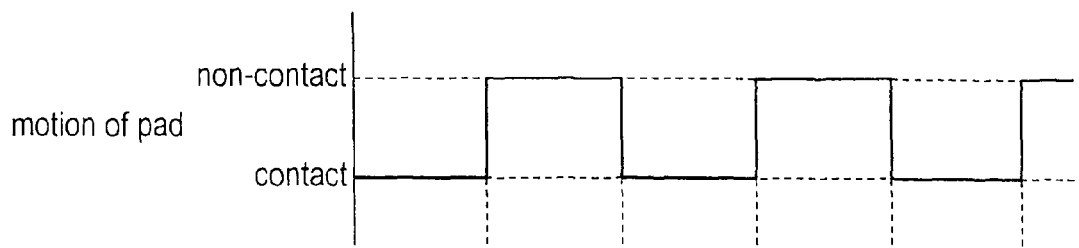
FIGS. 8A through 8D are diagrams illustrating a plating method in which contact and non-contact between the lower pad (porous member) and the surface (surface to be plated) of a substrate is repeated, and a current or voltage is applied during one of the contact time and the non-contact time.
Figure 8B:
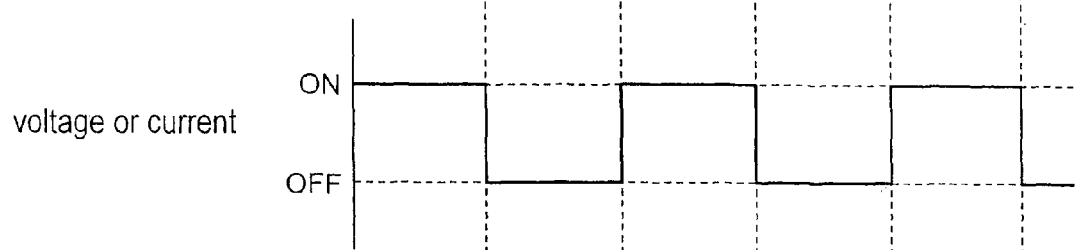

Plating may also be carried out in the following manner: The operation of introducing pressurized air into the air bag 540 to press the lower pad 534a downward and, after elapse of a predetermined period of time, returning the pressure in the air bag 540 to atmospheric pressure to release the downward pressing of the lower pad 534a is repeated, thereby repeating contact and non-contact between the lower pad 534a and the surface of the substrate W, as shown in FIG. 8A. As shown in FIG. 8B, only when the lower pad 534a and the surface of the substrate are in contact with each other, the cathode electrodes 512 are connected to the cathode of the plating power source 550 and the anode 526 is connected to the anode of the plating power source 550, and a constant voltage is applied between the cathode electrodes 512 and the anode 526 by the constant-voltage control section 552 to carry out plating while an electric current flowing between the cathode electrodes 512 and the anode 526 is monitored with the current monitor section 554. The lower pad 534a and the substrate W may either be moved relative to each other or kept motionless when they are in contact with each other.

Figure 8C:
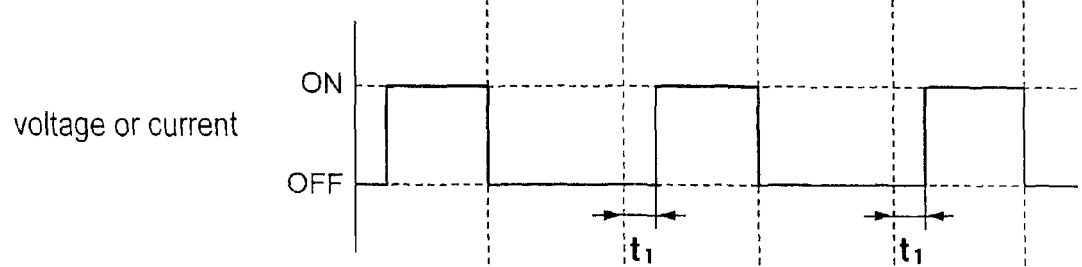

In this case, as shown in FIG. 8C, it is also possible to provide a predetermined waiting time $t_1$ so that the cathode electrodes 512 are connected to the cathode of the plating power source 550 and the anode 526 is connected to the anode of the plating power source 550 after elapse of the waiting time $t_1$ from the point of time at which the lower pad 534a makes contact with the surface of the substrate.

Figure 8D:
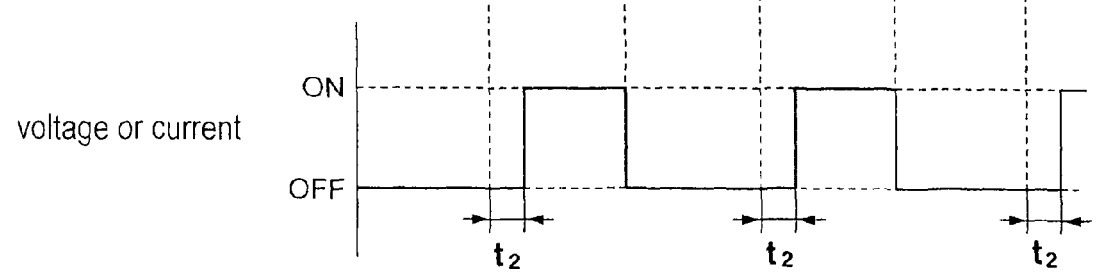

Alternatively, as shown in FIG. 8D, it is also possible to provide a waiting time $t_2$ only when the lower pad 534a and the surface of the substrate are not in contact with each other so that a constant voltage is applied between the cathode electrodes 512 and the anode 526 to carry out plating after elapse of the waiting time $t_2$ from the point of time at which the contact between the lower pad 534a and the substrate surface is released.

Furthermore, though not shown diagrammatically, it is also possible to change the electrical conditions, that is, apply different constant voltages between the contact time and the non-contact time of the lower pad 534a with the surface of the substrate.

Figure 9:
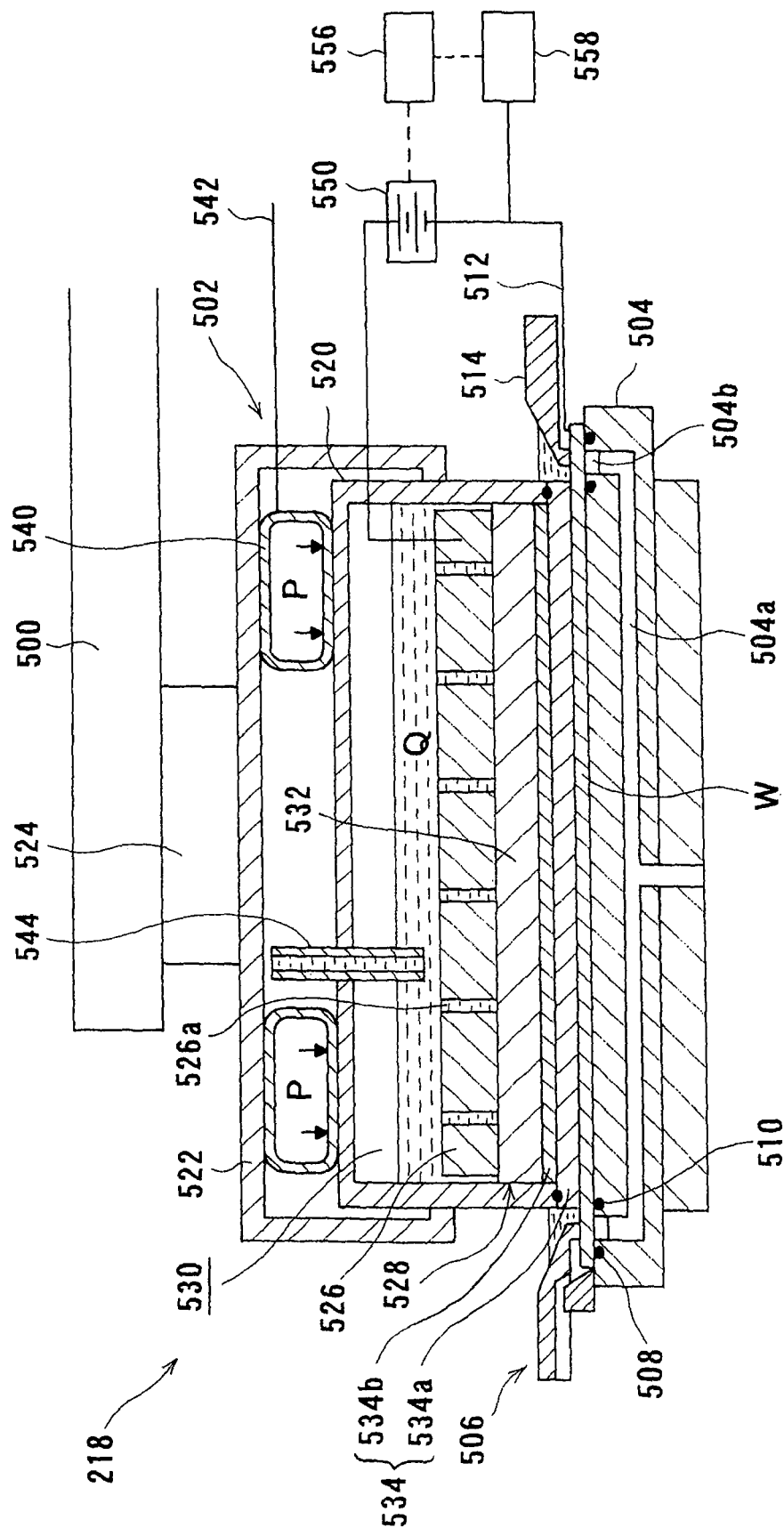
FIG. 9 is a schematic view showing an essential part of a plating apparatus according to another embodiment of the present invention.

FIG. 9 shows a plating apparatus 218 according to another embodiment of the present invention. This embodiment differs from the embodiment shown in FIG. 6 in that the power source 550 is so controlled by a constant-current control section 556 as to pass a constant electric current between the cathode electrodes 512 and the anode 526, a voltage monitor section 558 is provided which, when a constant electric current is passed between the cathode electrodes 512 and the anode 526, detects the voltage value between the cathode electrodes 512 and the anode 526, and a detection signal from the voltage monitor section 558 is fed back (inputted) to the constant-current control section 556.

Plating is carried out by passing a constant electric current between the cathode electrodes 512 and the anode 526 by the constant-current control section 556, i.e. under a constant-current control, while the voltage value between the cathode electrodes 512 and the anode 526 is monitored with the voltage monitor section 558 during plating. Feeding of electricity between the cathode electrodes 512 and the anode 526 is stopped after elapse of predetermined period of time from a point of time at which the voltage value becomes constant, thereby stopping the plating. In particular, whether the voltage value detected by the voltage monitor section 558 has become constant is determined, for example, by a determination program. Upon determination of the constancy of the voltage value, a signal for stopping feeding of electricity is inputted from the constant-current control section 556 to the power source 550 so as to stop feeding of electricity after elapse of a predetermined period of time.

According to this embodiment, similarly to the above-described embodiment, pressurized air is introduced into the air bag 540 so as to press the lower pad 534a downward, thereby pressing the lower pad 534a against the upper surface (surface to be plated) of the substrate W, held by the substrate holder 504, under a desired pressure. While keeping the lower pad 534a in contact with the surface of the substrate W, the lower pad 534a is rotated e.g. at a speed of one revolution per second by the rotating member 524 to thereby rub the lower pad 534a against the surface of the substrate W. At the same time, the cathode electrodes 512 are connected to the cathode of the plating power source 550 and the anode 526 is connected to the anode of the plating power source 550, and a constant electric current is passed between the cathode electrodes 512 and the anode 526 by the constant-current control section 556 to carry out plating. During the plating, the voltage value applied between the cathode electrodes 512 and the anode 526 is monitored with the voltage monitor section 558. Feeding of electricity between the cathode electrodes 512 and the anode 526 is stopped after elapse of a predetermined period of time, for example, 0 second to several seconds, from a point of time at which a determination program or the like detects the fact that the voltage value has become constant, thereby stopping the plating.

As described above, when carrying out plating under a constant-current control by a plating method generally called flattening plating, the voltage value increases with the progress of plating and becomes constant at a certain value. This phenomenon is marked especially when carrying out plating while rubbing the lower pad 534a, constituting the porous member 528, against the surface to be plated of the substrate W held by the substrate holder 504, because a plated film with a flat surface can be formed regardless of variation of the configuration of interconnect pattern. Accordingly, by carrying out plating of the substrate under a constant-current control, monitoring the voltage value during plating to detect a point of time at which the voltage value becomes constant, and stopping the plating based on the detected point of time, it becomes possible to obtain the intended plated film with a flat surface without applying an extra plating to the substrate.

Alternatively, plating may be carried out in the following manner: Pressurized air is introduced into the air bag 540, as described above, so as to press the lower pad 534*a* downward, bringing it into contact with the upper surface (surface to be plated) of the substrate W, held by the substrate holder 504, under a desired pressure. The lower pad 534*a* is rotated, according to necessity, for example, at a speed of one revolution per second so as to rub the lower pad 534*a* against the surface of the substrate W. After stopping the rotation of the lower pad 534*a*, the cathode electrodes 512 are connected to the cathode of the plating power source 550 and the anode 526 is connected to the anode of the plating power source 550, and a constant electric current is passed between the cathode electrodes 512 and the anode 526 by the constant-current control section 556 to carry out plating, while the voltage applied between the cathode electrodes 512 and the anode 526 is monitored with the voltage monitor section 558.

Plating may also be carried out in the following manner: The lower pad 534*a*, constituting the porous member 628, is vibrated in such a manner that it repeats contact and non-contact with the surface, to be plated, of the substrate W held by the substrate holder 504 (see FIG. 6), as shown in FIG. 7, while the cathode electrodes 512 are connected to the cathode of the plating power source 550 and the anode 526 is connected to the anode of the plating power source 550, and a constant electric current is passed between the cathode electrodes 512 and the anode 526 by the constant-current control section 556 to carry out plating while the voltage applied between the cathode electrodes 512 and the anode 526 is monitored with the voltage monitor section 558.

Plating may also be carried out in the following manner: As shown in FIG. 8A, contact and non-contact between the lower pad 534*a* and the surface of the substrate W is repeated and, as shown in FIG. 8B, only when the lower pad 534*a* and the surface of the substrate are in contact with each other, the cathode electrodes 512 are connected to the cathode of the plating power source 550 and the anode 526 is connected to the anode of the plating power source 550, and a constant electric current is passed between the cathode electrodes 512 and the anode 526 by the constant-current control section 556 to carry out plating while the voltage applied between the cathode electrodes 512 and the anode 526 is monitored with the voltage monitor section 558.

In this case, as shown in FIG. 8C, it is also possible to provide a predetermined waiting time $t_1$ so that the cathode electrodes 512 are connected to the cathode of the plating power source 550 and the anode 526 is connected to the anode of the plating power source 550 after elapse of the waiting time $t_1$ from the point of time at which the lower pad 534*a* makes contact with the surface of the substrate.

Alternatively, as shown in FIG. 8D, it is also possible to provide a waiting time $t_2$ only when the lower pad 534*a* and the surface of the substrate are not in contact with each other so that a constant electric current is passed between the cathode electrodes 512 and the anode 526 to carry out plating after elapse of the waiting time $t_2$ from the point of time at which the contact between the lower pad 534*a* and the substrate surface is released.

Furthermore, though not shown diagrammatically, it is also possible to change the electrical conditions, that is, apply different constant currents between the contact time and the non-contact time of the lower pad 534*a* with the surface of the substrate.

Figure 10:
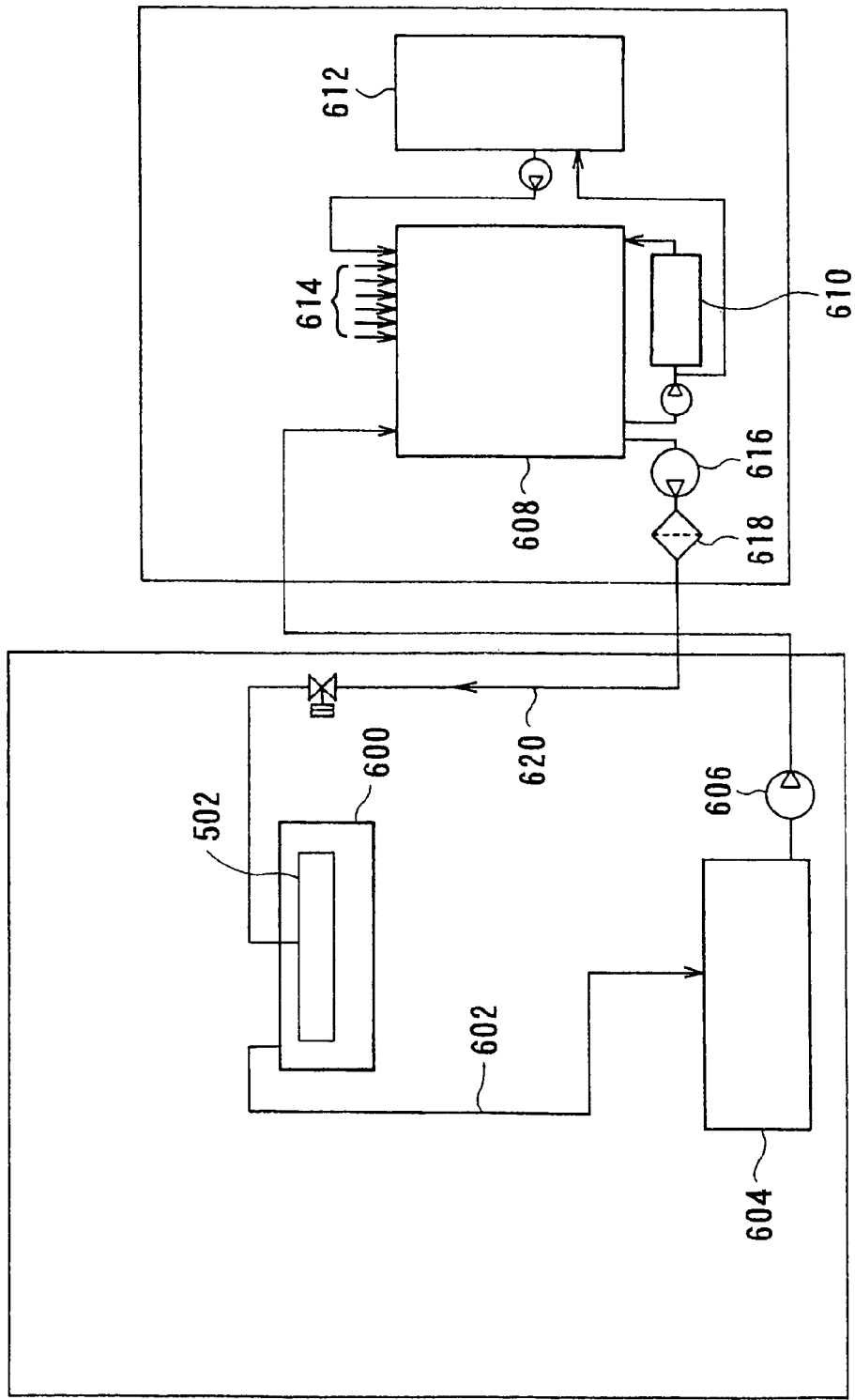
FIG. 10 is a systematic diagram showing an example of a plating solution management system.

FIG. 10 shows a plating solution management and supply system for supplying a plating solution whose composition, temperature, and the like are controlled to the plating apparatus 218. As shown in FIG. 10, a plating solution tray 600 for allowing the electrode head 502 of the plating apparatus 218 to be immersed for idling is provided, and the plating solution tray 600 is connected to a reservoir 604 through a plating solution discharge pipe 602. The plating solution discharged through the plating solution discharge pipe 602 flows into the reservoir 604.

The plating solution, which has flowed into the reservoir 604, is introduced into the plating solution regulating tank 608 by operating a pump 606. This plating solution regulating tank 608 is provided with a temperature controller 610, and a plating solution analyzing unit 612 for sampling the plating solution and analyzing the sample solution. Further, component replenishing pipes 614 for replenishing the plating solution with components which are found to be insufficient by an analysis performed by the plating solution analyzing unit 612 are connected to the plating solution regulating tank 608. When a pump 616 is operated, the plating solution in the plating solution regulating tank 608 flows in the plating solution supply pipe 618, passes through the filter 618, and is then returned to the plating solution tray 600.

In this manner, the composition and temperature of the plating solution is adjusted to be constant in the plating solution regulating tank 608, and the adjusted plating solution is supplied to the electrode head 502 of the plating apparatus 218. Then, by holding the adjusted plating solution by the electrode head 502, the plating solution having constant composition and temperature at all times can be supplied to the electrode head 502 of the plating apparatus 218.

Figure 11:
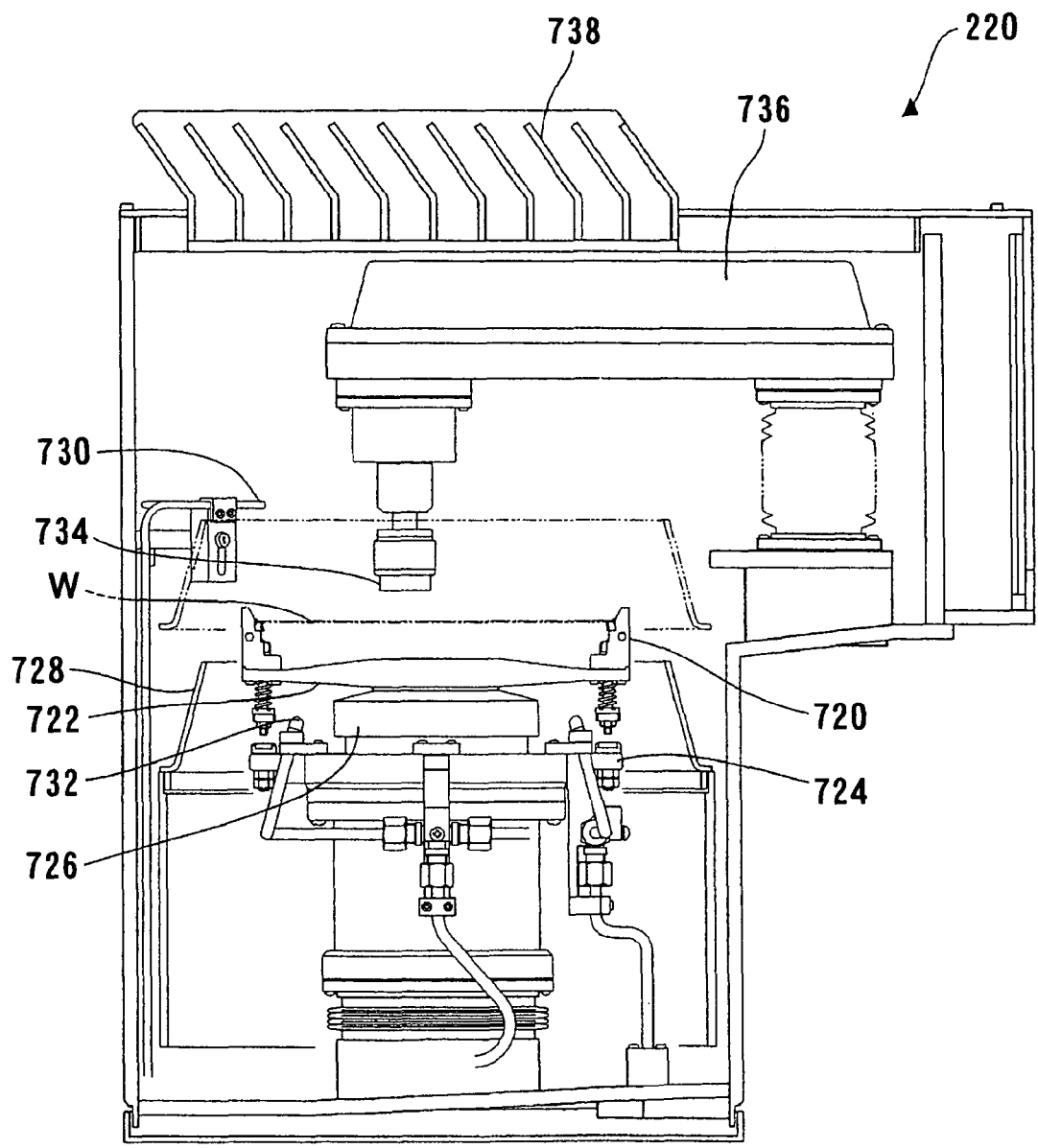
FIG. 11 is a front cross-sectional view showing an example of a cleaning and drying apparatus shown in FIG. 5.

FIGS. 11 and 12 show an example of a cleaning and drying apparatus 220 for cleaning (rinsing) the substrate W and drying the substrate w. Specifically, the cleaning and drying apparatus 220 performs chemical cleaning and pure water cleaning (rinsing) first, and then completely drying the substrate W which has been cleaned by spindle rotation. The cleaning and drying apparatus 220 comprises a substrate stage 722 having a clamp mechanism 720 for clamping an edge portion of the substrate W, and a substrate mounting and removing lifting/lowering plate 724 for opening and closing the clamp mechanism 720.

The substrate stage 722 is coupled to an upper end of a spindle 726 which is rotated at a high speed by driving a spindle rotating motor (not shown). Further, a cleaning cup 728 for preventing a treatment liquid from being scattered around is disposed around the substrate W held by the clamp mechanism 720, and the cleaning cup 728 is vertically moved by actuation of a cylinder (not shown).

Further, the cleaning and drying apparatus 220 comprises a chemical liquid nozzle 730 for supplying a treatment liquid to the surface of the substrate W held by the clamp mechanism 720, a plurality of pure water nozzles 732 for supplying pure water to the backside surface of the substrate W, and a pencil-type cleaning sponge 730 which is disposed above the substrate W held by the clamp mechanism 720 and is rotatable. The pencil-type cleaning sponge 734 is attached to a free end of a swing arm 736 which is swingable in a horizontal direction. Clean air introduction ports 738 for introducing clean air into the apparatus are provided at the upper part of the cleaning and drying apparatus 220.

With the cleaning and drying apparatus 220 having the above structure, the substrate W is held and rotated by the clamp mechanism 720, and while the swing arm 736 is swung, a treatment liquid is supplied from the chemical liquid nozzle 730 to the cleaning sponge 734, and the surface of the substrate W is rubbed with the pencil-type cleaning sponge 734, thereby cleaning the surface of the substrate W. Further, pure water is supplied to the backside surface of the substrate W from the pure water nozzles 732, and the backside surface of the substrate W is simultaneously cleaned (rinsed) by the pure water ejected from the pure water nozzles 732. Thus cleaned substrate W is spin-dried by rotating the spindle 726 at a high speed.

Figure 13:
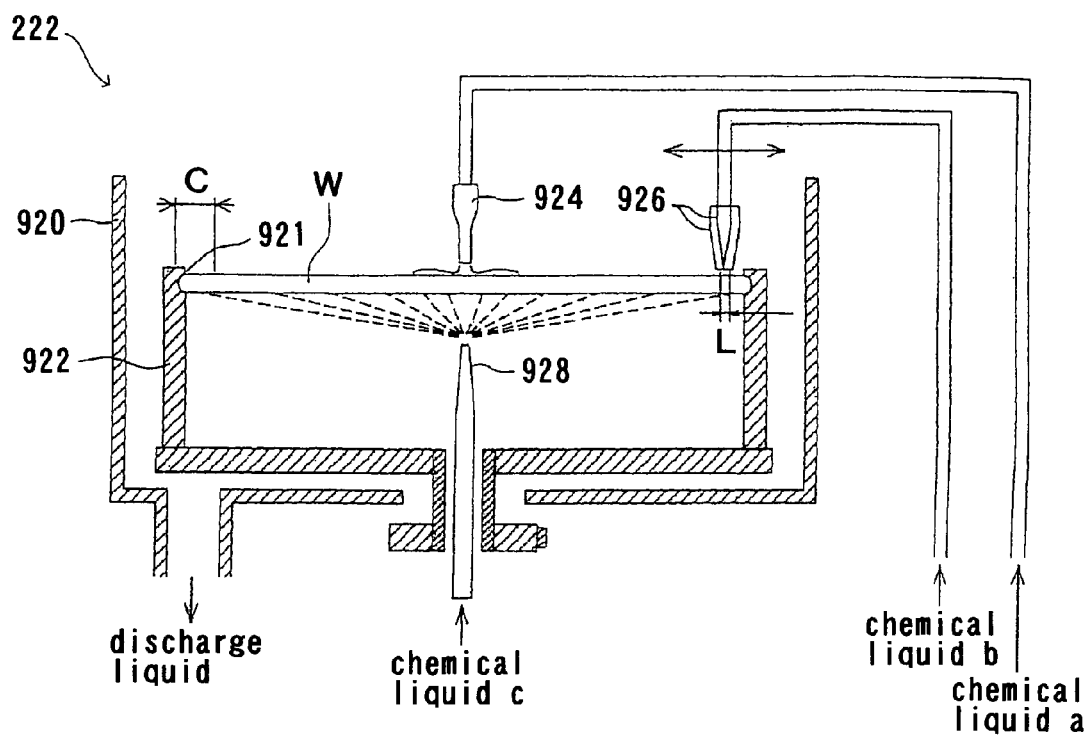
FIG. 13 is a schematic view showing an example of a bevel etching and backside cleaning apparatus shown in FIG. 5.

FIG. 13 shows an example of a bevel etching and backside cleaning apparatus 222. The bevel etching and backside cleaning apparatus 222 can perform etching of the copper layer 7 (see FIG. 4B) deposited on an edge (bevel) of the substrate and backside cleaning simultaneously, and can suppress growth of a natural oxide film of copper at the circuit formation portion in the surface of the substrate. The bevel etching and backside cleaning apparatus 222 has a substrate stage 922 positioned inside a bottomed cylindrical waterproof cover 920 and adapted to rotate the substrate W at a high speed, in such a state that the face of the substrate W faces upward, while holding the substrate W horizontally by spin chucks 921 at a plurality of locations along a circumferential direction of a peripheral edge portion of the substrate W, a center nozzle 924 disposed above a nearly central portion of the face of the substrate w held by the substrate stage 922, and an edge nozzle 926 disposed above the peripheral edge portion of the substrate W. The center nozzle 924 and the edge nozzle 926 are directed downward, respectively. A back nozzle 928 is positioned below a nearly central portion of the backside of the substrate W, and directed upward. The edge nozzle 926 is adapted to be movable in a diametrical direction and a height direction of the substrate W.

The width of movement L of the edge nozzle 926 is set such that the edge nozzle 926 can be arbitrarily positioned in a direction toward the center from the outer peripheral end surface of the substrate, and a set value for L is inputted, according to the size, usage, or the like of the substrate W. Normally, an edge cut width C is set in the range of 2 mm to 5 mm. In the case where a rotational speed of the substrate is a certain value or higher at which the amount of liquid migration from the backside to the face is not problematic, the copper layer and the like within the edge cut width C can be removed.

Next, the method of cleaning with this bevel etching and backside cleaning apparatus 222 will be described. First, the substrate W is horizontally rotated integrally with the substrate stage 922, with the substrate W being held horizontally by the spin chucks 921 of the substrate stage 922. In this state, an acid solution is supplied from the center nozzle 924 to the central portion of the face of the substrate W. The acid solution may be a non-oxidizing acid, and hydrofluoric acid, hydrochloric acid, sulfuric acid, citric acid, oxalic acid, or the like is used. On the other hand, an oxidizing agent solution is supplied continuously or intermittently from the edge nozzle 926 to the peripheral edge portion of the substrate W. As the oxidizing agent solution, one of an aqueous solution of ozone, an aqueous solution of hydrogen peroxide, an aqueous solution of nitric acid, and an aqueous solution of sodium hypochlorite is used, or a combination of these is used.

In this manner, the copper layer, or the like formed on the upper surface and end surface in the region of the edge cut width C of the substrate W is rapidly oxidized with the oxidizing agent solution, and is simultaneously etched with the acid solution supplied from the center nozzle 924 and spread on the entire face of the substrate, whereby it is dissolved and removed. By mixing the acid solution and the oxidizing agent solution at the peripheral edge portion of the substrate, a steep etching profile can be obtained, in comparison with a mixture of them which is produced in advance being supplied. At this time, the copper etching rate is determined by their concentrations. If a natural oxide film of copper is formed in the circuit-formed portion on the face of the substrate, this natural oxide is immediately removed by the acid solution spreading on the entire face of the substrate according to rotation of the substrate, and does not grow any more. After the supply of the acid solution from the center nozzle 924 is stopped, the supply of the oxidizing agent solution from the edge nozzle 926 is stopped. As a result, silicon exposed on the surface is oxidized, and deposition of copper can be suppressed.

On the other hand, an oxidizing agent solution and a silicon oxide film etching agent are supplied simultaneously or alternately from the back nozzle 928 to the central portion of the backside of the substrate. Therefore, copper or the like adhering in a metal form to the backside of the substrate W can be oxidized with the oxidizing agent solution, together with silicon of the substrate, and can be etched and removed with the silicon oxide film etching agent. This oxidizing agent solution is preferably the same as the oxidizing agent solution supplied to the face, because the types of chemicals are decreased in number. Hydrofluoric acid can be used as the silicon oxide film etching agent, and if hydrofluoric acid is used as the acid solution on the face of the substrate, the types of chemicals can be decreased in number. Thus, if the supply of the oxidizing agent is stopped first, a hydrophobic surface is obtained. If the etching agent solution is stopped first, a water-saturated surface (a hydrophilic surface) is obtained, and thus the backside surface can be adjusted to a condition that will satisfy the requirements of a subsequent process.

In this manner, the acid solution, i.e., etching solution is supplied to the substrate W to remove metal ions remaining on the surface of the substrate W. Then, pure water is supplied to replace the etching solution with pure water and remove the etching solution, and then the substrate is dried by spin-drying. In this way, removal of the copper layer in the edge cut width C at the peripheral edge portion on the face of the substrate, and removal of copper contaminants on the backside are performed simultaneously to thus allow this treatment to be completed, for example, within 80 seconds. The etching cut width of the edge can be set arbitrarily (from 2 to 5 mm), but the time required for etching does not depend on the cut width.

Figure 14:
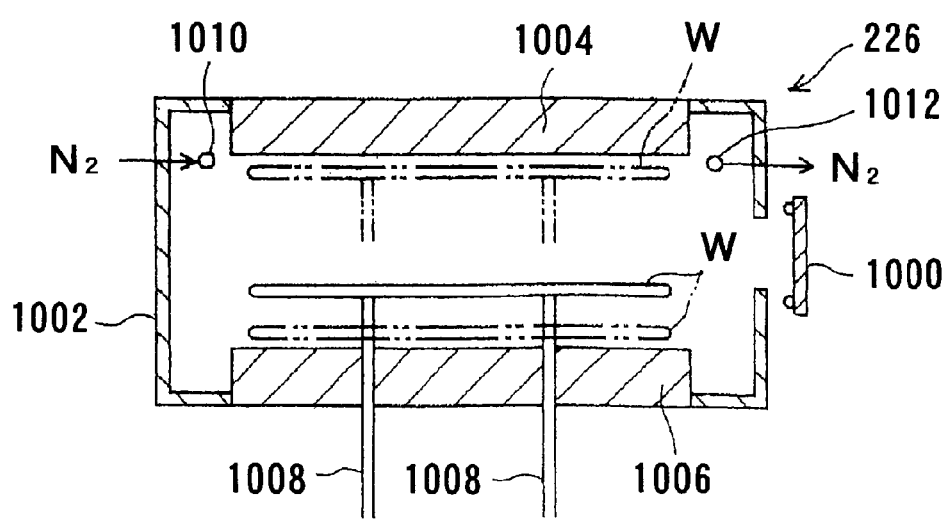
FIG. 14 is a plan cross-sectional view showing an example of a heat treatment apparatus shown in FIG. 5.
Figure 15:
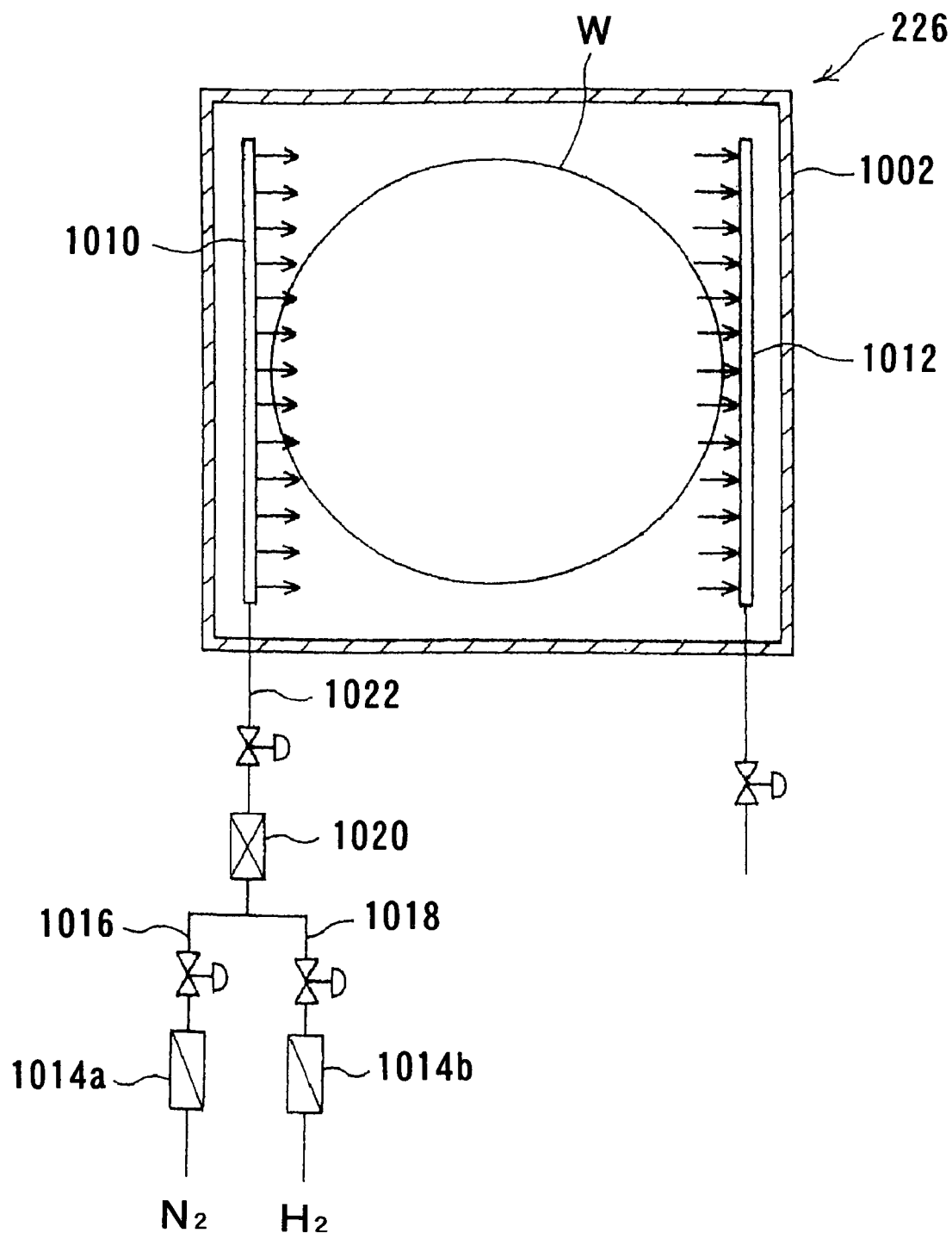
FIG. 15 is a plan cross-sectional view showing an example of the heating treatment apparatus shown in FIG. 5.

FIGS. 14 and 15 show a heat treatment (annealing) apparatus 226. The annealing apparatus 226 comprises a chamber 1002 having a gate 1000 for taking in and taking out the substrate W, a hot plate 1004 disposed at an upper position in the chamber 1002 for heating the substrate W to e.g. 400° C., and a cool plate 1006 disposed at a lower position in the chamber 1002 for cooling the substrate W by, for example, flowing cooling water inside the plate. The annealing apparatus 26 also has a plurality of vertically movable elevating pins 1008 penetrating the cool plate 1006 and extending upward and downward therethrough for placing and holding the substrate W on them. The annealing apparatus 226 further includes a gas introduction pipe 1010 for introducing an antioxidant gas between the substrate W and the hot plate 1004 during annealing, and a gas discharge pipe 1012 for discharging the gas which has been introduced from the gas introduction pipe 1010 and flowed between the substrate W and the hot plate 1004. The pipes 1010 and 1012 are disposed on the opposite sides of the hot plate 1004.

The gas introduction pipe 1010 is connected to a mixed gas introduction line 1022 which in turn is connected to a mixer 1020 where a $N_2$ gas introduced through a $N_2$ gas introduction line 1016 containing a filter 1014a, and a $H_2$ gas introduced through a $H_2$ gas introduction line 1018 containing a filter 1014b, are mixed to form a mixed gas which flows through the line 1022 into the gas introduction pipe 1010.

In operation, the substrate W, which has been carried in the chamber 1002 through the gate 1000, is held on the elevating pins 1008 and the elevating pins 1008 are raised up to a position at which the distance between the substrate W held on the lifting pins 1008 and the hot plate 1004 becomes about 0.1 to 1.0 mm, for example. In this state, the substrate W is then heated to e.g. 400° C. through the hot plate 1004 and, at the same time, the antioxidant gas is introduced from the gas introduction pipe 1010 and the gas is allowed to flow between the substrate W and the hot plate 1004 while the gas is discharged from the gas discharge pipe 1012, thereby annealing the substrate W while preventing its oxidation. The annealing may be completed in about several tens of seconds to 60 seconds. The heating temperature of the substrate may be selected in the range of 100 to 600° C.

After the completion of the annealing, the elevating pins 1008 are lowered down to a position at which the distance between the substrate W held on the elevating pins 1008 and the cool plate 1006 becomes 0 to 0.5 mm, for example. In this state, by introducing cooling water into the cool plate 1006, the substrate W is cooled by the cool plate 1006 to a temperature of 100° C. or lower in about 10 to 60 seconds. The cooled substrate is transferred to the next step.

A mixed gas of $N_2$ gas with several percentages of $H_2$ gas is used as the above antioxidant gas. However, $N_2$ gas may be used singly.

FIGS. 16 through 22 show a pretreatment apparatus 228 for performing a pretreatment of electroless plating of the substrate. The pretreatment apparatus 228 includes a fixed frame 252 that is mounted on the upper part of a frame 250, and a movable frame 254 that moves up and down relative to the fixed frame 252. A processing head 260, which includes a bottomed cylindrical housing portion 256, opening downwardly, and a substrate holder 258, is suspended from and supported by the movable frame 254. In particular, a servomotor 262 for rotating the head is mounted to the movable frame 254, and the housing portion 256 of the processing head 260 is coupled to the lower end of the downward-extending output shaft (hollow shaft) 264 of the servomotor 262.

Figure 19:
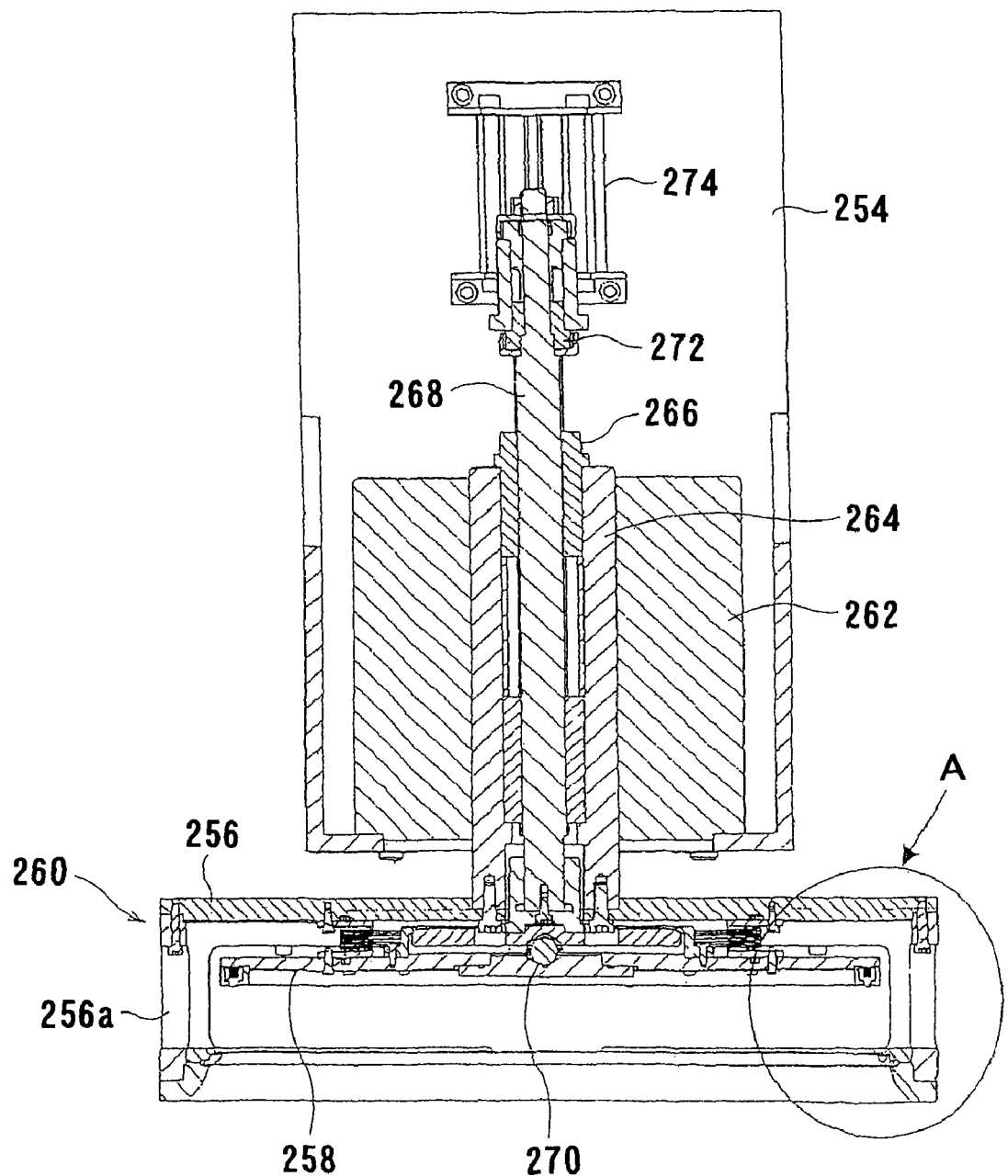
FIG. 19 is a cross-sectional view showing a processing head of the pretreatment apparatus shown in FIG. 5 at the time of substrate transfer.

As shown in FIG. 19, a vertical shaft 268, which rotates together with the output shaft 264 via a spline 266, is inserted in the output shaft 264, and the substrate holder 258 of the processing head 260 is coupled to the lower end of the vertical shaft 68 via a ball joint 270. The substrate holder 258 is positioned within the housing portion 256. The upper end of the vertical shaft 268 is coupled via a bearing 272 and a bracket to a fixed ring-elevating cylinder 274 secured to the movable frame 254. Thus, by the actuation of the cylinder 274, the vertical shaft 268 moves vertically independently of the output shaft 264.

Linear guides 276, which extend vertically and guide vertical movement of the movable frame 254, are mounted to the fixed frame 252, so that by the actuation of a head-elevating cylinder (not shown), the movable frame 254 moves vertically by the guide of the linear guides 276.

Figure 20:
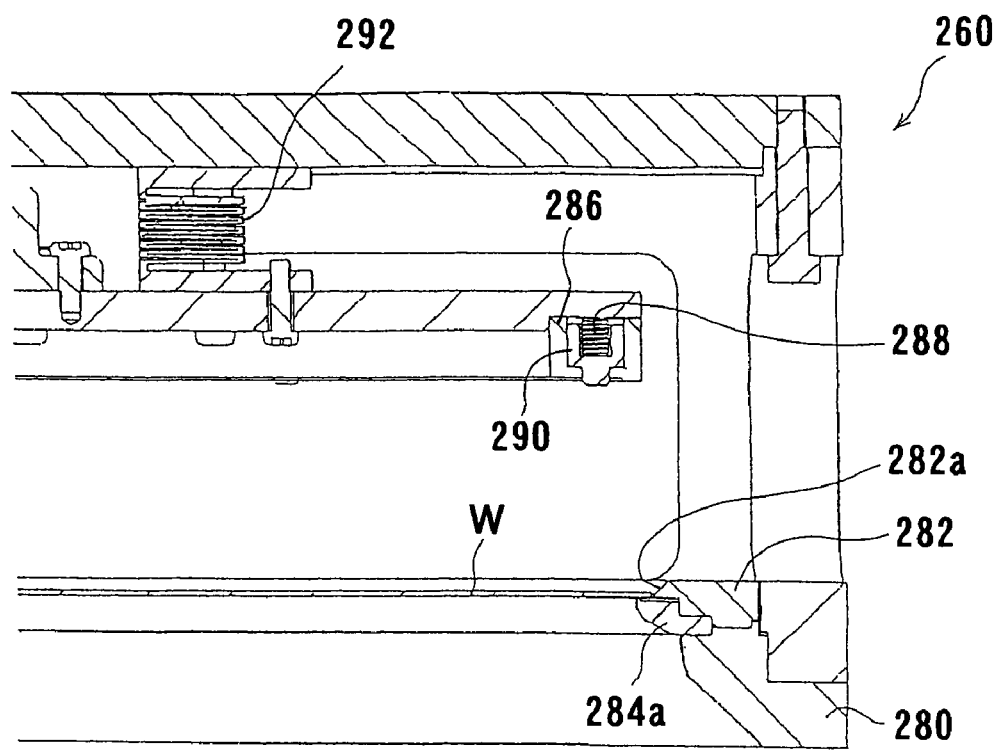
FIG. 20 is an enlarged view of A portion of FIG. 19.
Figure 21:
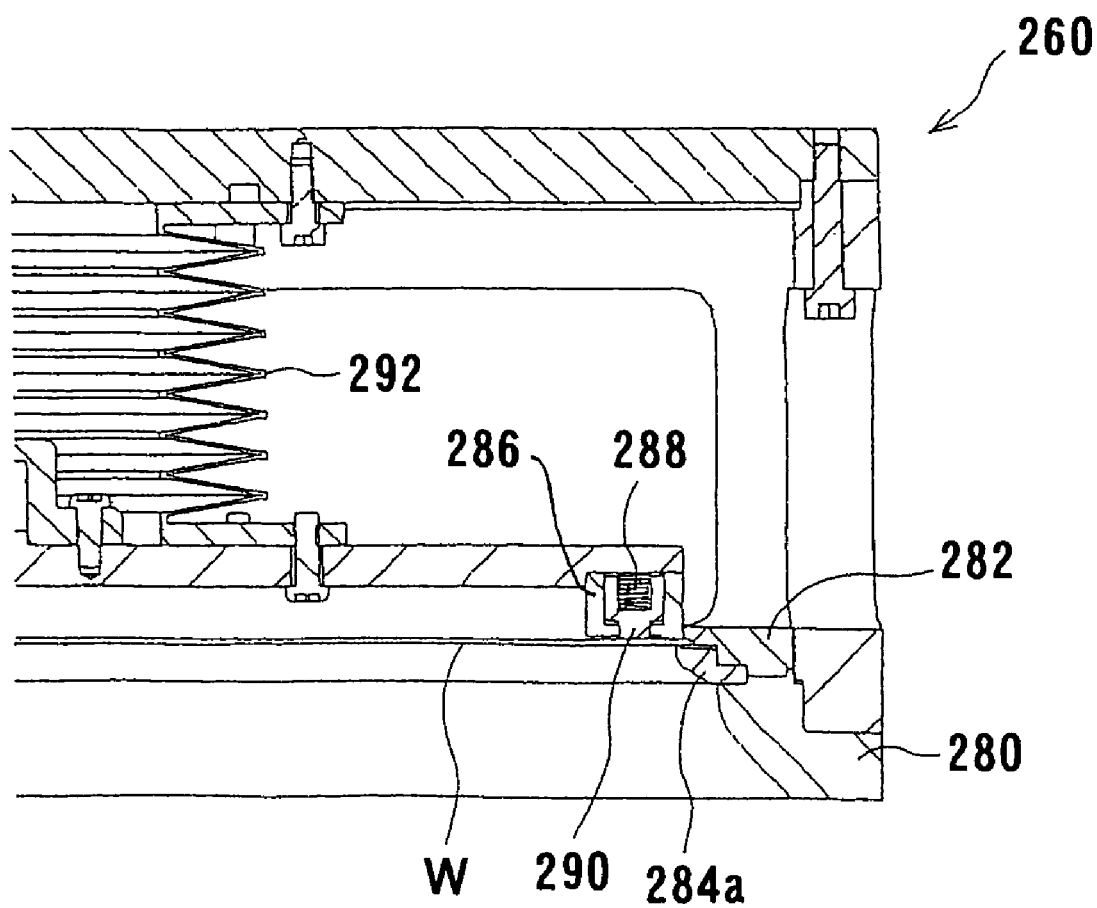
FIG. 21 is a view corresponding to FIG. 20 at the time of substrate fixing.

Substrate insertion windows 256a for inserting the substrate W into the housing portion 256 are formed in the circumferential wall of the housing portion 256 of the processing head 260. Further, as shown in FIGS. 20 and 21, a seal ring 284 is provided in the lower portion of the housing portion 256 of the processing head 260, an outer peripheral portion of the seal ring 284a being sandwiched between a main frame 280 made of e.g. PEEK and a guide frame 282 made of e.g. polyethylene. The seal ring 284a is provided to make contact with a peripheral portion of the lower surface of the substrate W to seal the peripheral portion.

On the other hand, a substrate fixing ring 286 is fixed to a peripheral portion of the lower surface of the substrate holder 258. Columnar pushers 290 each protrudes downwardly from the lower surface of the substrate fixing ring 286 by the elastic force of a spring 288 disposed within the substrate fixing ring 286 of the substrate holder 258. Further, a flexible cylindrical bellows-like plate 292 made of e.g. Teflon (registered trademark) is disposed between the upper surface of the substrate holder 258 and the upper wall of the housing portion 256 to hermetically seal therein.

When the substrate holder 258 is in a raised position, a substrate W is inserted from the substrate insertion window 256a into the housing portion 256. The substrate W is then guided by a tapered surface 282a provided in the inner circumferential surface of the guide frame 282, and positioned and placed at a predetermined position on the upper surface of the seal ring 284a. In this state, the substrate holder 258 is lowered so as to bring the pushers 290 of the substrate fixing ring 286 into contact with the upper surface of the substrate W. The substrate holder 258 is further lowered so as to press the substrate W downwardly by the elastic forces of the springs 288, thereby forcing the seal ring 284a to make pressure contact with a peripheral portion of the front surface (lower surface) of the substrate W to seal the peripheral portion while nipping the substrate W between the housing portion 256 and the substrate holder 258 to hold the substrate W.

When the head-rotating servomotor 262 is driven while the substrate W is thus held by the substrate holder 258, the output shaft 264 and the vertical shaft 268 inserted in the output shaft 264 rotate together via the spline 266, whereby the substrate holder 258 rotates together with the housing portion 256.

At a position below the processing head 260, there is provided an upward-open treatment tank 300 comprising an outer tank 300a and an inner tank 300b which have a slightly larger inner diameter than the outer diameter of the processing head 260. A pair of leg portions 304, which is mounted to a lid 302, is rotatably supported on the outer circumferential portion of the treatment tank 300. Further, a crank 306 is integrally coupled to each leg portion 306, and the free end of the crank 306 is rotatably coupled to the rod 310 of a lid-moving cylinder 308. Thus, by the actuation of the lid-moving cylinder 308, the lid 302 moves between a treatment position at which the lid 302 covers the top opening of the inner tank 300b of the treatment tank 300 and a retreat position beside the inner tank 300b of the treatment tank 300. In the surface (upper surface) of the lid 302, there is provided a nozzle plate 312 having a large number of jet nozzles 312a for jetting outwardly (upwardly), electrolytic ionic water having reducing power, for example.

Further, as shown in FIG. 22, a nozzle plate 324 having a plurality of jet nozzles 324a for jetting upwardly a chemical liquid supplied from a chemical liquid tank 320 by driving the chemical liquid pump 322 is provided in the inner tank 300b of the treatment tank 300 in such a manner that the jet nozzles 324a are equally distributed over the entire surface of the cross section of the inner tank 300b. A drainpipe 326 for draining a chemical liquid (waste liquid) to the outside is connected to the bottom of the inner tank 300b. A three-way valve 328 is provided in the drainpipe 326, and the chemical liquid (waste liquid) is returned to the chemical liquid tank 320 through a return pipe 330 connected to one of ports of the three-way valve 328 to recycle the chemical liquid, as needed. Further, in this embodiment, the nozzle plate 312 provided on the surface (upper surface) of the lid 302 is connected to a rinsing liquid supply source 332 for supplying a rinsing liquid such as pure water. Further, a drainpipe 327 is connected to the bottom of the outer tank 300a.

By lowering the processing head 260 holding the substrate so as to cover or close the top opening of the inner tank 300b of the treatment tank 300 with the processing head 260 and then jetting a chemical liquid from the jet nozzles 324a of the nozzle plate 324 disposed in the inner tank 300b of the treatment tank 300 toward the substrate W, the chemical liquid can be jetted uniformly onto the entire lower surface (surface to be processed) of the substrate W and the chemical liquid can be discharged out from the discharge pipe 326 while preventing scattering of the chemical liquid to the outside. Further, by raising the processing head 260 and closing the top opening of the inner tank 300b of the treatment tank 300 with the lid 302, and then jetting a rinsing liquid from the jet nozzles 312a of the nozzle plate 312 disposed in the upper surface of the lid 302 toward the substrate W held in the processing head 260, the rinsing treatment (cleaning treatment) is carried out to remove the chemical liquid from the surface of the substrate. Because the rinsing liquid passes through the clearance between the outer tank 300a and the inner tank 300b and is discharged through the drainpipe 327, the rinsing liquid is prevented from flowing into the inner tank 300b and from being mixed with the chemical liquid.

Figure 16:
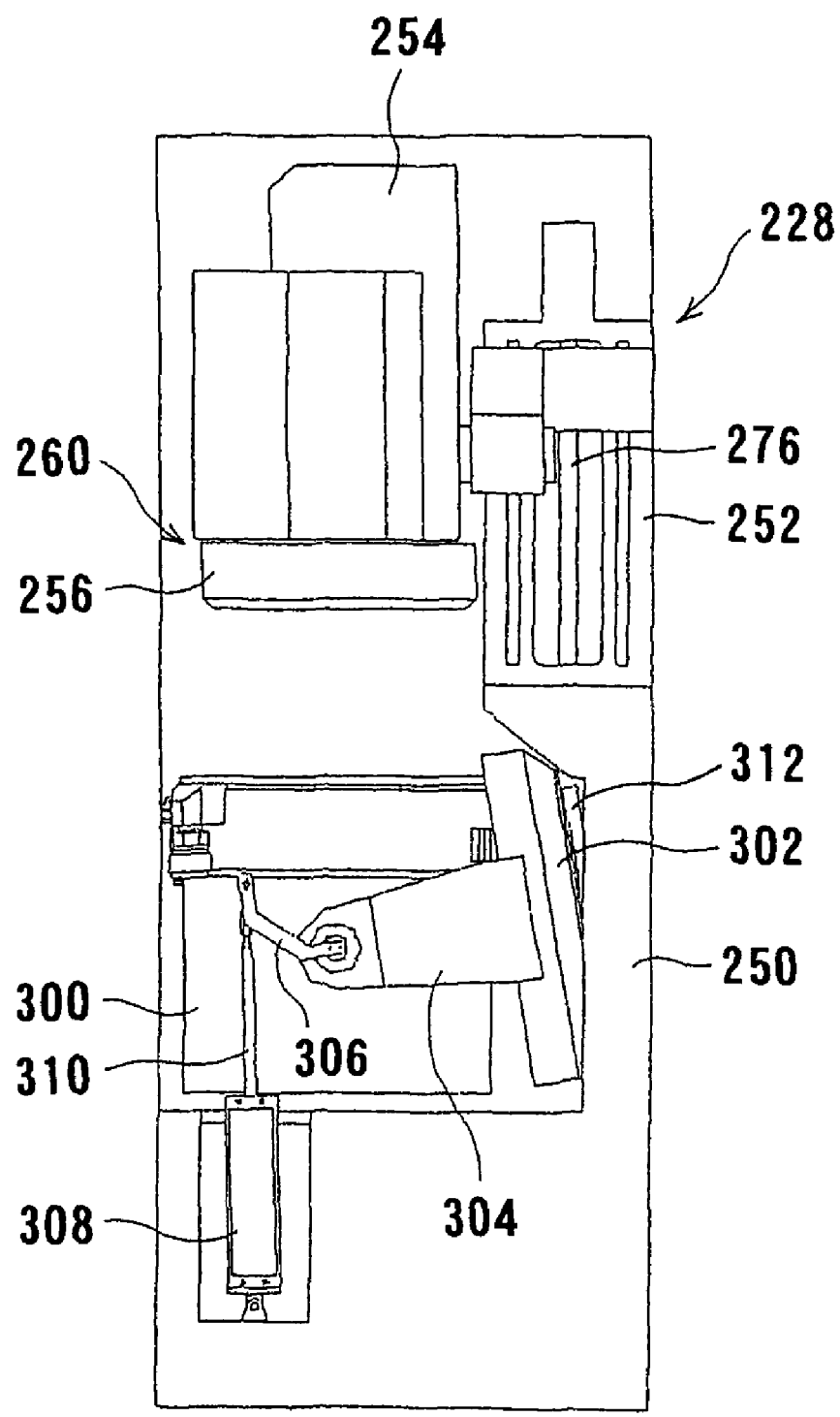
FIG. 16 is a front view of a pretreatment apparatus shown in FIG. 5 at the time of substrate transfer.
Figure 17:
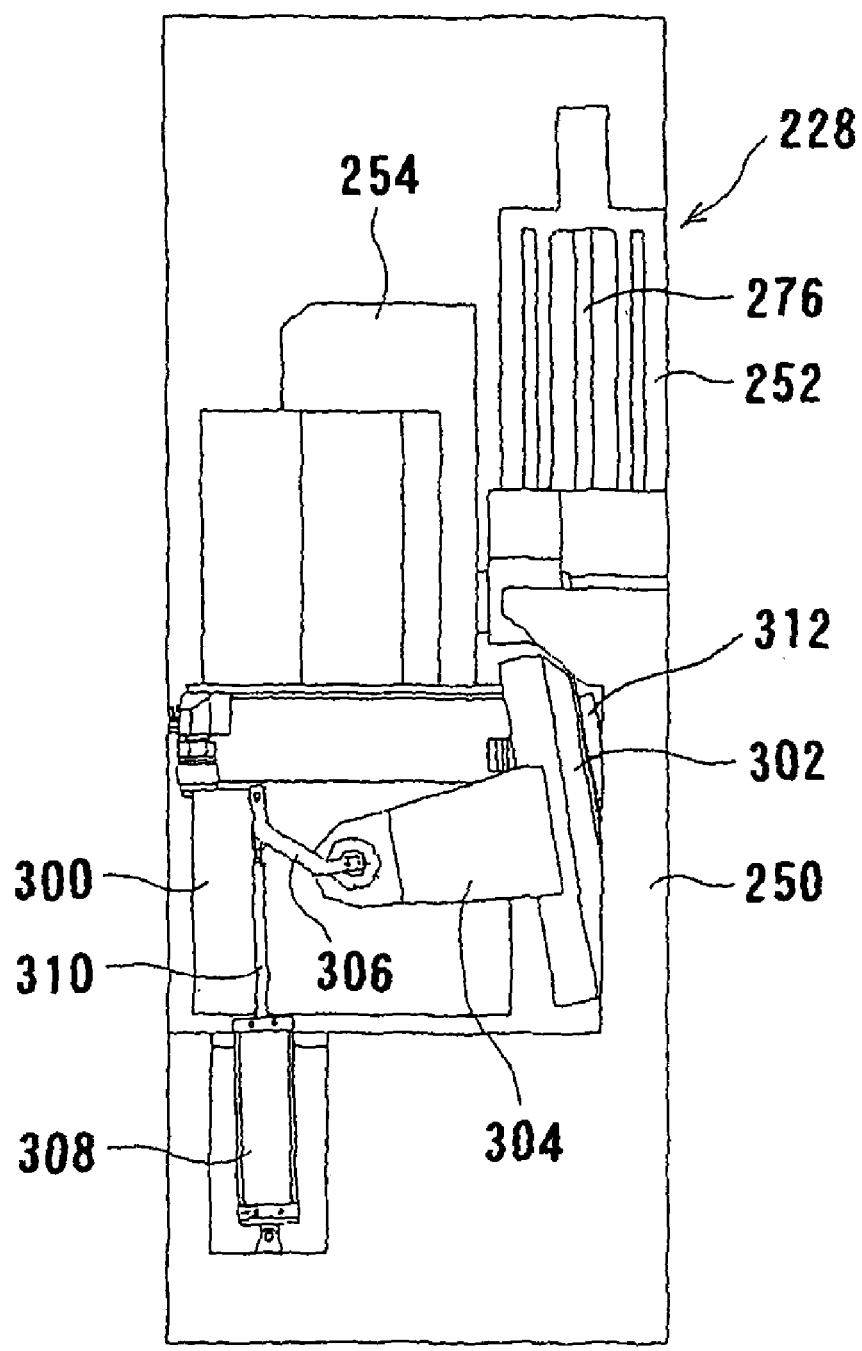
FIG. 17 is a front view of the pretreatment apparatus shown in FIG. 5 at the time of chemical treatment.
Figure 18:
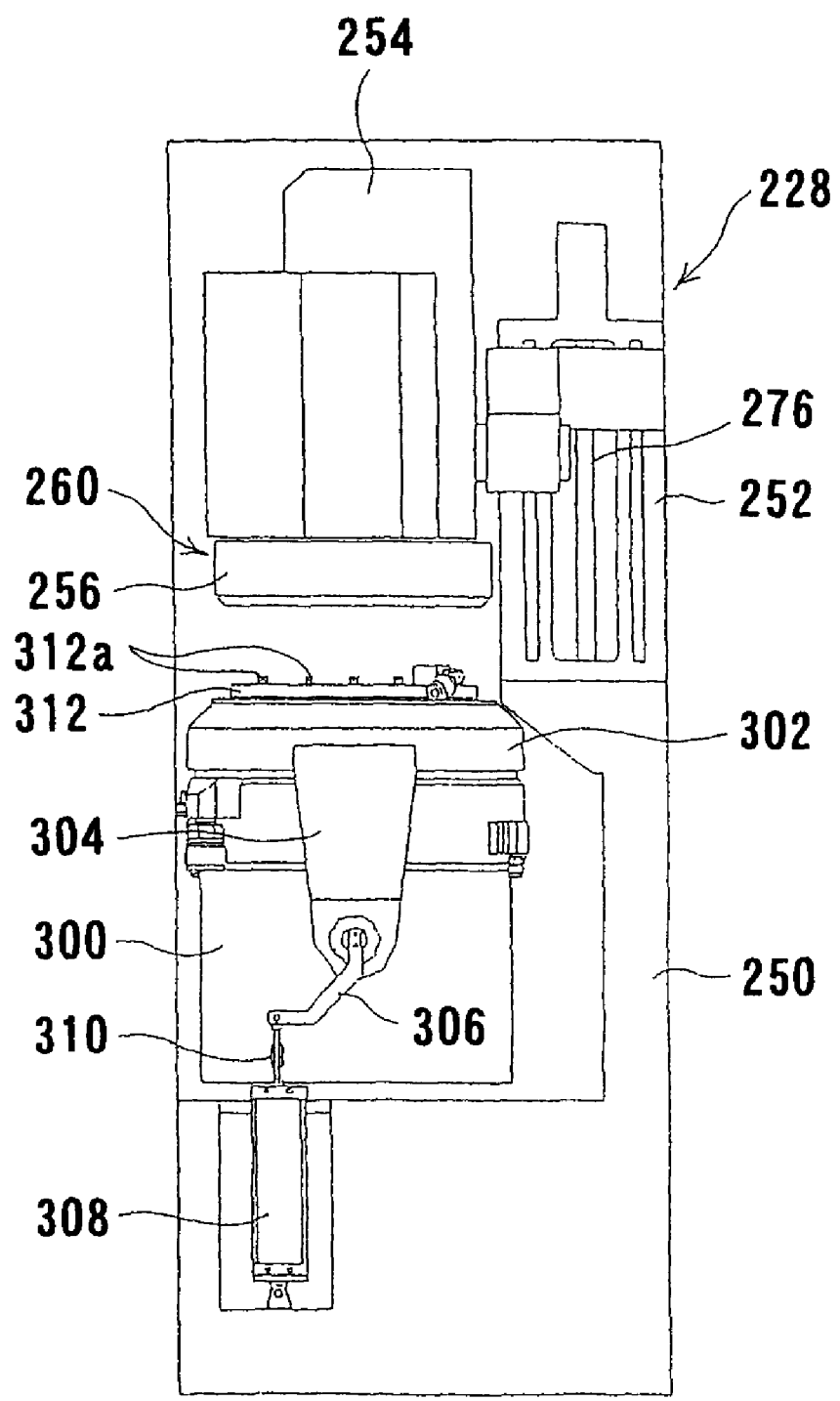
FIG. 18 is a front view of the pretreatment apparatus shown in FIG. 5 at the time of rinsing.

According to the pretreatment apparatus 228, the substrate W is inserted into the processing head 260 and held therein when the processing head 260 is in the raised position, as shown in FIG. 16. Thereafter, as shown in FIG. 17, the processing head 260 is lowered to the position at which it covers the top opening of the inner tank 300b of the treatment tank 300. While rotating the processing head 260 and thereby rotating the substrate W held in the processing head 260, a chemical liquid is jetted from the jet nozzles 324a of the nozzle plate 324 disposed in the inner tank 300b of the treatment tank 300 toward the substrate W, thereby jetting the chemical liquid uniformly onto the entire surface of the substrate W. The processing head 260 is raised and stopped at a predetermined position and, as shown in FIG. 18, the lid 302 in the retreat position is moved to the position at which it covers the top opening of the inner tank 300b of the treatment tank 300. A rinsing liquid is then jetted from the jet nozzles 312a of the nozzle plate 312 disposed in the upper surface of the lid 302 toward the rotating substrate W held in the processing head 260. The chemical treatment by the chemical liquid and the rinsing treatment by the rinsing liquid of the substrate W can thus be carried out successively while avoiding mixing of the two liquids.

The lowermost position of the processing head 260 may be adjusted to adjust the distance between the substrate W held in the processing head 260 and the nozzle plate 324, whereby the region of the substrate W onto which the chemical liquid is jetted from the jet nozzles 324a of the nozzle plate 324 and the jetting pressure can be adjusted as desired. Here, when the pretreatment liquid such as a chemical liquid is circulated and reused, active components are reduced by progress of the treatment, and the pretreatment liquid (chemical liquid) is taken out due to attachment of the treatment liquid to the substrate. Therefore, it is desirable to provide a pretreatment liquid management unit (not shown) for analyzing composition of the pretreatment liquid and adding insufficient components. Specifically, a chemical liquid used for cleaning is mainly composed of acid or alkali. Therefore, for example, a pH of the chemical liquid is measured, a decreased content is replenished from the difference between a preset value and the measured pH, and a decreased amount is replenished using a liquid level meter provided in the chemical storage tank. Further, with respect to a catalytic liquid, for example, in the case of acid palladium solution, the amount of acid is measured by its pH, and the amount of palladium is measured by a titration method or nephelometry, and a decreased amount can be replenished in the same manner as described above.

FIGS. 23 through 29 show an electroless plating apparatus 230. This electroless plating apparatus 230, which is provided to form the protective layer 9 shown in FIG. 4D, includes a plating tank 400 (see FIGS. 27 and 29) and a substrate head 404, disposed above the plating tank 400, for detachably holding a substrate W.

As shown in detail in FIG. 23, the processing head 404 has a housing portion 430 and a head portion 432. The head portion 432 mainly comprises a suction head 434 and a substrate receiver 436 for surrounding the suction head 434. The housing portion 430 accommodates therein a substrate rotating motor 438 and substrate receiver drive cylinders 440. The substrate rotating motor 438 has an output shaft (hollow shaft) 442 having an upper end coupled to a rotary joint 444 and a lower end coupled to the suction head 434 of the head portion 432. The substrate receiver drive cylinders 440 have respective rods coupled to the substrate receiver 436 of the head portion 432. Stoppers 446 are provided in the housing portion 430 for mechanically limiting upward movement of the substrate receiver 436.

The suction head 434 and the substrate receiver 436 are operatively connected to each other by a splined structure such that when the substrate receiver drive cylinders 440 are actuated, the substrate receiver 436 vertically moves relative to the suction head 434, and when the substrate rotating motor 438 is energized, the output shaft 442 thereof is rotated to rotate the suction head 434 and the substrate receiver 436 in unison with each other.

Figure 24:
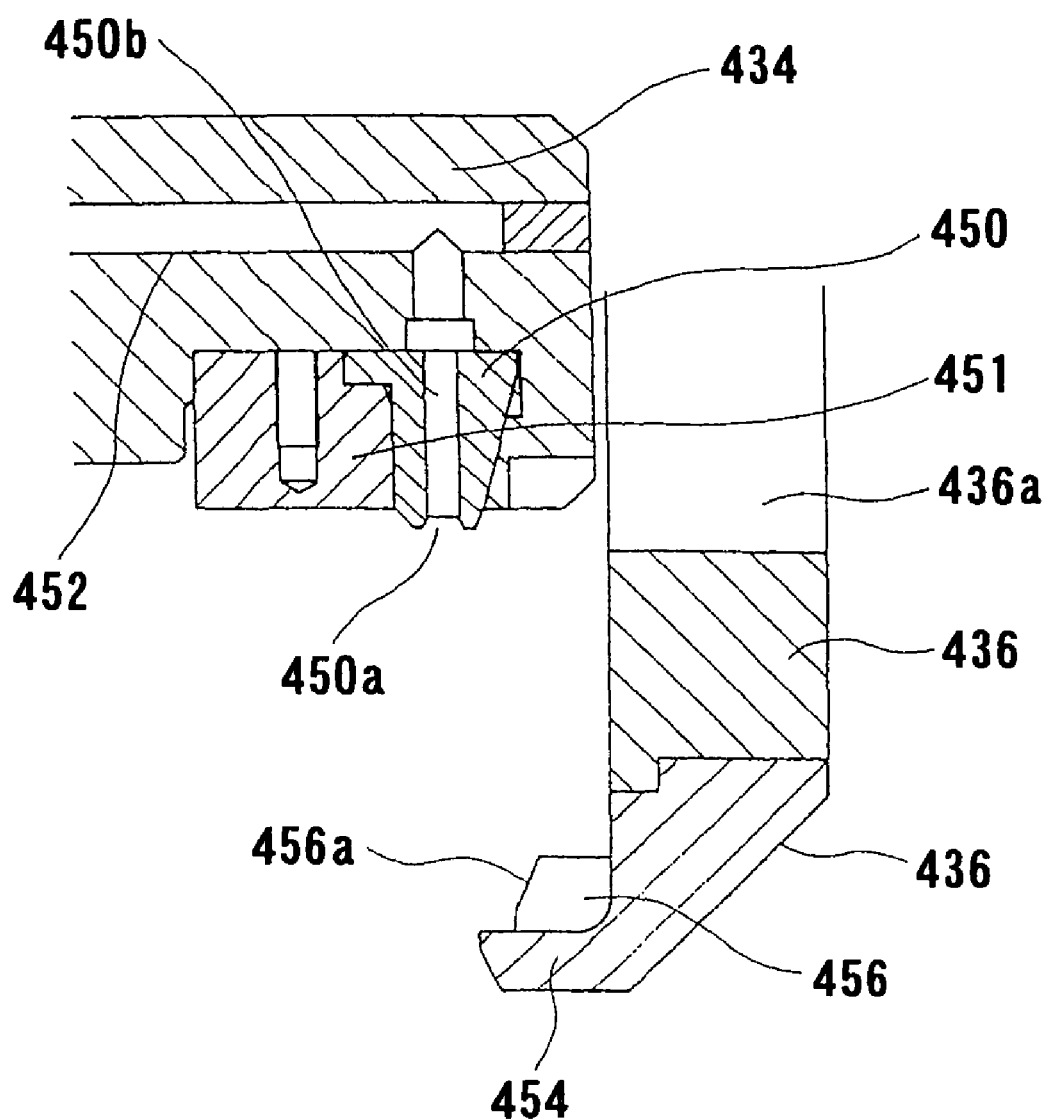
FIG. 24 is an enlarged view of B portion of FIG. 23.
Figure 25:
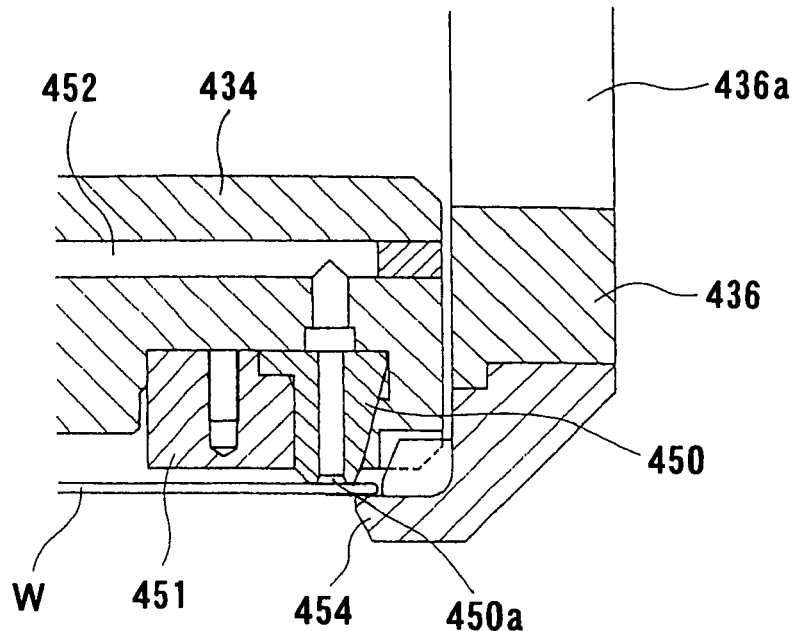
FIG. 25 is a view corresponding to FIG. 24 showing the substrate head at the time of substrate fixing.
Figure 26:
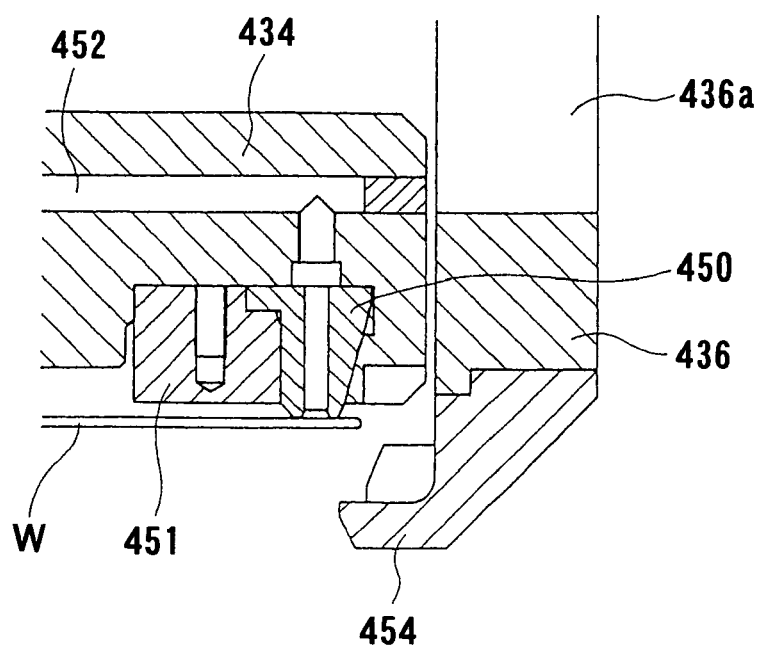
FIG. 26 is a view corresponding to FIG. 24 showing the substrate head at the time of plating process.

As shown in detail in FIGS. 24 through 26, a suction ring 450 for attracting and holding a substrate W against its lower surface to be sealed is mounted on a lower circumferential edge of the suction head 434 by a presser ring 451. The suction ring 450 has a recess 450a continuously defined in a lower surface thereof in a circumferential direction and in communication with a vacuum line 452 extending through the suction head 434 by a communication hole 450b that is defined in the suction ring 450. When the recess 450a is evacuated, the substrate W is attracted to and held by the suction ring 450. Because the substrate W is attracted under vacuum to the suction ring 450 along a radially narrow circumferential area provided by the recess 450a, any adverse effects such as flexing caused by the vacuum on the substrate W are minimized. When the suction ring 450 is dipped in the plating solution (treatment liquid), not only the surface (lower surface) of the substrate W, but also its circumferential edge, can be dipped in the plating solution. The substrate W is released from the suction ring 450 by introducing $N_2$ into the vacuum line 452.

The substrate receiver 436 is in the form of a downwardly open, hollow bottomed cylinder having substrate insertion windows 436a defined in a circumferential wall thereof for inserting therethrough the substrate W into the substrate receiver 436. The substrate receiver 436 also has an annular ledge 454 projecting inwardly from its lower end, and an annular protrusion 456 disposed on an upper surface of the annular ledge 454 and having a tapered inner circumferential surface 456a for guiding the substrate W.

As shown in FIG. 24, when the substrate receiver 436 is lowered, the substrate W is inserted through the substrate insertion window 436a into the substrate receiver 436. The substrate W thus inserted is guided by the tapered surface 456a of the protrusion 456 and positioned thereby onto the upper surface of the ledge 454 in a predetermined position thereon. The substrate receiver 436 is then elevated until it brings the upper surface of the substrate W placed on the ledge 454 into abutment against the suction ring 450 of the suction head 434, as shown in FIG. 25. Then, the recess 450a in the vacuum ring 450 is evacuated through the vacuum line 452 to attract the substrate W while sealing the upper peripheral edge surface of the substrate W against the lower surface of the suction ring 450. In order to plate the substrate W, as shown in FIG. 26, the substrate receiver 436 is lowered several mm to space the substrate W from the ledge 454, keeping the substrate W attracted only by the suction ring 450. The substrate W now has its lower peripheral edge surface prevented from not being plated because it is held out of contact with the ledge 454.

Figure 27:
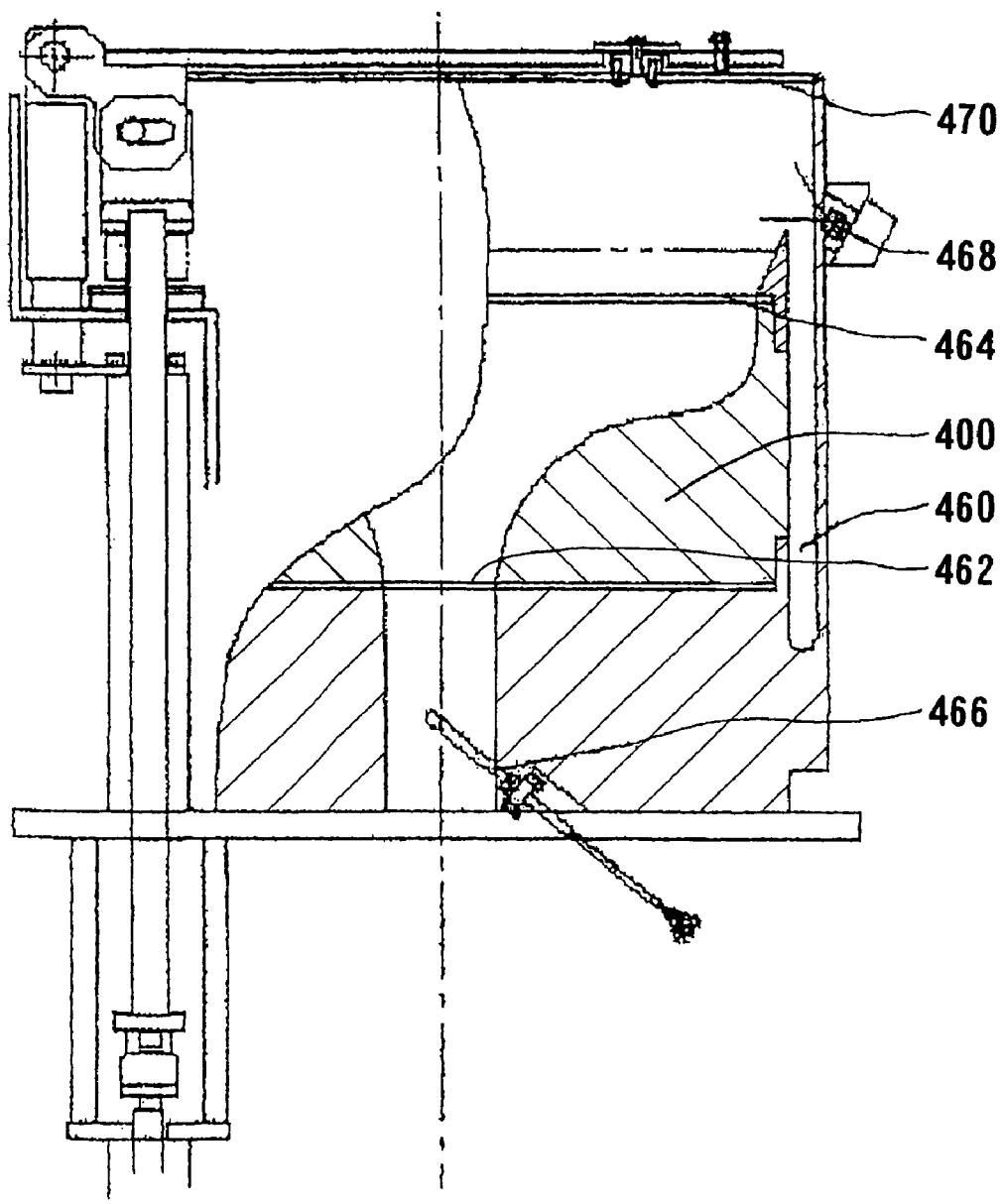
FIG. 27 is a front view with partially cross-section showing a plating tank of the pretreatment apparatus shown in FIG. 5 when a plating tank cover is closed.

FIG. 27 shows the details of the plating tank 400. The plating tank 400 is connected at the bottom to a plating solution supply pipe 1308 (see FIG. 29), and is provided in the peripheral wall with a plating solution recovery groove 460. In the plating tank 400, there are disposed two current plates 462, 464 for stabilizing the flow of a plating solution flowing upward. A thermometer 466 for measuring the temperature of the plating solution introduced into the plating tank 400 is disposed at the bottom of the plating tank 400. Further, on the outer surface of the peripheral wall of the plating tank 400 and at a position slightly higher than the liquid level of the plating solution held in the plating tank 400, there is provided a jet nozzle 468 for jetting a stop liquid which is a neutral liquid having a pH of 6 to 7.5, for example, pure water, inwardly and slightly upwardly in the normal direction. After plating, the substrate W held in the head portion 432 is raised and stopped at a position slightly above the surface of the plating solution. In this state, pure water (stop liquid) is immediately jetted from the jet nozzle 468 toward the substrate W to cool the substrate W, thereby preventing progress of plating by the plating solution remaining on the substrate W.

Further, at the top opening of the plating tank 400, there is provided a plating tank cover 470 capable of opening and closing for closing the top opening of the plating tank 400 in a non-plating time, such as idling time, so as to prevent unnecessary evaporation of the plating solution from the plating tank 400.

As shown in FIG. 29, a plating solution supply pipe 1308 extending from a plating solution storage tank 1302 and having a plating solution supply pump 1304 and a three-way valve 1306 is connected to the plating tank 400 at the bottom of the plating tank 400. With this arrangement, during a plating process, a plating solution is supplied into the plating tank 400 from the bottom of the plating tank 400, and the overflowing plating solution is recovered by the plating solution storage tank 1302 through the plating solution recovery groove 460. Thus, the plating solution can be circulated. A plating solution return pipe 1312 for returning the plating solution to the plating solution storage tank 1302 is connected to one of the ports of the three-way valve 1306. Thus, the plating solution can be circulated even in a standby condition of plating, and a plating solution circulating system is constructed. As described above, the plating solution in the plating solution storage tank 1302 is always circulated through the plating solution circulating system, and hence a lowering rate of the concentration of the plating solution can be reduced and the number of the substrates W, which can be processed, can be increased, compared with the case in which the plating solution is simply stored.

Particularly, in this embodiment, by controlling the plating solution supply pump 1304, the flow rate of the plating solution which is circulated at a standby of plating or at a plating process can be set individually. Specifically, the amount of circulating plating solution at the standby of plating is in the range of 2 to 20 litter/minute, for example, and the amount of circulating plating solution at the plating process is in the range of 0 to 10 litter/minute, for example. With this arrangement, a large amount of circulating plating solution at the standby of plating can be ensured to keep a temperature of the plating bath in the cell constant, and the flow rate of the circulating plating solution is made smaller at the plating process to form a protective film (plated film) having a more uniform thickness.

The thermometer 466 provided in the vicinity of the bottom of the plating tank 400 measures a temperature of the plating solution introduced into the plating tank 400, and controls a heater 1316 and a flow meter 1318 described below.

Specifically, in this embodiment, there are provided a heating device 1322 for heating the plating solution indirectly by a heat exchanger 1320 which is provided in the plating solution in the plating solution storage tank 1302 and uses water as a heating medium which has been heated by a separate heater 1316 and has passed through the flow meter 1318, and a stirring pump 1324 for mixing the plating solution by circulating the plating solution in the plating solution storage tank 1302. This is because in the plating, in some cases, the plating solution is used at a high temperature (about 80° C.), and the structure should cope with such cases. This method can prevent very delicate plating solution from being mixed with foreign matter or the like unlike an in-line heating method.

Figure 28:
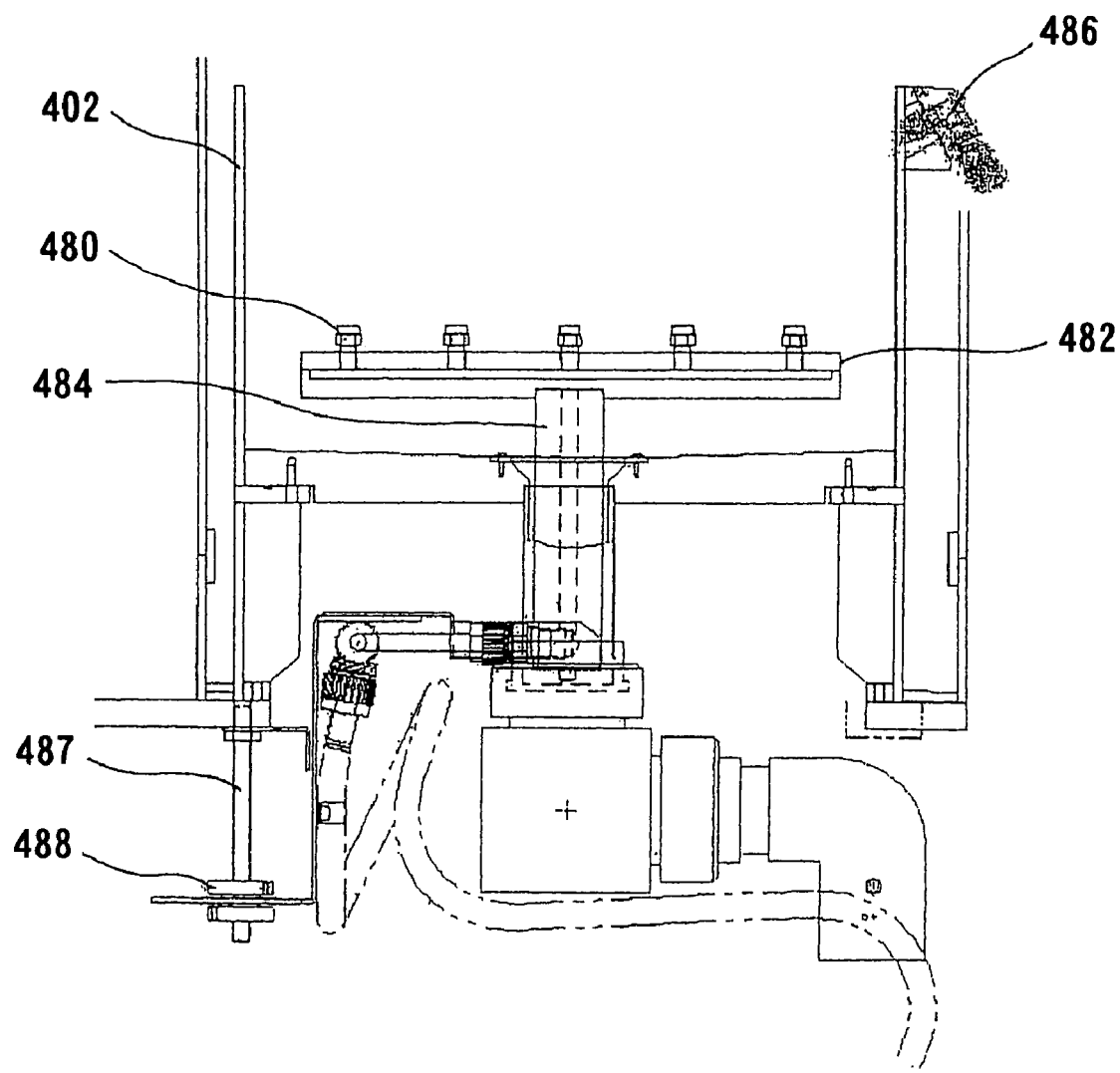
FIG. 28 is a cross-sectional view of a cleaning tank of the pretreatment apparatus shown in FIG. 5.

FIG. 28 shows the details of a cleaning tank 402 provided beside the plating tank 400. At the bottom of the cleaning tank 402, there is provided a nozzle plate 482 having a plurality of jet nozzles 480, attached thereto, for upwardly jetting a rinsing liquid such as pure water. The nozzle plate 482 is coupled to an upper end of a nozzle lifting shaft 484. The nozzle lifting shaft 484 can be moved vertically by changing the position of engagement between a nozzle position adjustment screw 487 and a nut 488 engaging the screw 487 so as to optimize the distance between the jet nozzles 480 and a substrate W located above the jet nozzles 480.

Further, on the outer surface of the peripheral wall of the cleaning tank 402 and at a position above the jet nozzles 480, there is provided a head cleaning nozzle 486 for jetting a cleaning liquid, such as pure water, inwardly and slightly downwardly onto at least a portion, which was in contact with the plating solution, of the head portion 432 of the substrate head 404.

In operating the cleaning tank 402, the substrate W held in the head portion 432 of the substrate head 404 is located at a predetermined position in the cleaning tank 402. A cleaning liquid (rinsing liquid), such as pure water, is jetted from the jet nozzles 480 to clean (rinse) the substrate W, and at the same time, a cleaning liquid such as pure water is jetted from the head cleaning nozzle 486 to clean at least a portion, which was in contact with the plating solution, of the head portion 432 of the substrate head 404, thereby preventing a deposit from accumulating on that portion which was immersed in the plating solution.

According to this electroless plating apparatus 230, when the substrate head 404 is in a raised position, the substrate W is held by vacuum attraction in the head portion 432 of the substrate head 404, as described above, while the plating solution in the plating tank 400 is allowed to circulate.

When plating is performed, the plating tank cover 470 is opened, and the substrate head 404 is lowered, while the substrate head 404 is rotating, so that the substrate W held in the head portion 432 is immersed in the plating solution in the plating tank 400.

After immersing the substrate W in the plating solution for a predetermined time, the substrate head 404 is raised to lift the substrate W from the plating solution in the plating tank 400 and, as needed, pure water (stop liquid) is immediately jetted from the jet nozzle 468 toward the substrate W to cool the substrate W, as described above. The substrate head 404 is further raised to lift the substrate W to a position above the plating tank 400, and the rotation of the substrate head 404 is stopped.

Next, while the substrate W is held by vacuum attraction in the head portion 432 of the substrate head 204, the substrate head 404 is moved to a position right above the cleaning tank 402. While rotating the substrate head 404, the substrate head 404 is lowered to a predetermined position in the cleaning tank 402. A cleaning liquid (rinsing liquid), such as pure water, is jetted from the jet nozzles 480 to clean (rinse) the substrate W, and at the same time, a cleaning liquid such as pure water is jetted from the head cleaning nozzle 486 to clean at least a portion, which was in contact with the plating solution, of the head portion 432 of the substrate head 404.

After completion of cleaning of the substrate W, the rotation of the substrate head 404 is stopped, and the substrate head 404 is raised to lift the substrate W to a position above the cleaning tank 402. Further, the substrate head 404 is moved to the transfer position between the transfer robot 216 and the substrate head 404, and the substrate W is transferred to the transfer robot 216, and is transported to a next process by the transfer robot 216.

As shown in FIG. 29, the electroless plating apparatus 230 is provided with a plating solution management unit 1330 for measuring an amount of the plating solution held in the electroless plating apparatus 230, and analyzing composition of the plating solution by an absorptiometric method, a titration method, an electrochemical measurement, or the like, and replenishing components which are insufficient in the plating solution. In the plating solution management unit 1330, signals indicative of the analysis results are processed to replenish insufficient components from a replenishment tank (not shown) to the plating solution storage tank 1302 using a metering pump, thereby controlling the amount of the plating solution and composition of the plating solution. Thus, thin film plating can be realized in a good reproducibility.

The plating solution management unit 1330 has a dissolved oxygen densitometer 1332 for measuring dissolved oxygen in the plating solution held by the electroless plating apparatus 230 by an electrochemical method, for example. According to the plating solution management unit 1330, dissolved oxygen concentration in the plating solution can be controlled at a constant value on the basis of indication of the dissolved oxygen densitometer 1332 by deaeration, nitrogen blowing, or other methods. In this manner, the dissolved oxygen concentration in the plating solution can be controlled at a constant value, and the plating reaction can be achieved in a good reproducibility.

When the plating solution is used repeatedly, certain components are accumulated by being carried in from the outside or decomposition of the plating solution, resulting in lowering of reproducibility of plating and deteriorating of film quality. By adding a mechanism for removing such specific components selectively, the life of the plating solution can be prolonged and the reproducibility can be improved.

Figure 30:
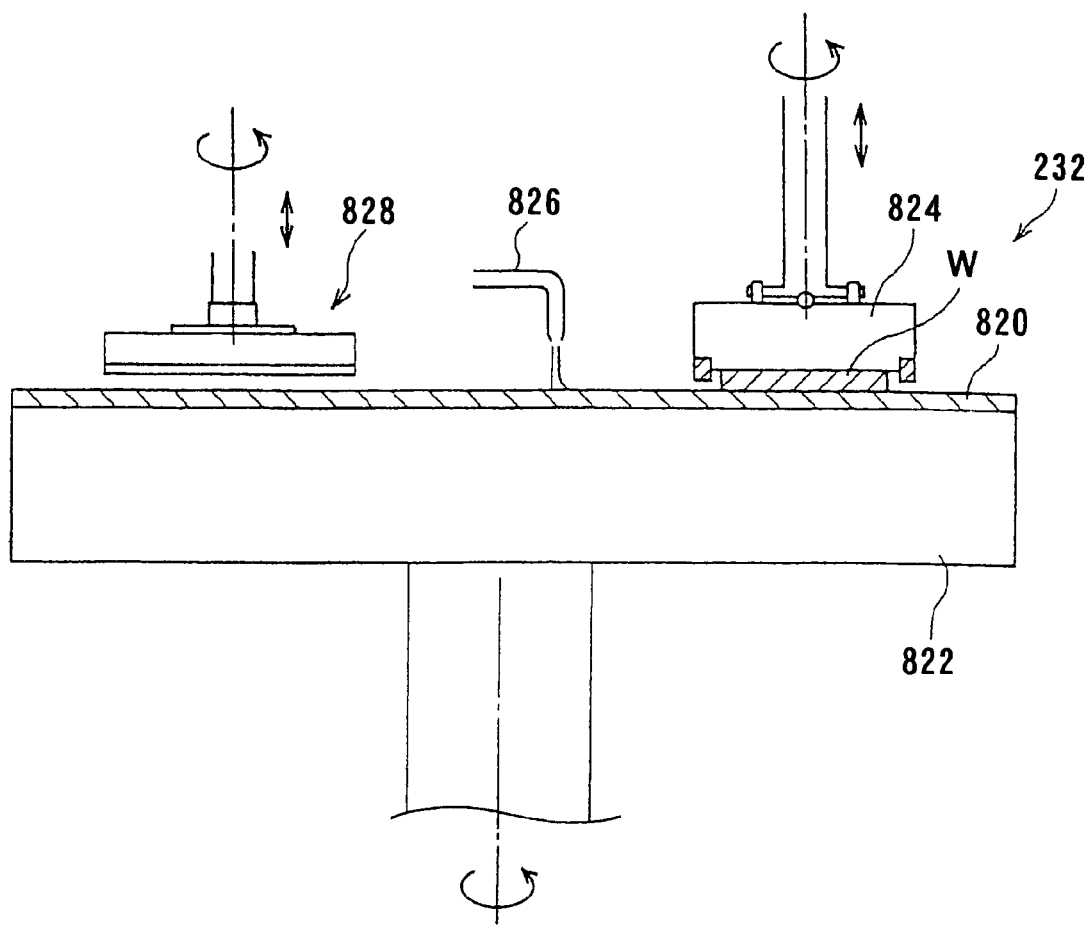
FIG. 30 is a schematic view showing an example of a polishing apparatus shown in FIG. 5.

FIG. 30 shows an example of a polishing apparatus (CMP apparatus) 232. The polishing apparatus 232 comprises a polishing table 822 having a polishing surface composed of a polishing cloth (polishing pad) 820 which is attached to the upper surface of the polishing table 822, and a top ring 824 for holding a substrate W with its to-be-polished surface facing the polishing table 822. In the polishing apparatus 232, the surface of the substrate W is polished by rotating the polishing table 822 and the top ring 824 about their own axes, respectively, and supplying a polishing liquid from a polishing liquid nozzle 826 provided above the polishing table 822 while pressing the substrate W against the polishing cloth 820 of the polishing table 822 at a given pressure by the top ring 824. It is possible to use a fixed abrasive type of pad containing fixed abrasive particles as the polishing pad.

The polishing power of the polishing surface of the polishing cloth 820 decreases with a continuation of a polishing operation of the CMP apparatus 232. In order to restore the polishing power, a dresser 828 is provided to conduct dressing of the polishing cloth 820, for example, at the time of replacing the substrate W. In the dressing, while rotating the dresser 828 and the polishing table 822 respectively, the dressing surface (dressing member) of the dresser 828 is pressed against the polishing cloth 820 of the polishing table 822, thereby removing the polishing liquid and chips adhering to the polishing surface and, at the same time, flattening and dressing the polishing surface, whereby the polishing surface is regenerated. The polishing table 822 may be provided with a monitor for monitoring the surface state of the substrate to detect in situ the end point of polishing, or with a monitor for inspecting in situ the finish state of the substrate.

Figure 31:
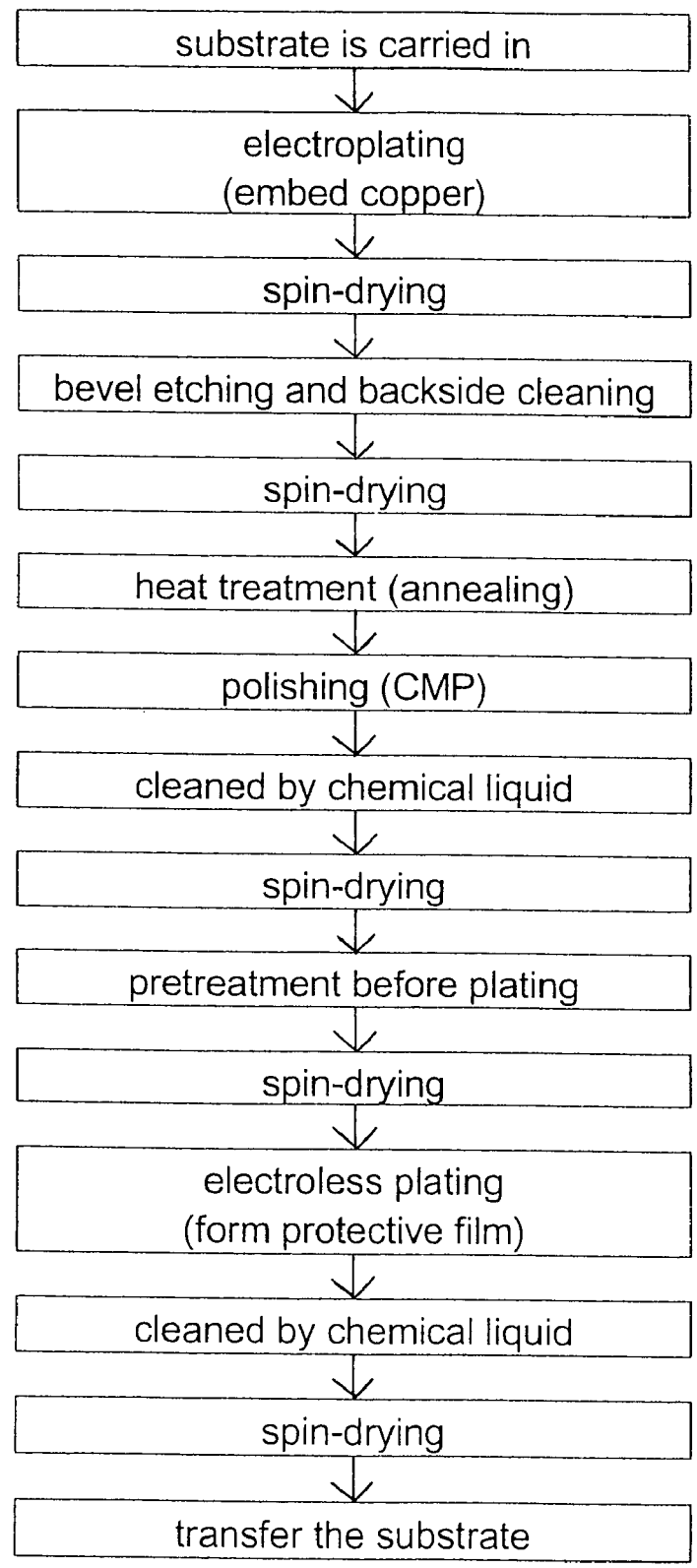
FIG. 31 is a flow chart in a substrate processing apparatus shown in FIG. 5.

A description will now be given of a series of process steps for forming copper interconnects in a substrate, having a seed layer 6 formed in the surface as shown in FIG. 4A, by the substrate processing apparatus having the above construction, by referring also to FIG. 31.

First, substrate W having the seed layer 6 thereon is taken one by one out of the transfer box 210, and the substrate W is carried in the loading/unloading station 214. The substrate W is then reversed, if necessary, and transferred to the plating apparatus 218. In the plating apparatus 218, a copper layer 7 is deposited by plating on the surface of the substrate W, thereby effecting embedding of copper, as shown in FIG. 4B. The plating is carried out under a constant-voltage control or a constant-current control. In the case of constant-voltage control, the current value during plating is monitored, and feeding of electricity is stopped after elapse of a predetermined period of time from a point of time at which the current value becomes constant, thereby stopping plating. In the case of constant-current control, the voltage value during plating is monitored, and feeding of electricity is stopped after elapse of a predetermined period of time from a point of time at which the voltage value becomes constant, thereby stopping plating. Such a manner of controlling the end point of plating makes it possible to obtain the intended plated film with a flat surface without applying an extra plating to the substrate.

Then, the substrate W having the copper layer 7 formed thereon is transferred to the cleaning and drying apparatus 220 by the transfer robot 216, and the substrate W is cleaned by pure water and spin-dried. Alternatively, in a case where a spin-drying function is provided in the plating apparatus 218, the substrate W is spin-dried (removal of liquid) in the plating apparatus 218. The dried substrate is then transferred to the bevel etching and backside cleaning apparatus 222.

In the bevel etching and backside cleaning apparatus 222, unnecessary copper attached to the bevel (edge) portion of the substrate W is removed by etching, and at the same time, the backside surface of the substrate is cleaned by pure water or the like. Thereafter, as described above, the substrate W is transferred to the cleaning and drying apparatus 220 by the transfer robot 216, and the substrate W is cleaned by pure water and spin-dried. Alternatively, in a case where a spin-drying function is provided in the bevel etching and backside cleaning apparatus 222, the substrate W is spin-dried in the bevel etching and backside cleaning apparatus 222. The dried substrate is then transferred to the heat treatment apparatus 226 by the transfer robot 216.

In the heat treatment apparatus 226, heat treatment (annealing) of the substrate W is carried out. The heat-treated substrate is then transferred to the polishing apparatus 232 by the transfer robot 216.

As shown in FIG. 4C, unnecessary copper layer 7 and the seed layer 6 deposited on the surface of the substrate W are polished and removed by the polishing apparatus 232 to planarize the surface of the substrate W. At this time, for example, the film thickness and the finishing state of the substrate are inspected by a monitor, and when an end point is detected by the monitor, polishing is finished. Then, the substrate W which has been polished is transferred to the cleaning and drying apparatus 220 by the transfer robot 216, and the surface of the substrate is cleaned by a chemical liquid and then cleaned (rinsed) with pure water, and then spin-dried by rotating the substrate at a high speed in the cleaning and drying apparatus 220. After this spin-drying, the substrate W is transferred to the pretreatment apparatus 228 by the transfer robot 216.

In the pretreatment apparatus 228, a pretreatment before plating comprising at least one of attachment of Pd catalyst to the surface of the substrate and removal of oxide film attached to the exposed surface of the substrate, for example, is carried out. Then, the substrate after this pretreatment, as described above, is transferred to the cleaning and drying apparatus 220 by the transfer robot 216, and the substrate W is cleaned by pure water and spin-dried. Alternatively, in a case where a spin-drying function is provided in the pretreatment apparatus 228, the substrate W is spin-dried (removal of liquid) in the pretreatment apparatus 228. The dried substrate is then transferred to the electroless plating apparatus 230 by the transfer robot 216.

In the electroless plating apparatus 230, as shown in FIG. 4D, for example, electroless CoWP plating is applied to the surfaces of the exposed interconnects 8 to form a protective film (plated film) 9 composed of CoWP alloy selectively on the exposed surfaces of the interconnects 8, thereby protecting the interconnects 8. The thickness of the protective film 9 is in the range of 0.1 to 500 nm, preferably in the range of 1 to 200 nm, more preferably in the range of 10 to 100 nm. At this time, for example, the thickness of the protective film 9 is monitored, and when the film thickness reaches a predetermined value, i.e., an end point is detected, the electroless plating is finished.

After the electroless plating, the substrate W is transferred to the cleaning and drying apparatus 220 by the transfer robot 216, and the surface of the substrate is cleaned by a chemical liquid, and cleaned (rinsed) with pure water, and then spin-dried by rotating the substrate at a high speed in the cleaning and drying apparatus 220. After the spin-drying, the substrate W is returned into the transfer box 210 via the loading/unloading station 214 by the transfer robot 216.

According to this embodiment, copper is used as a interconnect material. Besides copper, a copper alloy, silver, or a silver alloy, or the like may be used as a interconnect material.

According to the present invention, the so-called flattening plating can be carried out securely until completion of a plated film having a flat surface. Further, the present invention can avoid application of an extra plating to a substrate, thereby reducing the material cost and also reducing the cost and the technical burden of a later polishing process. In addition, the present invention can eliminate the need for a costly mechanism, such as a film-thickness monitor, thus lowering the cost of the plating apparatus.

Figure 32:
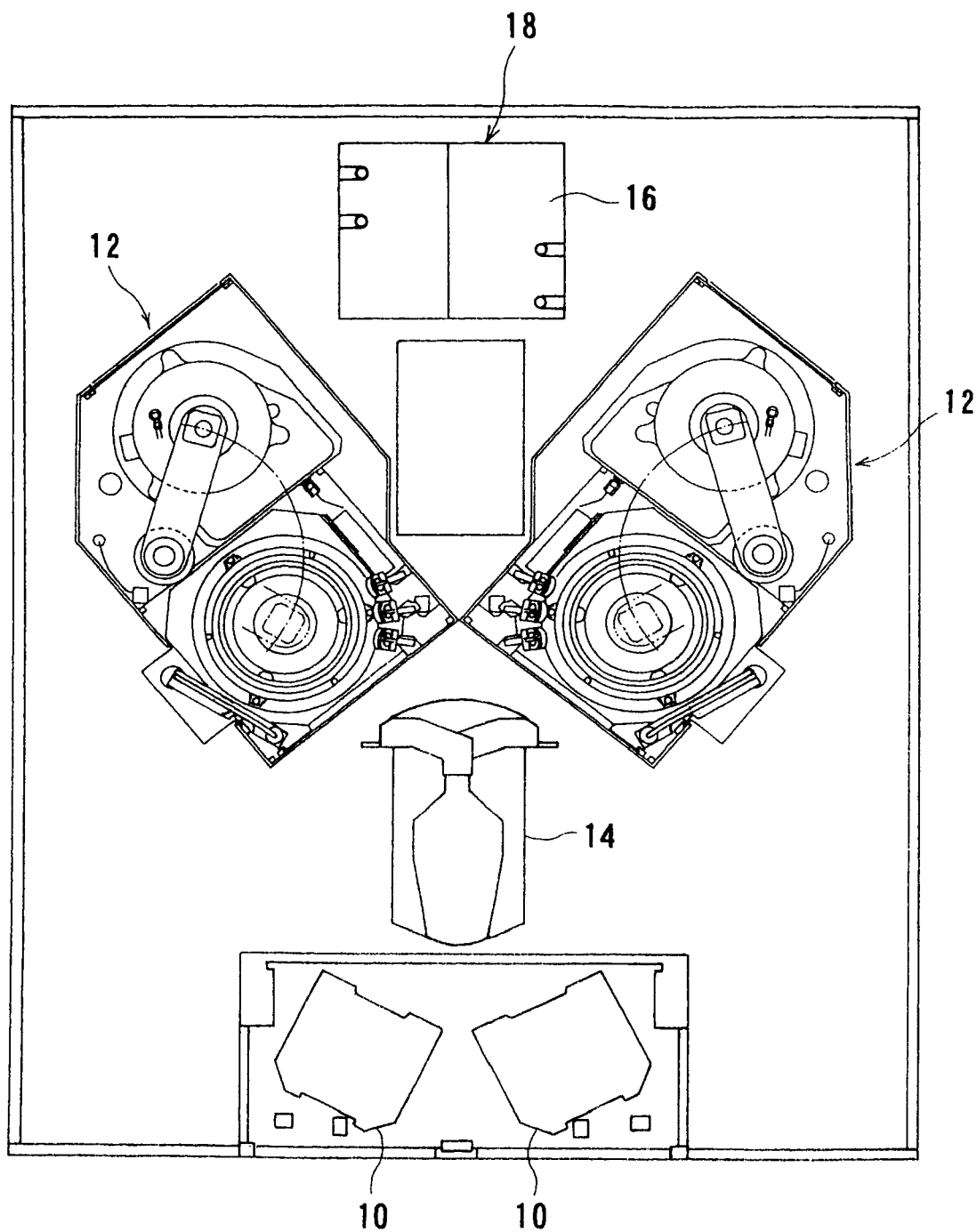
FIG. 32 is an overall plan view of a substrate processing apparatus provided with a plating apparatus according to still another embodiment of the present invention.

FIG. 32 is a plan view showing a substrate processing apparatus incorporating a plating apparatus according to the present invention. As shown in FIG. 32, this substrate processing apparatus has a apparatus frame which houses therein two loading/unloading units 10 for housing a plurality of substrates W therein, two plating apparatuses 12 for performing plating process, a transfer robot 14 for transferring substrates W between the loading/unloading units 10 and the plating apparatuses 12, and plating solution supply equipment 18 having a plating solution tank 16.

Figure 33:
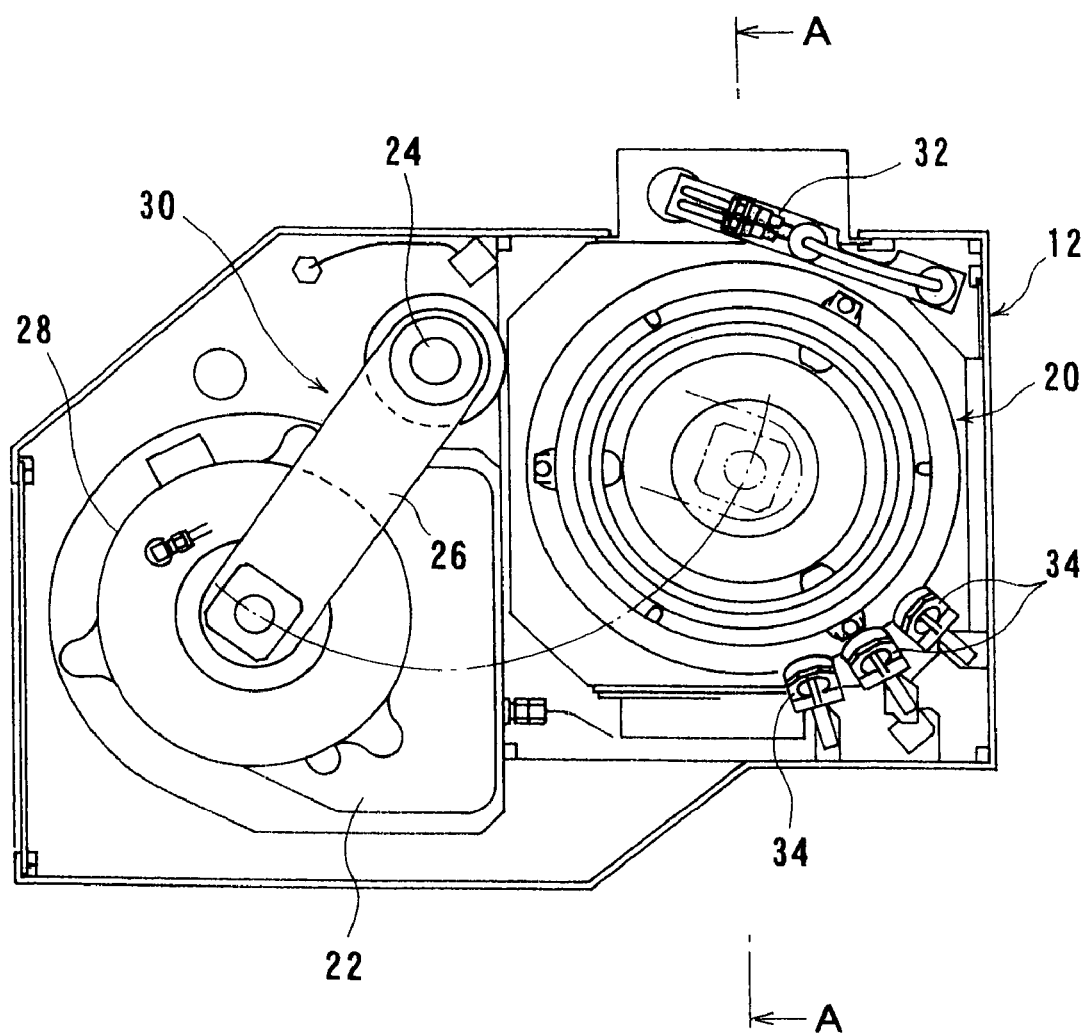
FIG. 33 is a plan view of the plating apparatus shown in FIG. 32.

The plating apparatus 12, as shown in FIG. 33, is provided with a substrate processing section 20 for performing plating process and processing incidental thereto, and a plating solution tray 22 for storing a plating solution is disposed adjacent to the substrate processing section 20. There is also provided an electrode arm portion 30 having an electrode head 28 which is held at a front end of a pivot arm 26 swingable about a rotating shaft 24, and which is swung between the substrate processing section 20 and the plating solution tray 22. Furthermore, a pre-coating/recovering arm 32, and fixed nozzles 34 for ejecting pure water or a chemical liquid such as ion water, and also a gas or the like toward a substrate are disposed laterally of the substrate processing section 20. In this embodiment, three of the fixed nozzles 34 are disposed, and one of them is used for supplying pure water.

Figure 34:
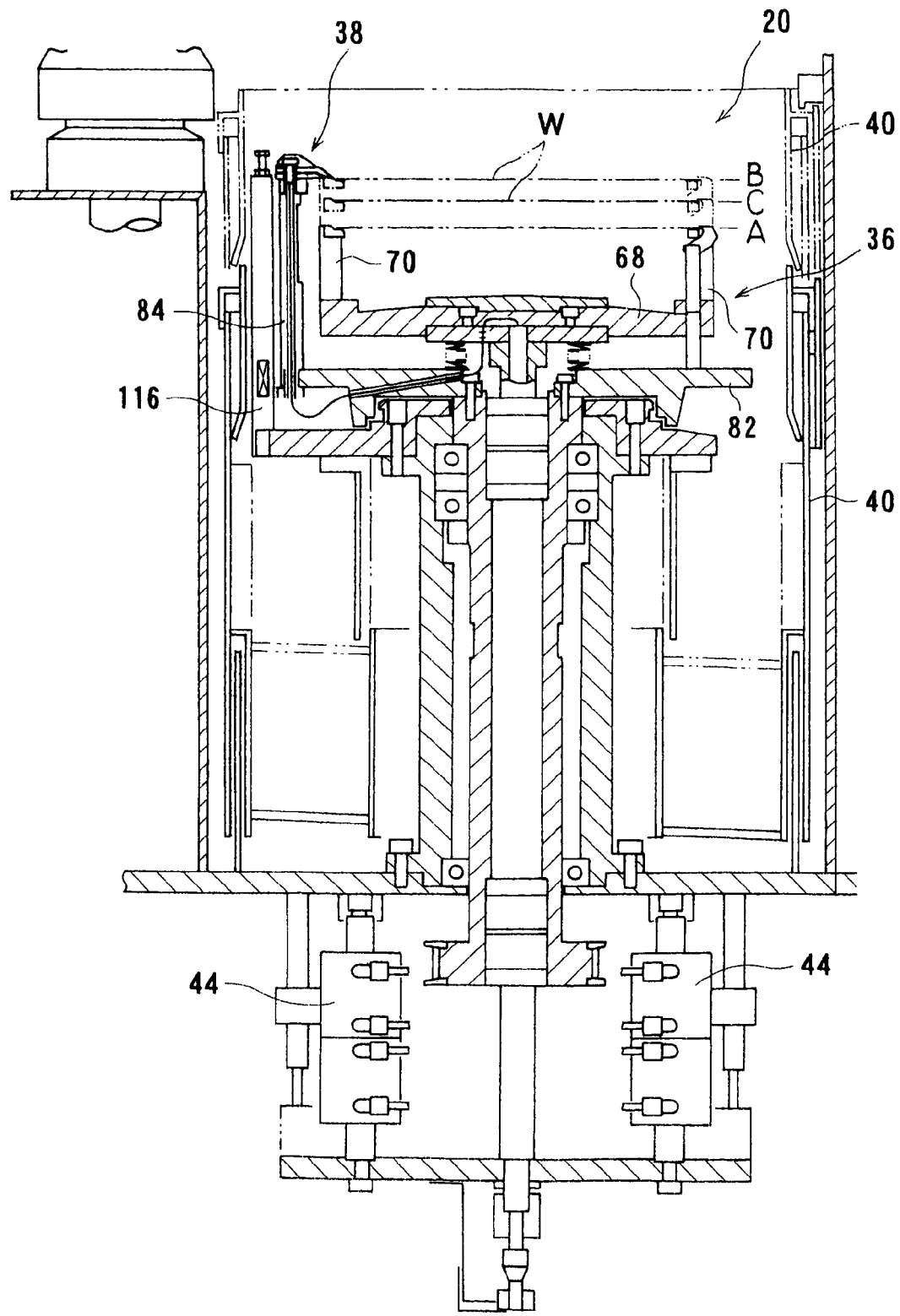
FIG. 34 is an enlarged sectional view of the substrate holder and the electrode portion of the plating apparatus shown in FIG. 32.

The substrate processing section 20, as shown in FIG. 34, has a substrate holder 36 for holding a substrate W with its surface (surface to be plated) facing upwardly, and a cathode section 38 located above the substrate holder 36 so as to surround a peripheral portion of the substrate holder 36. Further, a substantially cylindrical bottomed cup 40 surrounding a periphery of the substrate holder 36, for preventing scatter of various chemical liquids used during processing, is provided so as to be vertically movable by an air cylinder (not shown).

The substrate holder 36 is adapted to be raised and lowered by the air cylinder 44 to and from a lower substrate transfer position A, an upper plating position B, and a pretreatment/cleaning position C that is intermediate these positions A and B. The substrate holder 36 is also adapted to rotate, at an arbitrary acceleration and an arbitrary velocity, integrally with the cathode section 38 by a rotating motor and a belt (not shown). Substrate carry-in and carry-out openings (not shown) are provided in confrontation with substrate transfer position A in a side panel of the plating apparatus 12 facing the transfer robot 14. When the substrate holder 36 is raised to plating position B, a seal member 90 and cathode electrodes 88 (to be described below) of the cathode section 38 are brought into contact with a peripheral portion of substrate W held by the substrate holder 36. On the other hand, the cup 40 has an upper end located below the substrate carry-in and carry-out openings, and when the cup 40 ascends, the upper end of the cup 40 reaches a position above the cathode section 38 closing the substrate carry-in and carry-out openings, as shown by imaginary lines in FIG. 34.

The plating solution tray 22 serves to wet a below-described high resistance structure 110 and an anode 98 of the electrode arm portion 30 with a plating solution, when plating has not been performed. The plating solution tray 22 is set at a size in which the high resistance structure 110 can be accommodated, and the plating solution tray 22 has a plating solution supply port and a plating solution drainage port (not shown). A photo-sensor is attached to the plating solution tray 22, and can detect brimming with the plating solution in the plating solution tray 22, i.e., overflow, and drainage.

The electrode arm portion 30 is vertically movable by a vertical movement motor 132, which is a servomotor, and a ball screw 134, and swingable between the plating solution tray 22 and the substrate processing section 20 by a swing motor, in this embodiment, as described bellow. A pneumatic actuator may be used.

Figure 35:
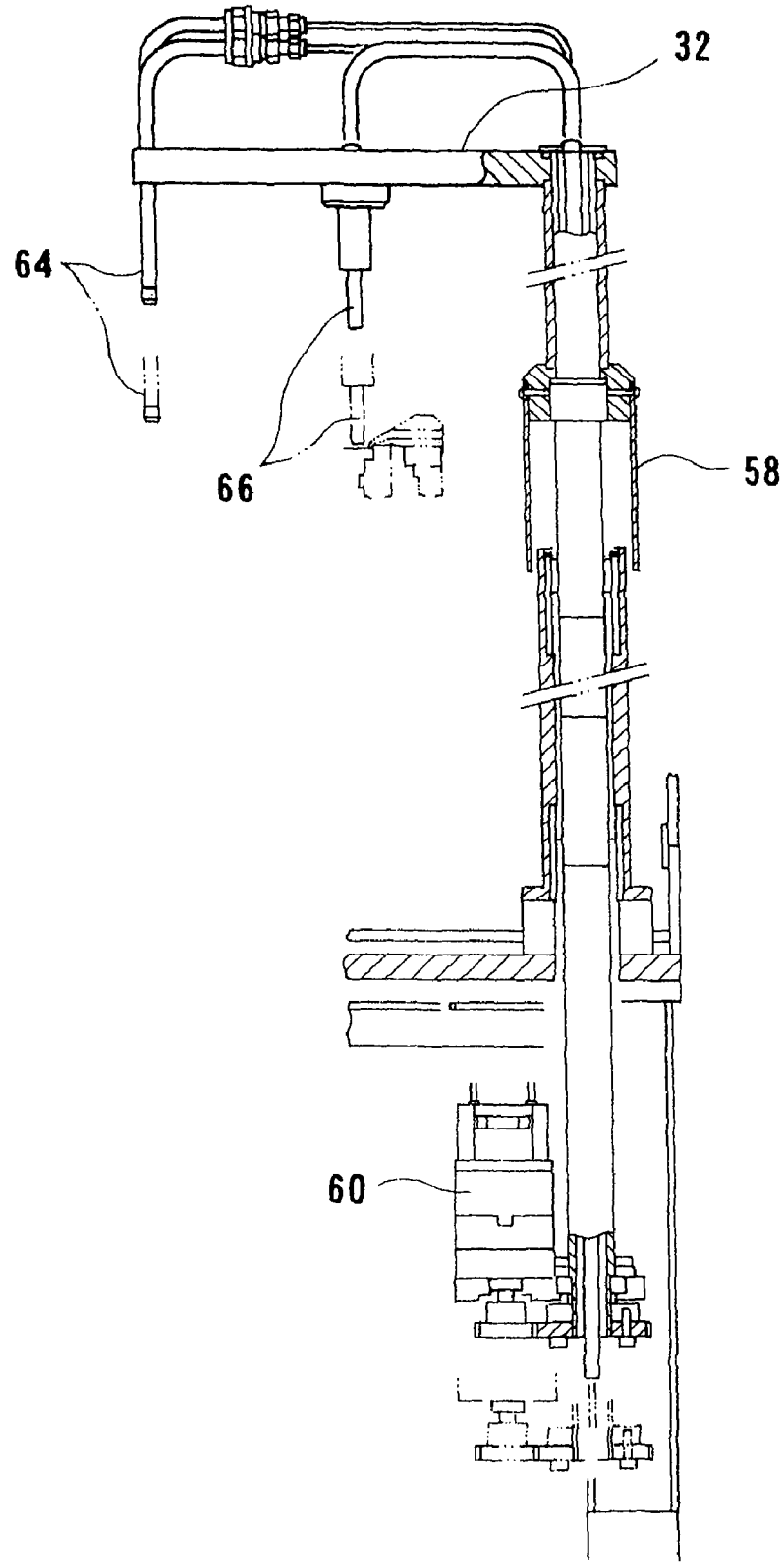
FIG. 35 is a front view of the pre-coating/recovering arm of the plating apparatus shown in FIG. 32.

As shown in FIG. 35, the pre-coating/recovering arm 32 is coupled to an upper end of a vertical support shaft 58. The pre-coating/recovering arm 32 is swingable by a rotary actuator 60 and is also vertically moveable by an air cylinder (not shown). The pre-coating/recovering arm 32 supports a pre-coating nozzle 64, for discharging a pre-coating liquid, on its free end side, and a plating solution recovering nozzle 66, for recovering the plating solution, on a portion closer to its proximal end. The pre-coating nozzle 64 is connected to a syringe that is actuatable by an air cylinder, for example, for intermittently discharging a pre-coating liquid from the pre-coating nozzle 64. The plating solution recovering nozzle 66 is connected to a cylinder pump or an aspirator, for example, to draw the plating solution on the substrate from the plating solution recovering nozzle 66.

Figure 36:
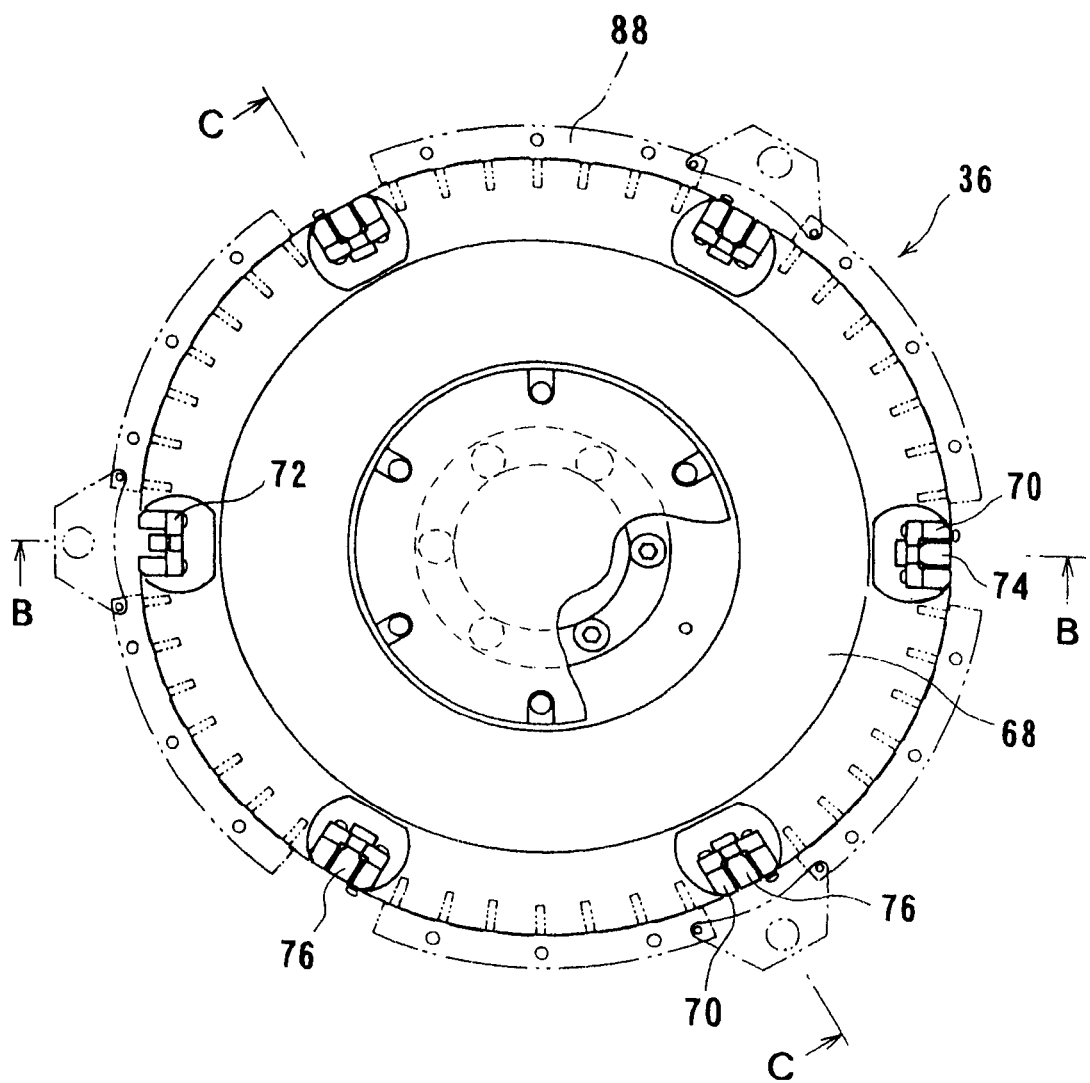
FIG. 36 is a plan view of the substrate holder of the plating apparatus shown in FIG. 32.
Figure 37:
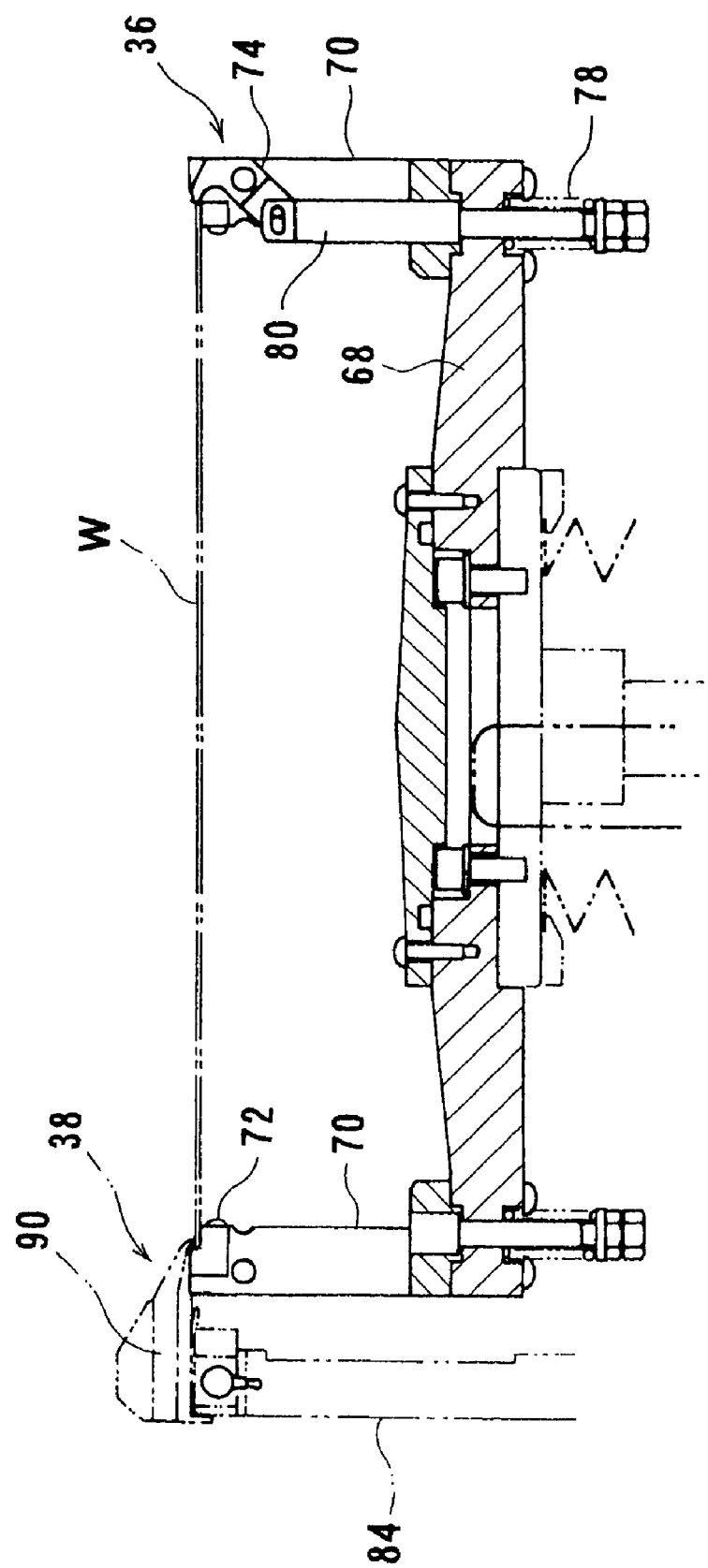
FIG. 37 is a cross-sectional view taken along the line B-B of FIG. 36.
Figure 38:
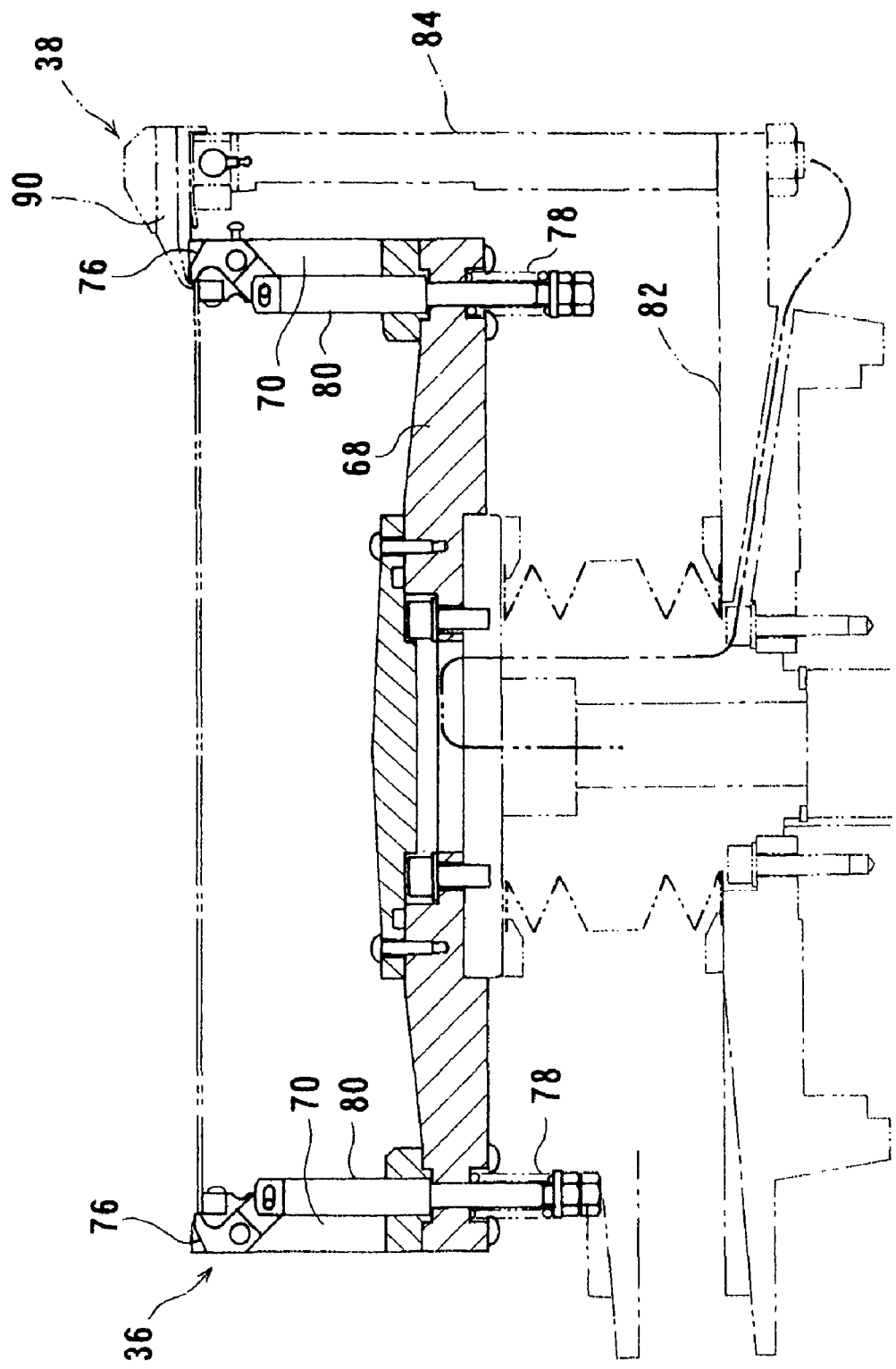
FIG. 38 is a cross-sectional view taken along the line C-C of FIG. 36.

As shown in FIGS. 36 through 38, the substrate holder 36 has a disk-shaped substrate stage 68 and six vertical support arms 70 disposed at spaced intervals on the circumferential edge of the substrate stage 68 for holding a substrate W in a horizontal plane on respective upper surfaces of the support arms 70. A positioning plate 72 is mounted on an upper end one of the support arms 70 for positioning the substrate by contacting the end face of the substrate. A pressing finger 74 is rotatably mounted on an upper end of the support arm 70, which is positioned opposite to the support arm 70 having the positioning plate 72, for abutting against an end face of the substrate W and pressing the substrate W to the positioning plate 72 when rotated. Chucking fingers 76 are rotatably mounted on upper ends of the remaining four support arms 70 for pressing the substrate W downwardly and gripping the circumferential edge of the substrate W.

The pressing finger 74 and the chucking fingers 76 have respective lower ends coupled to upper ends of pressing pins 80 that are normally urged to move downwardly by coil springs 78. When the pressing pins 80 are moved downwardly, the pressing finger 74 and the chucking fingers 76 are rotated radially inwardly into a closed position. A support plate 82 is disposed below the substrate stage 68 for engaging lower ends of the opening pins 80 and pushing them upwardly.

When the substrate holder 36 is located in substrate transfer position A shown in FIG. 34, the pressing pins 80 are engaged and pushed upwardly by the support plate 82, so that the pressing finger 74 and the chucking fingers 76 rotate outwardly and open. When the substrate stage 68 is elevated, the opening pins 80 are lowered under the resiliency of the coil springs 78, so that the pressing finger 74 and the chucking fingers 76 rotate inwardly and close.

Figure 39:
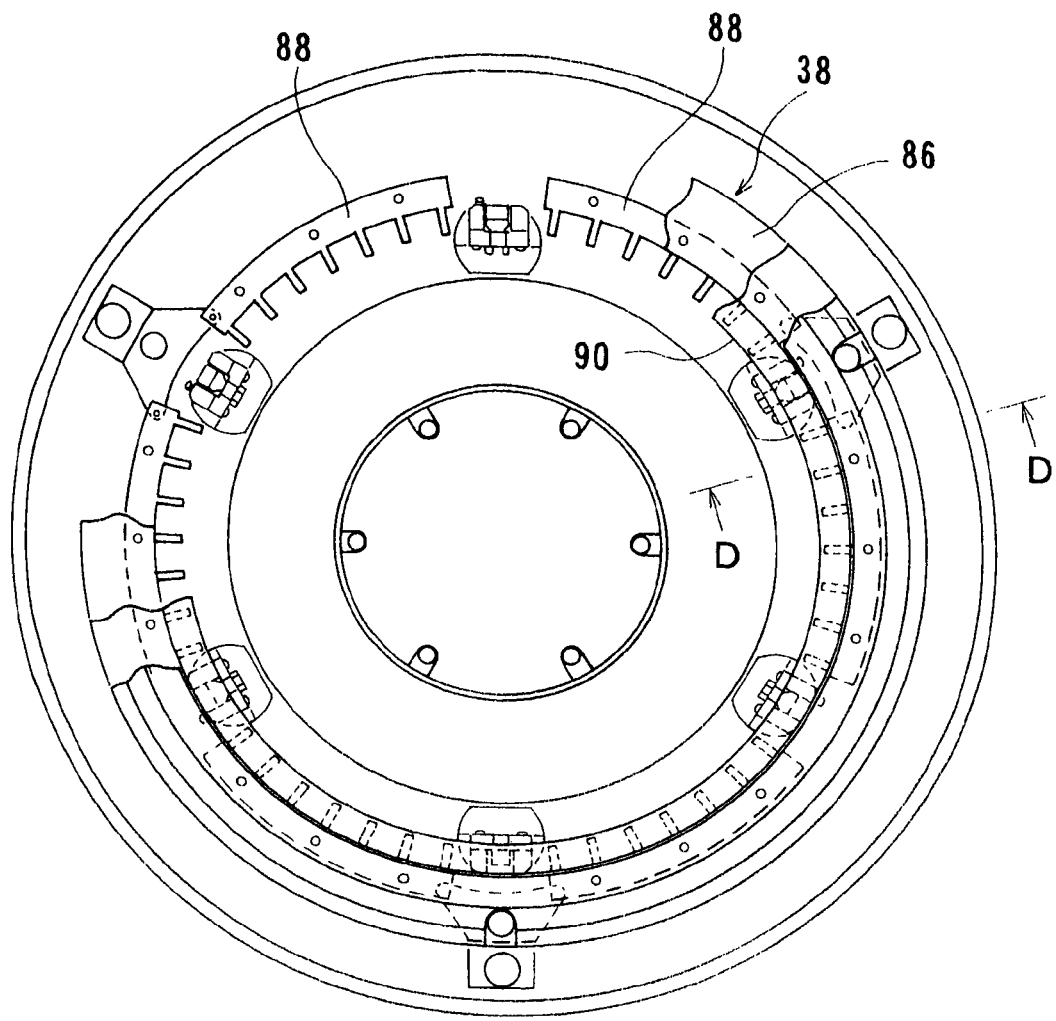
FIG. 39 is a plan view of the electrode portion of the plating apparatus shown in FIG. 32.
Figure 40:
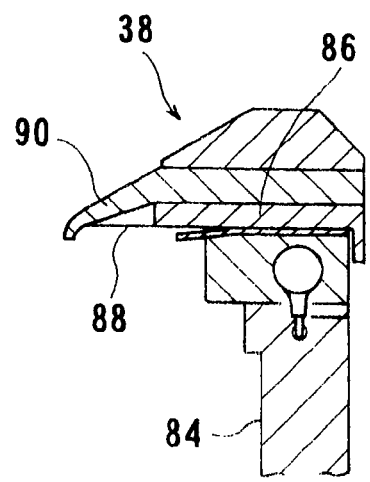
FIG. 40 is a cross-sectional view taken along the line D-D of FIG. 39.

As shown in FIGS. 39 and 40, the cathode section 38 comprises an annular frame 86 fixed to upper ends of vertical support columns 84 mounted on the peripheral portion of the support plate 82 (see FIG. 38), a plurality of, six in this embodiment, cathode electrodes 88 attached to a lower surface of the annular frame 86 and projecting inwardly, and an annular seal member 90 mounted on an upper surface of the annular frame 86 in covering relation to upper surfaces of the cathode electrodes 88. The seal member 90 is adapted to have an inner peripheral edge portion inclined inwardly downwardly and progressively thin-walled, and to have an inner peripheral end suspending downwardly.

Figure 43:
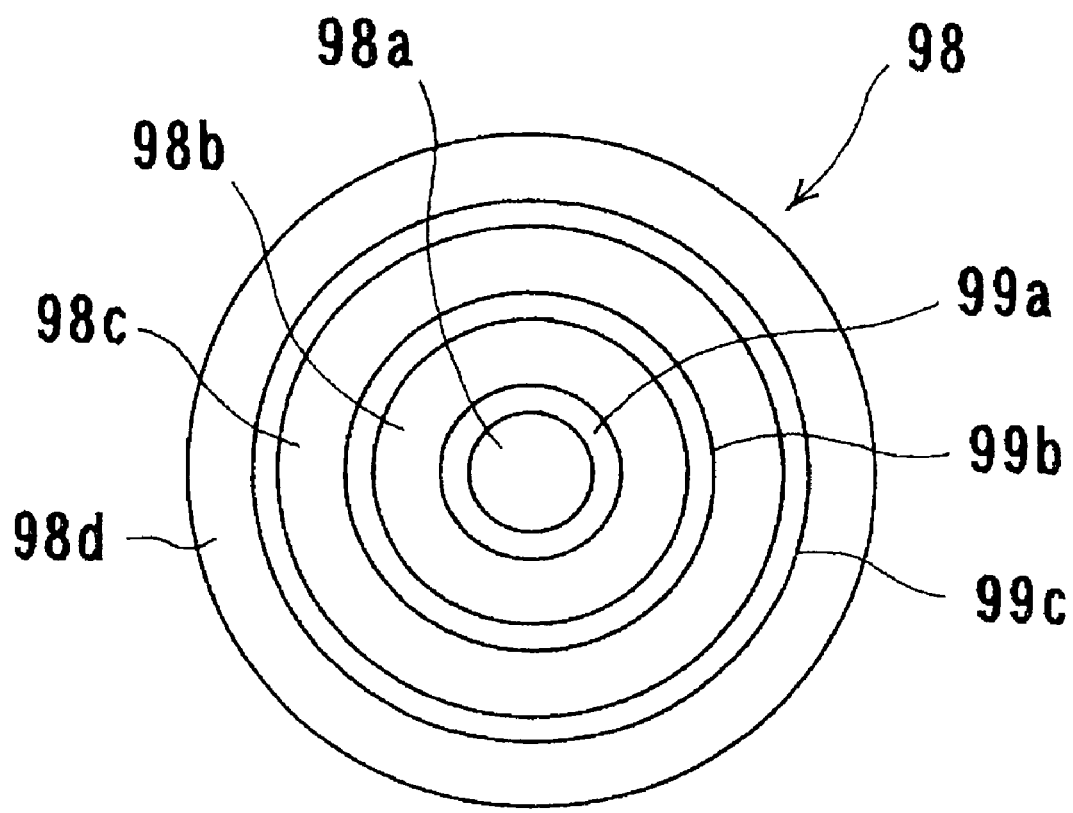
FIG. 43 is a plan view of an anode of the plating apparatus shown in FIG. 32.

When the substrate holder 36 has ascended to plating position B, as shown FIG. 43, the cathode electrodes 88 are pressed against the peripheral portion of the substrate W held by the substrate holder 36 for thereby allowing electric current to pass through the substrate W. At the same time, an inner peripheral end portion of the seal member 90 is brought into contact with an upper surface of the peripheral portion of the substrate W under pressure to seal its contact portion in a watertight manner. As a result, the plating solution supplied onto the upper surface (surface to be plated) of the substrate W is prevented from seeping from an end portion of the substrate W, and the plating solution is prevented from contaminating the cathode electrodes 88.

In the present embodiment, the cathode section 38 is vertically immovable, but rotatable with the substrate holder 36. However, the cathode section 38 may be arranged such that it is vertically movable and the seal member 90 is pressed against the surface, to be plated, of the substrate W when the cathode section 38 is lowered.

Figure 41:
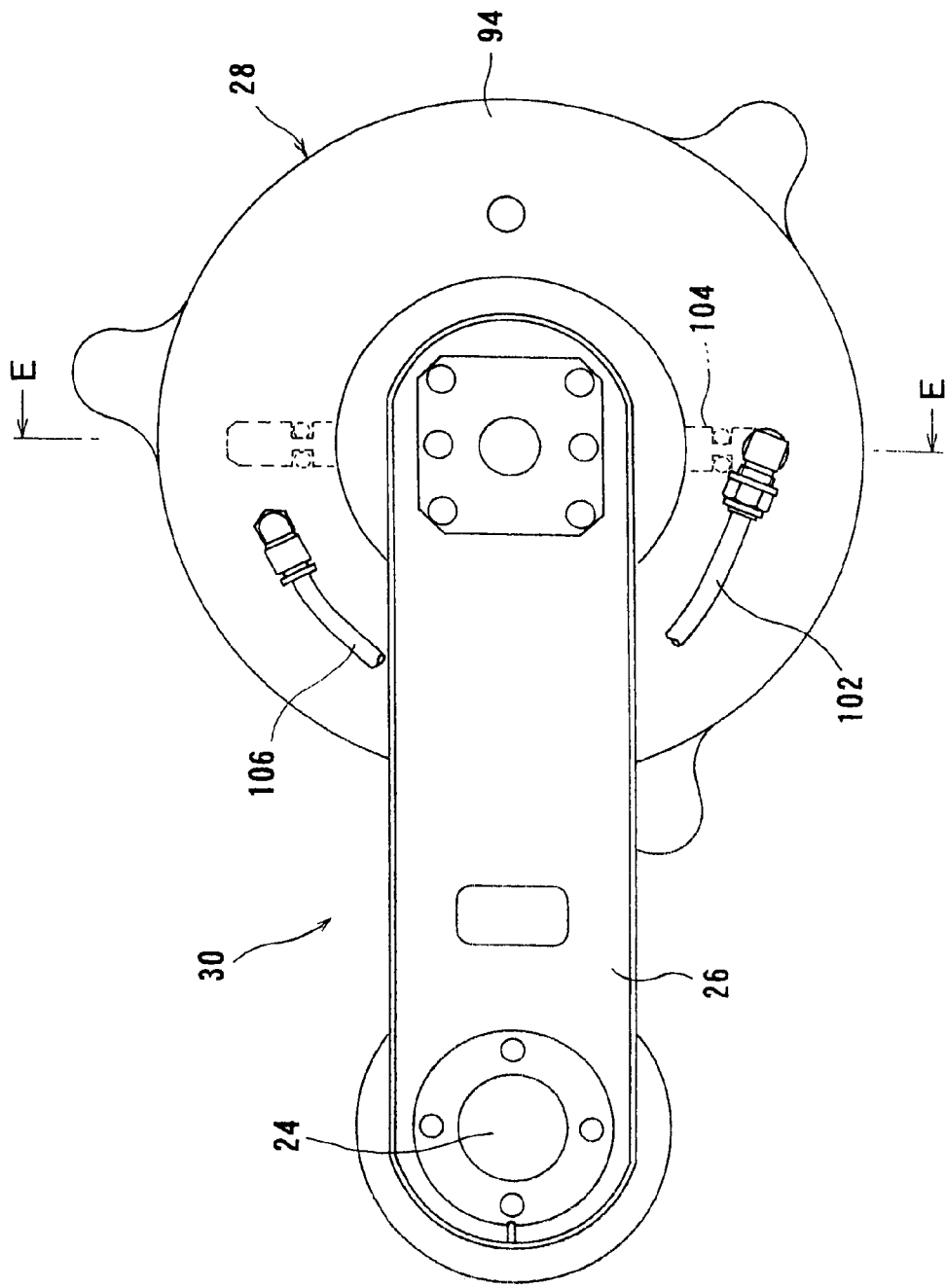
FIG. 41 is a plan view of the electrode arm section of the plating apparatus shown in FIG. 32.
Figure 42:
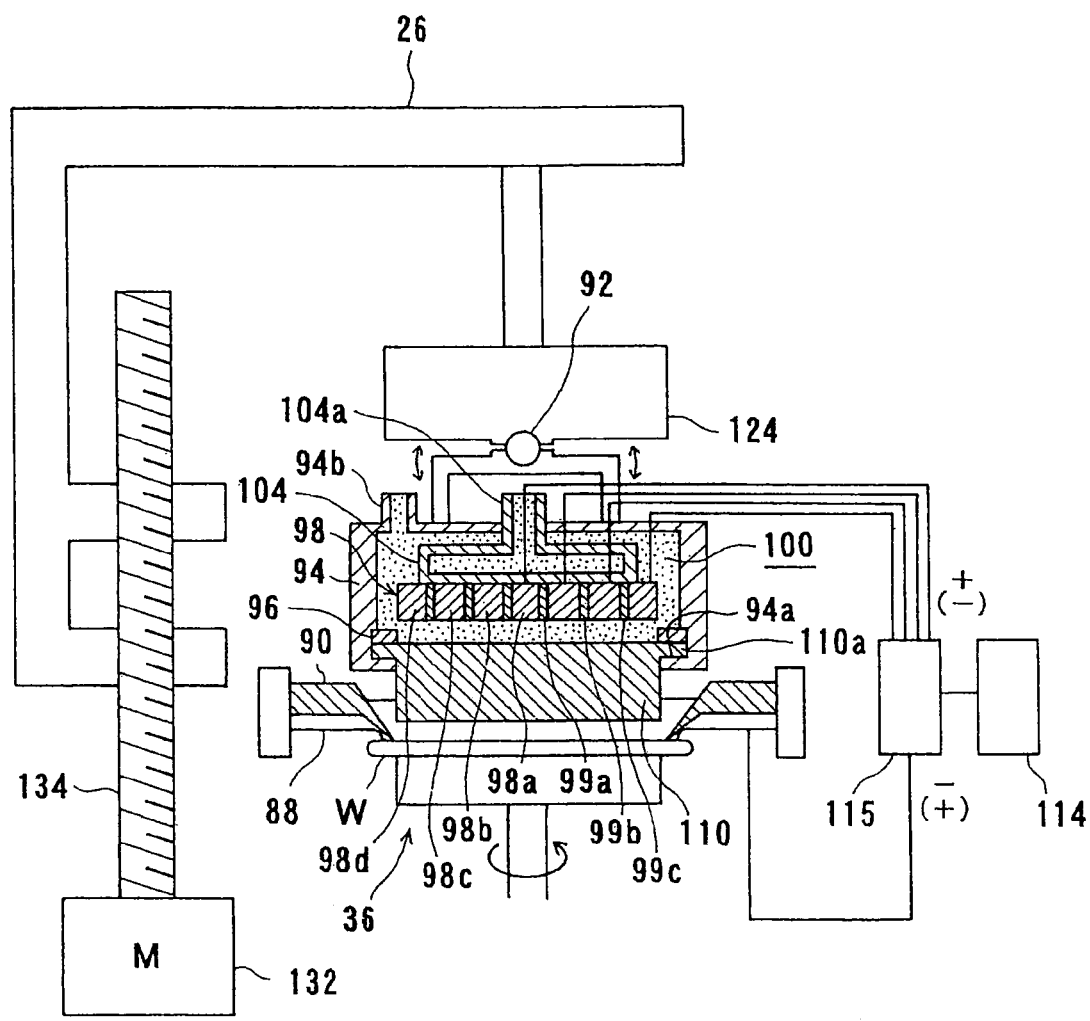
FIG. 42 is a schematic sectional view illustrating the electrode head and the substrate holder of the plating apparatus shown in FIG. 32 upon electroplating.

As shown in FIGS. 41 and 42, the electrode head 28 of the electrode arm section 30 includes a housing 94 which is coupled via a ball bearing 92 to the free end of the pivot arm 26, and a high resistance structure (plating solution impregnated material) 110 which is disposed such that it closes the bottom opening of the housing 94 and composed of a water-retentive material. The housing 94 has at its lower end an inwardly-projecting portion 94a, while the high resistance structure 110 has at its top a flange portion 110a. The flange portion 110a is engaged with the inwardly-projecting portion 94a and a spacer 96 is interposed therebetween. The high resistance structure 110 is thus held with the housing 94, while a hollow plating solution chamber 100 is defined in the housing 94.

The high resistance structure (plating solution impregnated material) 110 is composed of porous ceramics such as alumina, SiC, mullite, zirconia, titania or cordierite, or a hard porous material such as a sintered compact of polypropylene or polyethylene, or a composite material comprising these materials. The high resistance structure 110 may be composed of a woven fiver or non-woven fiber. In case of the alumina-based ceramics, for example, the ceramics with a pore diameter of 30 to 200 μm is used. In case of the SiC, SiC with a pore diameter of not more than 30 μm, a porosity of 20 to 95%, and a thickness of about 1 to 20 mm, preferably 5 to 20 mm, more preferably 8 to 15 mm, is used. The high resistance structure 110, in this embodiment, is constituted of porous ceramics of alumina having a porosity of 30%, and an average pore diameter of 100 μm. The porous ceramic plate per se is an insulator, but has a lower electric conductivity than a plating solution by causing plating solution to enter its interior complicatedly and follow a considerably long path in the thickness direction.

The high resistance structure (plating solution impregnated material) 110, which has the high resistance, is disposed in he plating solution chamber 100. Hence, the influence of sheet resistance of the surface of the substrate, such as seed layer 7 (see FIG. 4A), becomes a negligible degree. Consequently, the difference in current density over the surface of the substrate due to sheet resistance on the surface of the substrate W becomes small, and the uniformity of the plated film over the surface of the substrate improves.

In the plating solution chamber 100, there is disposed an anode 98 held in abutment against an lower surface of a plating solution introduction pipe 104 disposed above the anode 98. The plating solution introduction pipe 104 has a plating solution introduction port 104a connected to a plating solution supply pipe 102 which extends from the plating solution supply unit 18 (see FIG. 32). A plating solution discharge port 94*b* provided in an upper plate of the housing 94 is connected to an plating solution discharge pipe 106 communicating with the plating solution chamber 100.

A manifold structure is employed for the plating solution introduction pipe 104 so that the plating solution can be supplied uniformly onto the plating surface of the substrate. In particular, a large number of narrow tubes (not shown), communicating with the plating solution introduction pipe 104, are connected to the pipe 104 at predetermined positions along the long direction of the pipe 104. Further, small holes are provided in the anode 98 and the high resistance structure 110 at positions corresponding to the narrow tubes. The narrow tubes extend downwardly in the small holes and reach the lower surface or its vicinity of the high resistance structure 110.

Thus, the plating solution, introduced from the plating solution supply pipe 102 into the plating solution introduction pipe 104, passes through the narrow tubes and reaches the bottom of the high resistance structure (plating solution impregnated material) 110, and pass through the high resistance structure 110 and fills the plating solution chamber 100, whereby the anode 98 is immersed in the plating solution. The plating solution is discharged from the plating solution discharge pipe 106 by application of suction to the plating solution discharge pipe 106.

The anode 98 may have a number of vertically through holes for allowing a plating solution introduced into the plating solution chamber 100 to flow through the through holes to the high resistance structure 110.

In order to suppress slime formation, the anode 98 is generally made of copper (phosphorus-containing copper) containing 0.03 to 0.05% of phosphorus. In this embodiment, an insoluble anode, which comprises an insoluble metal such as platinum or titanium, or an insoluble electrode comprising metal on which platinum or the like is plated, is used as the anode 98. By using an insoluble anode as the anode 98, the anode 98 is prevented from changing its shape by being dissolved, and a constant discharged state can be maintained at all times without the need for replacing the anode 98.

The anode 98 comprises, in this embodiment, four concentric split anodes 98*a* through 98*d* with ring-shaped insulating members 99*a* through 99*c* interposed between split surfaces of the split anodes 98*a* through 98*d*. Specifically, the anode 98 comprises a first split anode 98*a* in the form of a solid disk that is positioned centrally, a second split anode 98*b* in the form of a hollow disk that is positioned in surrounding relation to the first split anode 98*a*, a third split anode 98*c* in the form of a hollow disk that is positioned in surrounding relation to the second split anode 98*b*, and a fourth split anode 98*d* in the form of a hollow disk that is positioned in surrounding relation to the third split anode 98*c*. The ring-shaped insulating members 99*a* through 99*c* are interposed between the first and second split anodes 98*a*, 98*b*, the second and third split anodes 98*b*, 98*c*, and the third and fourth split anodes 98*c*, 98*d*. The split anodes 98*a* through 98*d* and the ring-shaped insulating members 99*a* through 99*c* are disposed in a planar configuration.

The cathode electrodes 88 are electrically connected to the cathode of a plating power source 114 and the anode 98 is electrically connected to the anode of the plating power source 114. The plating power source 114 is arranged to be able to change the direction of an electric current which flows, as desired. In this embodiment, the plating apparatus has a rectifier 115 serving as a rectifying mechanism. The rectifier 115 has elements or parts for individually adjusting voltages or currents as desired that are supplied between the first split anode 98*a* and the surface to be plated of the substrate, the second split anode 98*b* and the surface to be plated of the substrate, the third split anode 98*c* and the surface to be plated of the substrate, and the fourth split anode 98*d* and the surface to be plated of the substrate.

In an initial plating period, for example, the electric current is adjusted to make the current density thereof progressively higher at central areas of the anode 98 than at circumferential areas thereof, i.e., progressively higher successively from the fourth split anode 98*d* to the third split anode 98*c* to the second split anode 98*b* to the first split anode 98*a*, to pass the plating current to a central area of the substrate W. Furthermore, a large resistance is developed in the high resistance structure 110 which retains the plating solution therein to the extent that the sheet resistance of the surface of the substrate is negligible. Therefore, even if the substrate has a higher sheet resistance, within-wafer differences of the current density due to the sheet resistance of the substrate are reduced to make it possible to reliably form a plated film of more uniform film thickness.

Figure 44:
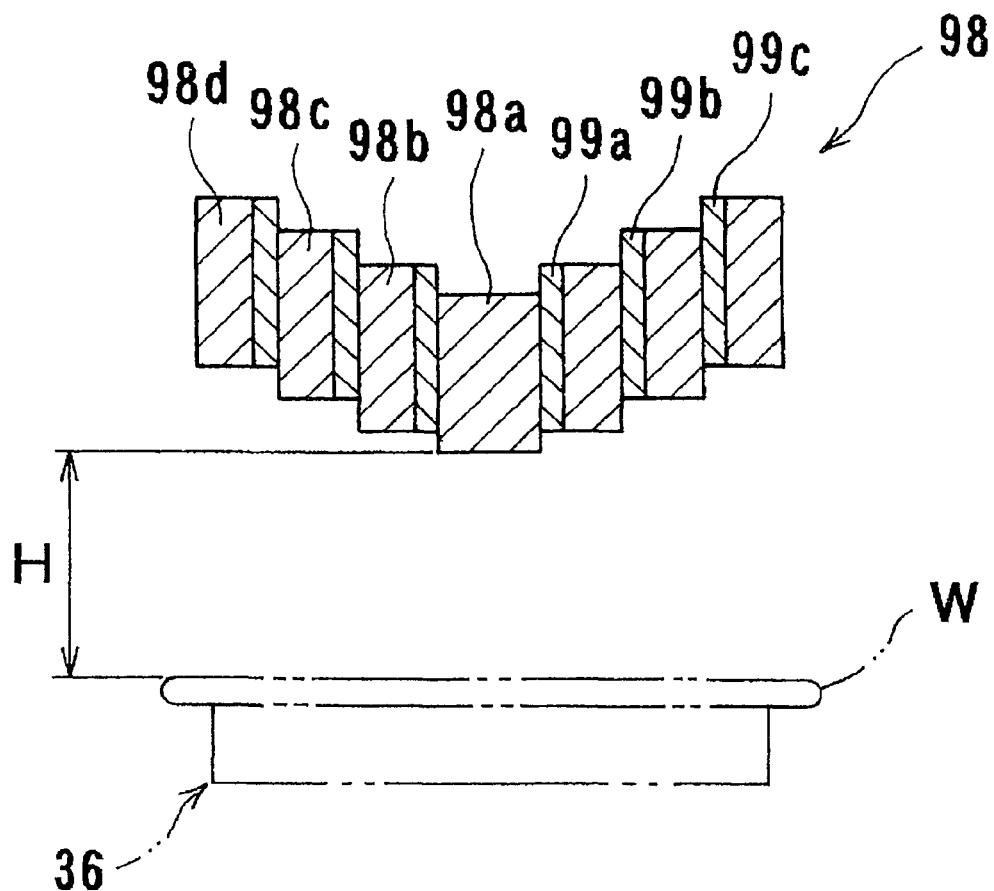
FIG. 44 is a cross-sectional view of a modified anode.

As shown in FIG. 44, the split anodes 98*a* through 98*d* may be arranged such that they have staggering surfaces facing the substrate W, to make the distance H between the anode 98 and the substrate W differently partially, i.e., at the split anodes 98*a* through 98*d*, for thereby adjusting the distribution of current densities between the anode 98 and the substrate W. Furthermore, although not shown, the split anodes 98*a* through 98*d* may be associated with respective rectifiers (rectifying mechanisms), instead of the above rectifier 115. The rectifier 115 preferably have a mechanism for optimizing the distribution of currents or voltages supplied between the anode 98 and the surface to be plated of the substrate. In this manner, the distribution of current densities between the anode 98 and the surface to be plated of the substrate can automatically be optimized.

The ball bearing 92 is coupled to the pivot arm 26 via a support member 124. The pivot arm 26 is vertically movable by a vertical movement motor 132, which is a servomotor, and a ball screw 134. It is also possible to use a pneumatic actuator to constitute a vertical movement mechanism.

When carrying out electroplating, the substrate holder 36 is positioned at plating position B (see FIG. 43). The electrode head 28 is lowered until the distance between the substrate W held by the substrate holder 36 and the high resistance structure 110 becomes e.g. about 0.1 to 3 mm. A plating solution is supplied from the plating solution supply pipe 102 to the upper surface (surface to be plated) of the substrate W while impregnating the high resistance structure 110 with the plating solution and filling the plating solution chamber 100 with the plating solution to carry out plating of the surface to be plated of the substrate W.

The operation of the substrate processing apparatus incorporating the above-described plating apparatus will now be described.

First, a substrate W to be plated is taken out from one of the loading/unloading units 10 by the transfer robot 14, and transferred, with the surface to be plated facing upwardly, through the substrate carry-in and carry-out opening defined in the side panel, into one of the plating apparatuses 12. At this time, the substrate holder 36 is in lower substrate transfer position A. After the hand of the transfer robot 14 has reached a position directly above the substrate stage 68, the hand of the transfer robot 14 is lowered to place the substrate W on the support arms 70. The hand of the transfer robot 14 is then retracted through the substrate carry-in and carry-out opening.

After the hand of the transfer robot 14 is retracted, the cup 40 is elevated. Then, the substrate holder 36 is lifted from substrate transfer position A to pretreatment/cleaning position C. As the substrate holder 36 ascends, the substrate W placed on the support arms 70 is positioned by the positioning plate 72 and the pressing finger 74, and then reliably gripped by the chucking fingers 76.

On the other hand, the electrode head 28 of the electrode arm portion 30 is in a normal position over the plating solution tray 22 now, and the high resistance structure 110 or the anode 98 is positioned in the plating solution tray 22. At the same time that the cup 40 ascends, plating solution starts being supplied to the plating solution tray 22 and the electrode head 28. Until the step of plating the substrate W is initiated, the new plating solution is supplied, and the plating solution discharge pipe 106 is evacuated to replace the plating solution in the high resistance structure (plating solution impregnated material) 110 and remove air bubbles from the plating solution in the high resistance structure 110. When the ascending movement of the cup 40 is completed, the substrate carry-in and carry-out openings in the side panel is closed by the cup 40, isolating the atmosphere in the side panel and the atmosphere outside of the side panel from each other.

When the cup 40 is elevated, the pre-coating step is initiated. Specifically, the substrate holder 36 that has received the substrate W is rotated, and the pre-coating/recovering arm 32 is moved from the retracted position to a position confronting the substrate W. When the rotational speed of the substrate holder 36 reaches a preset value, the pre-coating nozzle 64 mounted on the tip end of the pre-coating/recovering arm 32 intermittently discharges a pre-coating liquid which comprises a surface active agent, for example, toward the plating surface of the substrate W. At this time, since the substrate holder 36 is rotating, the pre-coating liquid spreads all over the plating surface of the substrate W. Then, the pre-coating/recovering arm 32 is returned to the retracted position, and the rotational speed of the substrate holder 36 is increased to spin the pre-coating liquid off and dry the plating surface of the substrate W.

After the completion of the pre-coating step, the plating step is initiated. First, the substrate holder 36 is stopped against rotation, or the rotational speed thereof is reduced to a preset rotational speed for plating. In this state, the substrate holder 36 is lifted to plating position B. Then, the peripheral portion of the substrate W is brought into contact with the cathode electrodes 88, when it is possible to pass an electric current, and at the same time, the seal member 90 is pressed against the upper surface of the peripheral portion of the substrate W, thus sealing the peripheral portion of the substrate W in a water-tight manner.

Based on a signal indicating that the pre-coating step for the loaded substrate W is completed, the electrode arm portion 30 is swung in a horizontal direction to displace the electrode head 28 from a position over the plating solution tray 22 to a position over the plating processing position. After the electrode head 28 reaches this position, the electrode head 28 is lowered toward the cathode section 38. At this time, the high resistance structure 110 does not contact with the surface to be plated of the substrate W, but is held closely to the surface to be plated of the substrate W at a distance ranging from 0.1 mm to 3 mm. When the descent of the electrode head 28 is completed, the plating process is initiated.

That is, the cathode of the plating power source 114 is connected to the cathode electrodes 88 and the anode of the plating power source 114 is connected to the split anodes 98a through 98d, and a constant voltage control process is performed for applying a constant voltage between the cathode electrodes 88 and the split anodes 98a through 98d. At the same time, the plating solution is supplied from the plating solution supply pipe 102 into the electrode head 28 to fill the plating solution chamber 100 with the plating solution from the upper surface (surface to be plated) of the substrate W while impregnating the high resistance structure 110 with the plating solution. At this time, if necessary, the voltage applied between the split anodes 98a through 98d and the cathode electrodes 88 is adjusted.

By thus supplying the plating solution while performing the constant voltage control process for applying a constant voltage between the cathode electrodes 88 and the split anodes 98a through 98d, the seed layer 6 (see FIG. 1A) is prevented from being dissolved into the plating solution when the substrate W is brought into contact with the plating solution.

After the introduction of the plating solution is finished, a constant current control process is performed for passing a constant current between the cathode electrodes 88 and the split anodes 98a through 98d to deposit a plated film on the surface (the seed layer 7) of the substrate. In the initial plating stage, as described above, the electric current is adjusted to make the current density thereof progressively higher at central areas of the anode 98 than at circumferential areas thereof, i.e., progressively higher successively from the fourth split anode 98d to the third split anode 98c to the second split anode 98b to the first split anode 98a, to pass the plating current to a central area of the substrate W, thereby forming a plated film. When the thickness of the plated film is increased and the sheet resistance is lowered, the current densities at the four split anodes 98a through 98d are equalized. At this time, if necessary, the substrate holder 36 is rotated at a low speed.

In this manner, even if the substrate has a high sheet resistance, a plated film of more uniform film thickness can be formed on the entire surface to be plated of the substrate to embed plated metal in the fine recesses including contact holes 3 and trenches 4 (see FIG. 4B) without developing voids therein.

When the film thickness of the plated film has reached a predetermined value, the current (voltage) may be switched to convert the cathode electrodes 88 into anodes and the split anodes 98a through 98d into cathode electrodes, and a constant current may be passed between the cathode electrodes (anodes) 88 and the split anodes (cathode electrodes) 98a through 98d to etch the surface of the plated film into a flat surface, after which the current (voltage) may be switched to convert the cathode electrodes 88 back into cathode electrodes and the split anodes 98a through 98d back into anodes.

When the plating process is completed, the electrode arm portion 30 is raised and then swung to return to the position above the plating solution tray 22 and to lower to the ordinary position. Then, the pre-coating/recovering arm 32 is moved from the retreat position to the position confronting to the substrate W, and lowered to recover the remainder of the plating solution on the substrate W by a plating solution recovering nozzle 66. After recovering of the remainder of the plating solution is completed, the pre-coating/recovering arm 32 is returned to the retreat position, and pure water is supplied from the fixed nozzle 34 for supplying pure water toward the central portion of the substrate W for rinsing the plated surface of the substrate. At the same time, the substrate holder 36 is rotated at an increased speed to replace the plating solution on the surface of the substrate W with pure water. Rinsing the substrate W in this manner prevents the splashing plating solution from contaminating the cathode electrodes 88 of the cathode section 38 during descent of the substrate holder 36 from plating position B.

After completion of the rinsing, the washing with water step is initiated. That is, the substrate holder 36 is lowered from plating position B to pretreatment/cleaning position C. Then, while pure water is supplied from the fixed nozzle 34 for supplying pure water, the substrate holder 36 and the cathode section 38 are rotated to perform washing with water. At this time, the seal member 90 and the cathode electrodes 88 can also be cleaned, simultaneously with the substrate W, by pure water directly supplied to the cathode potion 38, or pure water scattered from the surface of the substrate W.

After washing with water is completed, the drying step is initiated. That is, supply of pure water from the fixed nozzle 34 is stopped, and the rotational speed of the substrate holder 36 and the cathode section 38 is further increased to remove pure water on the surface of the substrate W by centrifugal force and to dry the surface of the substrate W. The seal member 90 and the cathode electrodes 88 are also dried at the same time. Upon completion of the drying, the rotation of the substrate holder 36 and the cathode section 38 is stopped, and the substrate holder 36 is lowered to substrate transfer position A. Thus, the gripping of the substrate W by the chucking fingers 76 is released, and the substrate W is just placed on the upper surfaces of the support arms 70. At the same time, the cup 40 is also lowered.

All the steps including the plating step, the pretreatment step accompanying to the plating step, the cleaning step, and the drying step are now finished. The transfer robot 14 inserts its hand through the substrate carry-in and carry-out opening into the position beneath the substrate W, and raises the hand to receive the plated substrate W from the substrate holder 36. Then, the transfer robot 14 returns the plated substrate W received from the substrate holder 36 to one of the loading/unloading units 10.

Figure 45:
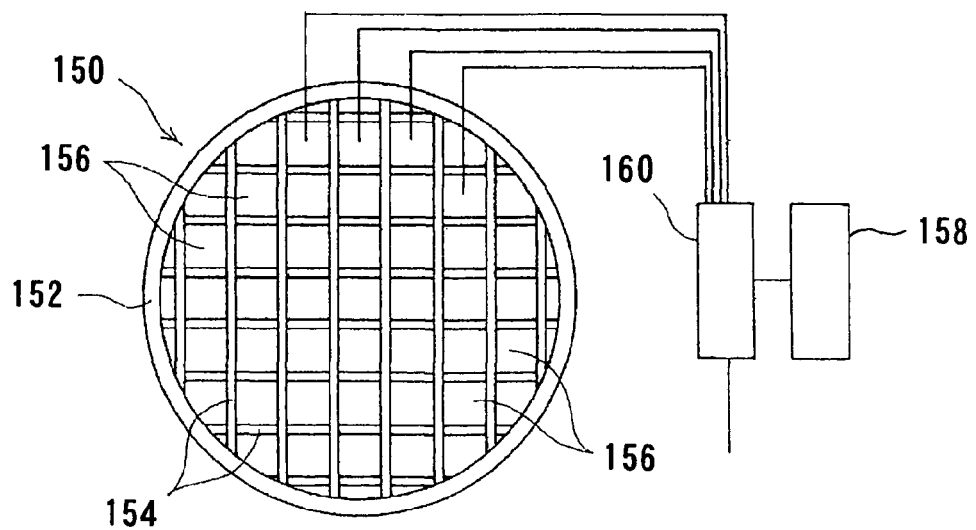
FIG. 45 is a plan view of another anode.

FIG. 45 shows another anode. The anode 150 shown in FIG. 14 comprises a plurality of insulating members 154 disposed in a grid pattern in a cylindrical housing 152, and a plurality of split anodes 156 in the form of rectangular chips disposed individually in respective cells defined by the insulating members 154. A rectifier 160 serving as a rectifying mechanism connected to a plating power source 158 has elements or parts for individually adjusting voltages or currents as desired that are supplied between the split anodes 156 and the surface to be plated of the substrate.

If the anode 150 thus constructed is used in place of the anode 58 of the plating apparatus 12 shown in FIGS. 32 through 42, then the current density may be changed between a certain portion of the substrate facing the anode 150 and another portion thereof. Depending on an amount of plating electrolysis (plating deposition), for example, the distribution of currents or voltages supplied between the split anodes 156 and the surface to be plated of the substrate may be changed to fill fine recesses with plated metal, or depending on the shape of a pattern of fine recesses formed in the surface of the substrate, the distribution of currents or voltages supplied between the split anodes 156 and the surface to be plated of the substrate may be changed to fill fine recesses with plated metal.

At this time, in the same manner as described above, the rectifier 160 may have a mechanism for optimizing the distribution of currents or voltages supplied between the split anodes 156 and the surface to be plated of the substrate, so that the distribution of current densities between the split anodes 156 and the surface to be plated of the substrate can automatically be optimized.

In this embodiment, the voltages or currents supplied between the split anodes 156 and the surface to be plated of the substrate can individually be adjusted as desired. However, the split anodes 156 may be divided into split anode groups each comprising a plurality of split anodes, and the voltages or currents supplied between the split anode groups and the surface to be plated of the substrate may individually be adjusted as desired.

The split anodes in the form of chips are not limited to a rectangular shape, but may be of any desired shapes such as a triangular shape. Alternatively, the concentric split anodes as described above and the split anodes in the form of chips may be combined with each other.

Figure 46:
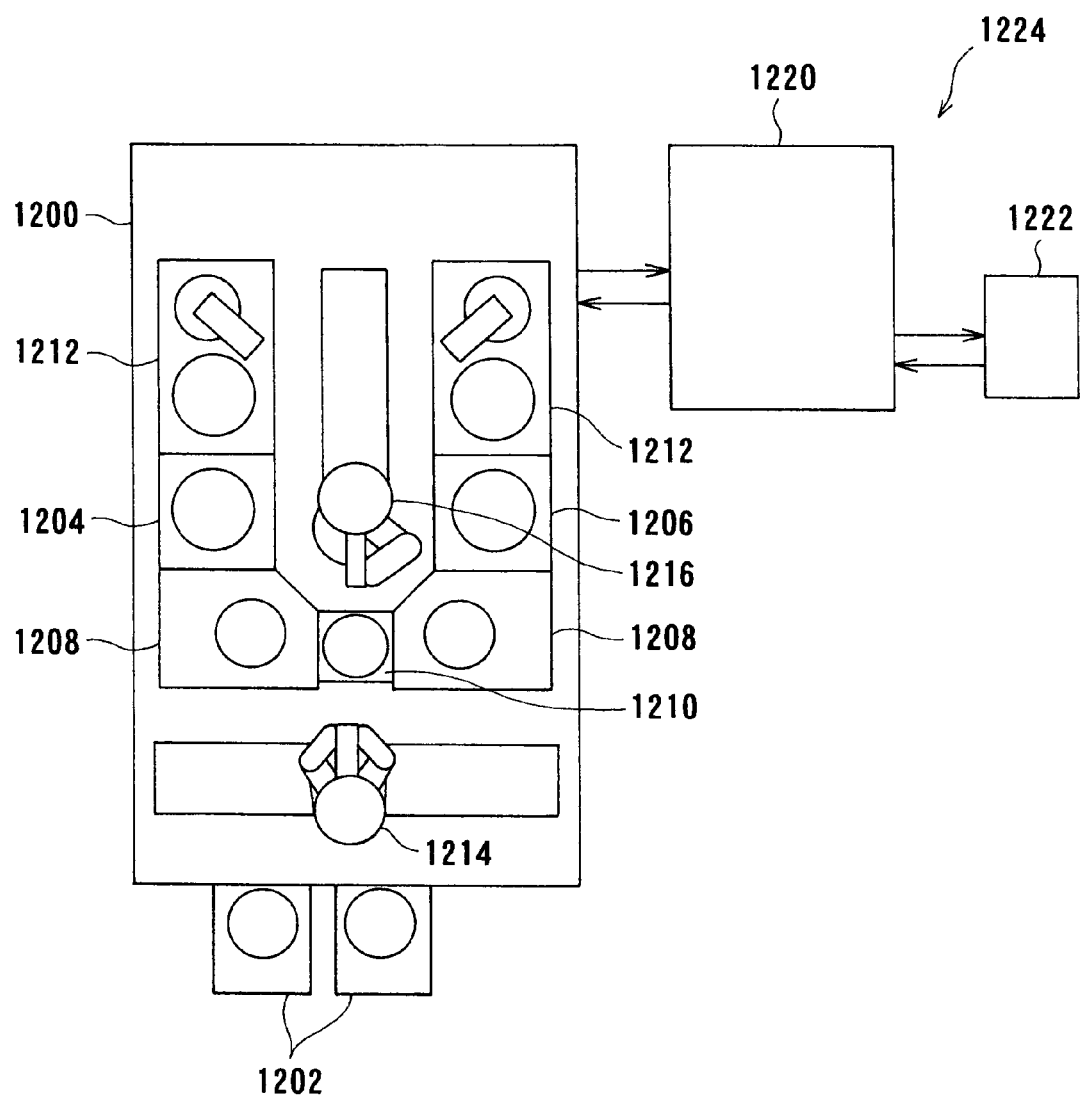
FIG. 46 is a plan view of another substrate processing apparatus having the plating apparatus according to the present invention.

FIG. 46 shows an overall layout plan of another substrate processing apparatus provided with a plating apparatus according to the present invention. The substrate processing apparatus includes two loading/unloading sections 1202 for carrying a substrate in and out a main frame 1200. Inside the main frame 1200 are disposed a heat treatment apparatus 1204 for heat treatment (annealing) a plated film formed on the substrate, a bevel-etching apparatus 1206 for removing a plated film formed on or adhering to a peripheral portion of the substrate, two cleaning and drying apparatuses 1208 for cleaning the surface of the substrate with a cleaning liquid, such as a chemical liquid or pure water, and spin-drying the cleaned substrate, a substrate stage 1210 for temporarily placing the substrate thereon, and two plating apparatuses 1212. Inside the main frame 1200 are also provided a movable first transfer robot 1214 for transferring the substrate between the loading/unloading sections 1202 and the substrate stage 1210, and a movable second transfer robot 1216 for transferring the substrate between the substrate stage 1210, the heat treatment apparatus 1204, the bevel-etching apparatus 1206, the cleaning and drying apparatuses 1208 and the plating apparatuses 1212. According to this embodiment, the plating apparatus 1212 has a similar construction to that of the plating apparatus 12 shown in FIGS. 32 through 42.

The main frame 1200 has been made light-shielding so that the following process steps can be carried out under light-shielded conditions in the main frame 1200, i.e. without irradiation of a light, such as an illuminating light, onto the interconnects of the substrate. This prevents corrosion of interconnects of e.g. copper due to potential difference that would be produced by light irradiation onto the interconnects.

Positioned beside the main frame 1200, there is provided a plating solution management apparatus 1224 which includes a plating solution tank 1220 and a plating solution analyzer 1222, and which analyzes and manages the components of a plating solution for use in the plating apparatuses 1212 and supplies the plating solution of a predetermined composition to the plating apparatuses 1212. The plating solution analyzer 1222 includes an organic material analysis section for analyzing an organic material by cyclic voltammetry (CVS), liquid chromatography, etc., and an inorganic material analysis section for analyzing an inorganic material by neutralization titration, oxidation-reduction titration, polarography, electrometric titration, etc. The results of analysis by the plating solution analyzer 1222 are fed back to adjust the components of the plating solution in the plating solution tank 1220. The plating solution management apparatus 1224 may also be disposed inside the main frame 1200.

Figure 47:
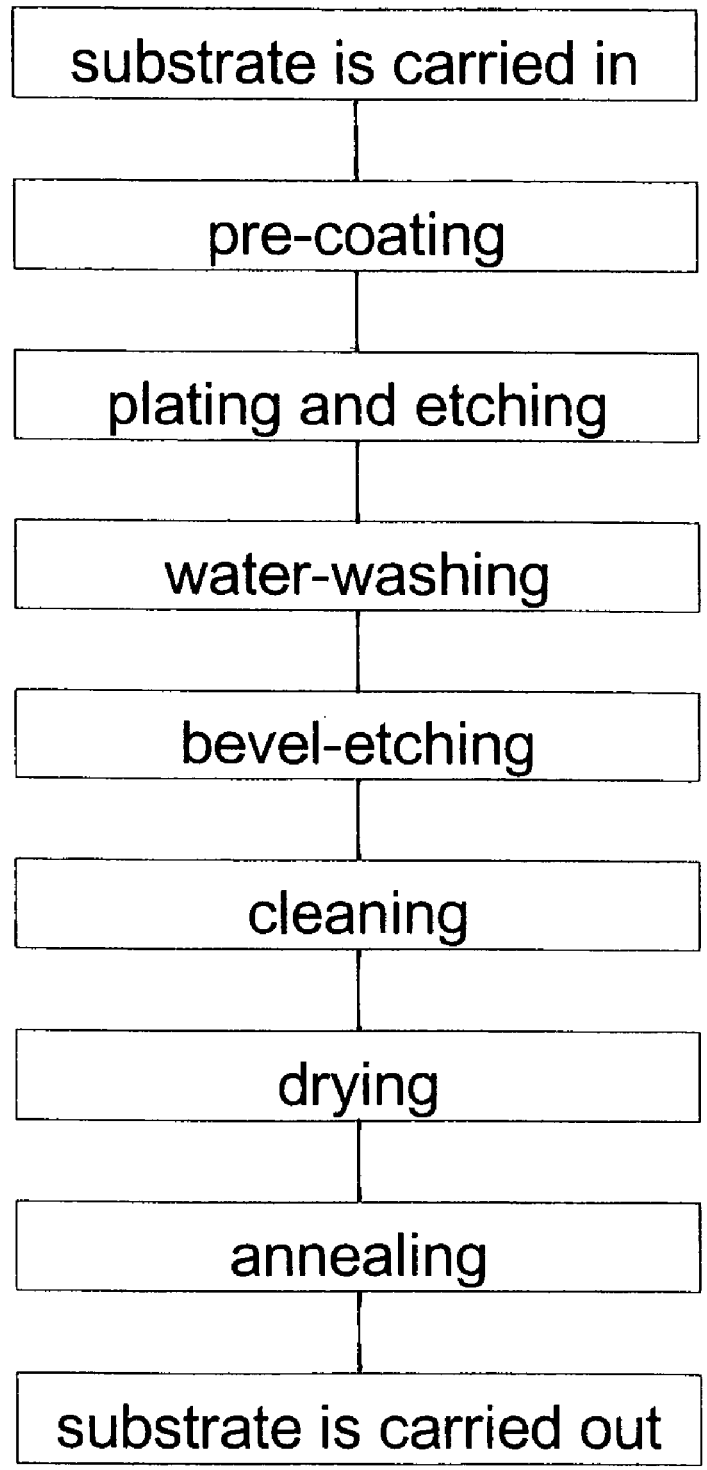
FIG. 47 is a block diagram of a substrate processing sequence performed by the substrate processing apparatus shown in FIG. 46.

An example of the formation of copper interconnects by the substrate processing apparatus, as illustrated in FIG. 47, will now be described.

First, substrates W each having a seed layer 6 (see FIG. 1A) as a electric supply layer formed on a surface are prepared, and a substrate cassette housing the substrates is mounted in the loading/unloading section 1202. One substrate W is taken by the first transfer robot 1214 out of the cassette mounted in the loading/unloading section 1202, and the substrate is carried in the main frame 1200, transferred to the substrate stage 1210, and placed and held on the substrate stage 1210. The substrate held on the substrate stage 1210 is transferred by the second transfer robot 1216 to one of the plating apparatuses 1212.

In the plating apparatus 1212, as with the above-described embodiment, a pre-plating treatment, such as pre-coating, of the surface (surface to be plated) of the substrate W is first carried out. Thereafter, plating of the substrate is carried out. During the plating, the composition of the plating solution in the plating solution tank 1220 is analyzed by the plating solution analyzer 1222, and a shortage of a component is replenished in the plating solution in the plating solution tank 1220 so that the plating solution of a constant composition is supplied to the plating apparatus 1212. After completion of the plating, as with the above-described embodiment, the plating solution remaining on the substrate is recovered and the plated surface of the substrate is rinsed, and the surface of the substrate is cleaned (water-washed) with e.g. pure water. The substrate after cleaning is transferred by the second transfer robot 1216 to the bevel-etching apparatus 1206.

In the bevel-etching apparatus 1206, while rotating the substrate which is held horizontally, an acid solution is supplied continuously to the central portion of the front surface of the substrate and an oxidizing agent solution is supplied continuously or intermittently to a peripheral portion of the front surface. The acid solution may be of any non-oxidative acid, such as hydrofluoric acid, hydrochloric acid, sulfuric acid, citric acid, oxalic acid, etc. Examples of the oxidizing agent solution include ozone water, hydrogen peroxide solution, nitric acid solution, and sodium hypochlorite solution, and a combination thereof. Copper, etc. formed on or adhering to a peripheral portion (bevel portion) of the substrate W is rapidly oxidized by the oxidizing agent solution, and the oxidized product is etched and dissolved out by the acid solution which is supplied to the central portion of the substrate and spreads over the entire surface of the substrate.

During the above etching processing, an oxidizing agent solution and an etching agent for silicon oxide film may be supplied simultaneously or alternately to the central portion of the back surface of the substrate, thereby oxidizing copper etc. in elemental form adhering to the back surface of the substrate W, together with the silicon of the substrate, with the oxidizing agent solution and etching away the oxidized product with the etching agent.

The substrate after bevel-etching is transferred by the second transfer robot 1216 to one of the cleaning and drying apparatuses 1208, where the surface of the substrate is cleaned with a cleaning liquid, such as a chemical liquid or pure water, followed by spin-drying. The dried substrate is transferred by the second transfer robot 1216 to the heat treatment apparatus 1204.

In the heat treatment apparatus 1204, heat treatment (annealing) of the copper layer 7 (see FIG. 1B) formed on the surface of the substrate W is carried out, thereby crystallizing the copper layer 7 for forming interconnects. The heat treatment (annealing) is carried out by heating the substrate, for example, at 400° C. for about a few tens of seconds to 60 seconds. At the same time, if necessary, a gas for oxidation inhibition is introduced into the heat treatment apparatus 1204 and is allowed to flow along the surface of the substrate to prevent oxidation of the surface of the copper layer 7. The heating temperature of the substrate is generally 100 to 600° C., preferably 300 to 400° C.

The substrate W after heat treatment is transferred by the second transfer robot 1216 to the substrate stage 1210 and held on the substrate stage 1210. The substrate on the substrate stage 1210 is returned by the first transfer robot 1214 to the cassette of the loading/unloading section 1202.

Thereafter, extra metal formed on the insulating film and the barrier layer are removed by method such as chemical mechanical polishing (CMP) so as to flatten the surface, whereby forming interconnects 8 composed of the seed layer 6 and the copper layer 6, as shown in FIG. 17C.

In the above embodiments, the barrier layer is made of TaN, TiN, or the like, and the seed layer is made of copper. However, they may be made of Ti, V, Cr, Ni, Zr, Nb, Mo, Ta, Hf, W, Ru, Rh, Pd, Ag, Au, Pt, or Ir, or a nitride thereof.

According to the present invention, the high resistance structure made of a water-retentive material is disposed between the anode and the surface to be plated of the substrate, and the anode is given a potential gradient. Even if the substrate has a high sheet resistance, a plated film of more uniform film thickness can be formed on the entire surface to be plated of the substrate to reliably the plated metal within the fine recesses without forming voids therein.

What is claimed is:

1. A plating apparatus, comprising:
a substrate holder for holding a substrate;
a cathode section having a seal member for contact with a peripheral portion of a surface, to be plated, of the substrate held by said substrate holder to watertightly seal the peripheral portion, and a cathode electrode for contact with the substrate to supply an electric current to the substrate;
a vertically-movable anode disposed in a position facing the surface, to be plated, of the substrate;
a porous member composed of a water-retentive material, disposed between said vertically-movable anode and the surface, to be plated, of the substrate;
a constant-voltage control section for controlling a voltage applied between the cathode electrode and said vertically-movable anode at a constant value;
a current monitor section for monitoring an electric current flowing between the cathode electrode and said vertically-movable anode, and feeding back a detection signal to said constant-voltage control section so that the supply of the electric current between the cathode electrode and said vertically-movable anode is stopped when the electric current becomes constant; and
a driving mechanism for producing a vibrational movement of at least one of said porous member and the substrate for providing a repetition of contact and non-contact between said porous member and the surface, to be plated, of the substrate.

2. The plating apparatus according to claim 1, further comprising:
a pressing mechanism for pressing said porous member against the surface, to be plated, of the substrate, held by said substrate holder, at a desired pressure.

3. A plating apparatus, comprising:
a substrate holder for holding a substrate;
a cathode section having a seal member for contact with a peripheral portion of a surface, to be plated, of the substrate held by said substrate holder to watertightly seal the peripheral portion, and a cathode electrode for contact with the substrate to supply an electric current to the substrate;
a vertically-movable anode disposed in a position facing the surface, to be plated, of the substrate;

a porous member composed of a water-retentive material, disposed between said vertically-movable anode and the surface, to be plated, of the substrate;

a constant-current control section for controlling an electric current flowing between the cathode electrode and said vertically-movable anode at a constant value;

a voltage monitor section for monitoring the voltage value between the cathode electrode and said vertically-movable anode, and feeding back a detection signal to the constant-current control so that the supply of the electric current between the cathode electrode and said vertically-movable anode is stopped when the voltage value becomes constant; and a driving mechanism for producing a vibrational movement of at least one of said porous member and the substrate for providing a repetition of contact and non-contact between said porous member and the surface, to be plated, of the substrate.

4. The plating apparatus according to claim 3, further comprising:

a pressing mechanism for pressing said porous member against the surface, to be plated, of the substrate, held by said substrate holder, at a desired pressure.

* * * * *